United States Patent
Chang et al.

(10) Patent No.: US 8,461,917 B2
(45) Date of Patent: Jun. 11, 2013

(54) COMPLIMENTARY SINGLE-ENDED-INPUT OTA-C UNIVERSAL FILTER STRUCTURES

(75) Inventors: Chun-Ming Chang, Chung-Li (TW); Shu-Hui Tu, Chung-Li (TW)

(73) Assignee: Chung Yuan Christian University, Chung-Li (TW)

( * ) Notice: Subject to any disclaimer, the term of this patent is extended or adjusted under 35 U.S.C. 154(b) by 73 days.

(21) Appl. No.: 13/168,777

(22) Filed: Jun. 24, 2011

(65) Prior Publication Data

US 2011/0316628 A1 Dec. 29, 2011

Related U.S. Application Data

(60) Provisional application No. 61/358,744, filed on Jun. 25, 2010.

(51) Int. Cl.
*H03K 5/00* (2006.01)
(52) U.S. Cl.
USPC .......................................... 327/552; 327/554
(58) Field of Classification Search
USPC .................... 327/551–559, 336–337
See application file for complete search history.

(56) References Cited

U.S. PATENT DOCUMENTS

| | | | | |
|---|---|---|---|---|
| 4,857,778 A | * | 8/1989 | Hague | 327/555 |
| 5,317,217 A | * | 5/1994 | Rieger et al. | 327/555 |
| 5,625,317 A | * | 4/1997 | Deveirman | 327/553 |

* cited by examiner

*Primary Examiner* — Dinh T. Le
(74) *Attorney, Agent, or Firm* — Muncy, Geissler, Olds & Lowe, PLLC

(57) ABSTRACT

A complimentary single-ended-input OTA-C universal filter structures in terms of integrated circuits is provided. The integrated circuit comprises a plurality of amplifiers and a plurality of capacitors. In some capacitors, one electrode is electrically connected to the positive input of its corresponding amplifier, and the other electrode can be electrically connected to an electrical source. In addition, the negative input of one amplifier is electrically connected to the negative input of another amplifier. Besides, there are a head amplifier and a tail amplifier. The output of the head amplifier is electrically connected to the negative input of the head amplifier, and the positive input of the tail amplifier can be electrically connected to an electrical source.

6 Claims, 47 Drawing Sheets

COMPLIMENTARY SINGLE-ENDED-INPUT OTA-C UNIVERSAL FILTER STRUCTURES

CROSS-REFERENCE TO RELATED APPLICATIONS

The present application is a non-provisional application of a provisional application Ser. No. 61/358,744 filed on Jun. 25, 2010, which is hereby incorporated by reference in its entirety.

BACKGROUND OF THE INVENTION

1. Field of the Invention

The present invention relates to electric circuit designs. Particularly, the present invention relates to complimentary single-ended-input OTA-C universal filter structures. "OTA-C" stands for "operational transconductance amplifier and capacitor."

2. Description of the Prior Art

Voltage or current-mode nth-order OTA-C filter structures have been investigated and developed for several years. Recently, the analytical synthesis methods (ASMs) have been validated and demonstrated to be very effective for the design of OTA-C filters and current conveyor-based filters. A complicated nth-order transfer function is manipulated and decomposed by a succession of innovative algebraic operations until a set of simple and feasible equations are produced. The complete filter structure is constructed by superposing the sub-circuitries realized from these simple equations. In fact, the recent ASMs can be used in the design of any kind of a linear system with a stable transfer function.

All the past filter structures enjoy the following three important criteria:

- filters use grounded capacitors, and thus can absorb equivalent shunt capacitive parasitics;
- filters employ only single-ended-input OTAs, thus overcoming the feed-through effects due to finite input parasitic capacitances associated with differential-input OTAs; and
- filters have the least number of active and passive elements for a given order, thus reducing power consumption, chip areas, and noise.

It has been shown that the voltage-mode filter structure with arbitrary functions needs 2n+2, i.e., n more OTAs than the other voltage-mode filter structure with only low-pass (LP), band-pass (BP), and high-pass (HP) functions. This led to the research work of a new ASM for realizing the voltage-mode high-order OTA-C all-pass (AP) and band-reject (BR) filters using only n+2 single-ended-input OTAs and n grounded capacitors.

On the other hand, combining both the current-mode notch and inverting LP signals, a current-mode HP signal can be obtained. Similarly, a current-mode AP signal can be obtained by connecting current-mode notch and inverting BP signals. This well-known concept has been demonstrated in the recently reported current-mode OTA-C universal filter structure. However, the voltage-mode circuit lacks this ability, unlike the current-mode circuit, of the arithmetic operations of direct addition or subtraction of signals. Hence, although several voltage-mode OTA-C biquad filters have been presented recently, only two of them, using three (or four) differential-input OTAs and two (or three) single-ended-input OTAs in addition to two grounded capacitors, can synthesize all the five different generic filtering signals, i.e., LP, BP, HP, BR (or notch), and AP signals, simultaneously. Therefore, the problem as to how to bring about the arithmetic superiority of the current-mode circuit to the voltage-mode counterpart and still achieve the above three important criteria for the design of OTA-C filters is an important one. Such a problem has been solved for the biquad structure with the additional valuable advantage of "programmability" using the recently reported ASM.

Although both the voltage-mode nth-order OTA-C LP, BP, and HP filter structure and the voltage-mode nth-order OTA-C AP and BR filter structure use the least number of active and passive components, namely, n+2 single-ended-input OTAs and n grounded capacitors, none of the voltage-mode nth-order OTA-C universal filter structures employs a reduced number of active and passive components. Although the voltage-mode second-order OTA-C universal filter structure is "programmable" and uses 2+2(=4) single-ended-input OTAs and 2 grounded capacitors, none of the voltage-mode nth-order OTA-C universal filter structures are "programmable". Therefore, there does not exist any voltage-mode nth-order OTA-C universal filter structure in the published literature that has both the least number of components and the advantage of "programmability". With these two properties in mind, a new voltage-mode nth-order programmable, universal filter structure using n+2 single-ended-input OTAs and n grounded capacitors is developed. This is an extension of the recently reported voltage-mode second-order OTA-C programmable, universal filter structure. Its fully-differential-input OTA based one can be easily obtained from the single-ended-input OTA and grounded capacitor structure using the well-known transformation method.

A differential (or double) input OTA can be realized by two parallel single-ended-input OTAs. It may be possible to synthesize an nth-order filter structure using n differential-input OTAs instead of n+2 single-ended-input OTAs in addition to n capacitors. If it is possible to do so, the following question is quite interesting: Which one is the better? Is the one with n+2 single-ended-input OTAs or the one with n differential-input OTAs? The former uses more OTAs with more non-ideal transconductance functions, but has lower parasitics for each single-ended-input OTA. The latter uses fewer OTAs with less non-ideal transconductance functions, but has larger parasitics for each differential-input OTA. Therefore, it is really worthwhile to do such a comparison between the above mentioned two cases. We then present the second new ASM to realize a voltage-mode n-th order OTA-C universal filter structure using only n differential-input OTAs and only n floating/grounded capacitors, the minimum number of active and passive components. Moreover, since a differential-input OTA can be equivalent to two parallel and complementary single-ended-input OTAs, the differential-input one can be transformed to a new complementary single-ended-input OTA based universal filter structure, which is validated to have the most precise output signals amongst the four distinct kinds of synthesized universal filter structures: (i) single-ended-in-out OTA based one, (ii) fully differential-input OTA based one, (iii) differential-input OTA based one, and (iv) complementary single-ended-input OTA based one, and two recently reported biquad filters.

In addition to output precision, the power consumption, noise, dynamic and linear ranges of the proposed four new OTA-C filter structures and some applications use H-Spice simulations. The new complementary single-ended-input OTA based one is validated to enjoy the largest dynamic and linear ranges.

As to sensitivities, second-order and sixth-order filter structures are investigated using H-Spice simulations. The realized band-pass, band-reject, and all-pass (except the fully differential one) biquads enjoy very low sensitivities achieved by the well-known passive LC ladder network. Both a direct sixth-order universal filter structure and its equivalent three-biquad-stage one are also simulated. Although some three-biquad-stage filters have lower sensitivity than their direct sixth-order one, yet some direct sixth-order filters have lower sensitivity than their equivalent three-biquad-stage ones.

An output distortion with a sudden drop in the synthesized high-pass, band-reject, and all-pass amplitude-frequency responses is investigated. A very sharp increment of the transconductance of an OTA is discovered using H-Spice simulation when the operating frequency is over a critical value. The frequency dependent transconductance function is then modified by adding an exponential-like function.

Other background information about the present invention could be found in U.S. patent application Ser. No. 11/419,313, U.S. patent application Ser. No. 12/493,184, U.S. patent application Ser. No. 12/535,194, and U.S. patent application Ser. No. 12/759,682.

To solve those negative results shown in the prior art, the present invention provides novel complementary single-ended-input OTA based filter structures. The details are described as follows.

SUMMARY OF THE INVENTION

Complementary single-ended-input OTA based filter structures are presented in the present invention. Through two analytical synthesis methods (ASMs) and two transformations, one of which is to convert a differential-input OTA to two complementary single-ended-input OTAs, and the other to convert a single-ended-input OTA and grounded capacitor based one to a fully differential OTA based one, four distinct kinds of voltage-mode nth-order OTA-C universal filter structures are proposed. TSMC H-Spice simulations with 0.35 μm process validate that the new complementary single-ended-input OTA based one holds the superiority in output precision, dynamic and linear ranges than other kinds of filter structures. Moreover, the new voltage-mode band-pass, band-reject, and all-pass (except the fully differential one) biquad structures, all enjoy very low sensitivities. Both direct sixth-order universal filter structures and their equivalent three biquad stage ones are also simulated and validated that the former is not absolutely larger in sensitivity than the latter. Finally, a very sharp increment of the transconductance of an OTA is discovered as the operating frequency is very high and leads to a modified frequency dependent transconductance.

The present invention provides an integrated circuit for complementary single-ended-input OTA based filter structures. The integrated circuit comprises a plurality of first amplifiers and a plurality of first capacitors. Wherein, in some capacitors, the first electrode is electrically connected to the positive input of its corresponding first amplifier, and the second electrode can be electrically connected to a first electrical source. In addition, the negative input of one first amplifier is electrically connected to the negative input of another first amplifier. Besides, there are a head amplifier and a tail amplifier. The output of the head amplifier is electrically connected to the negative input of the head amplifier, and the positive input of the tail amplifier can be electrically connected to a general electrical source. Moreover, there is a head capacitor, and the first electrode of the head capacitor is electrically connected to the negative input of the head amplifier.

The present invention also provides an integrated circuit for complementary single-ended-input OTA based filter structures. The integrated circuit comprises at least one operational transconductance amplifier, where a frequency dependent transconductance G(s) of the operational transconductance amplifier is in a specific format.

The present invention provides another integrated circuit for complementary single-ended-input OTA based filter structures. The integrated circuit comprises at least a first component amplifier and a second component amplifier. The first component amplifier and second component amplifier comprise at least one positive component input, at least one negative component input, and at least one component output. The positive component input of the first component amplifier is a positive input. The negative component input of the second component amplifier is a negative input. The negative component input of the first component amplifier is electrically connected to the positive component input of the second component amplifier. The negative component input of the first component amplifier and the positive component input of the second component amplifier can be electrically connected to a ground.

The details of the embodiments of the present invention will be described below. However, it should be understood that the detailed description and specific examples, while indicating preferred embodiments of the invention, are given by way of illustration only, since various changes and modifications within the spirit and scope of the invention will become apparent to those skilled in the art from this detailed description. Also, it should be noted that all drawings related to integrated circuits follow the drawing methodology of circuit diagrams.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

I. Circuit Design

The purpose of the present invention is to provide an integrated circuit related to complimentary single-ended-input OTA-C universal filter structures.

Figure 1:
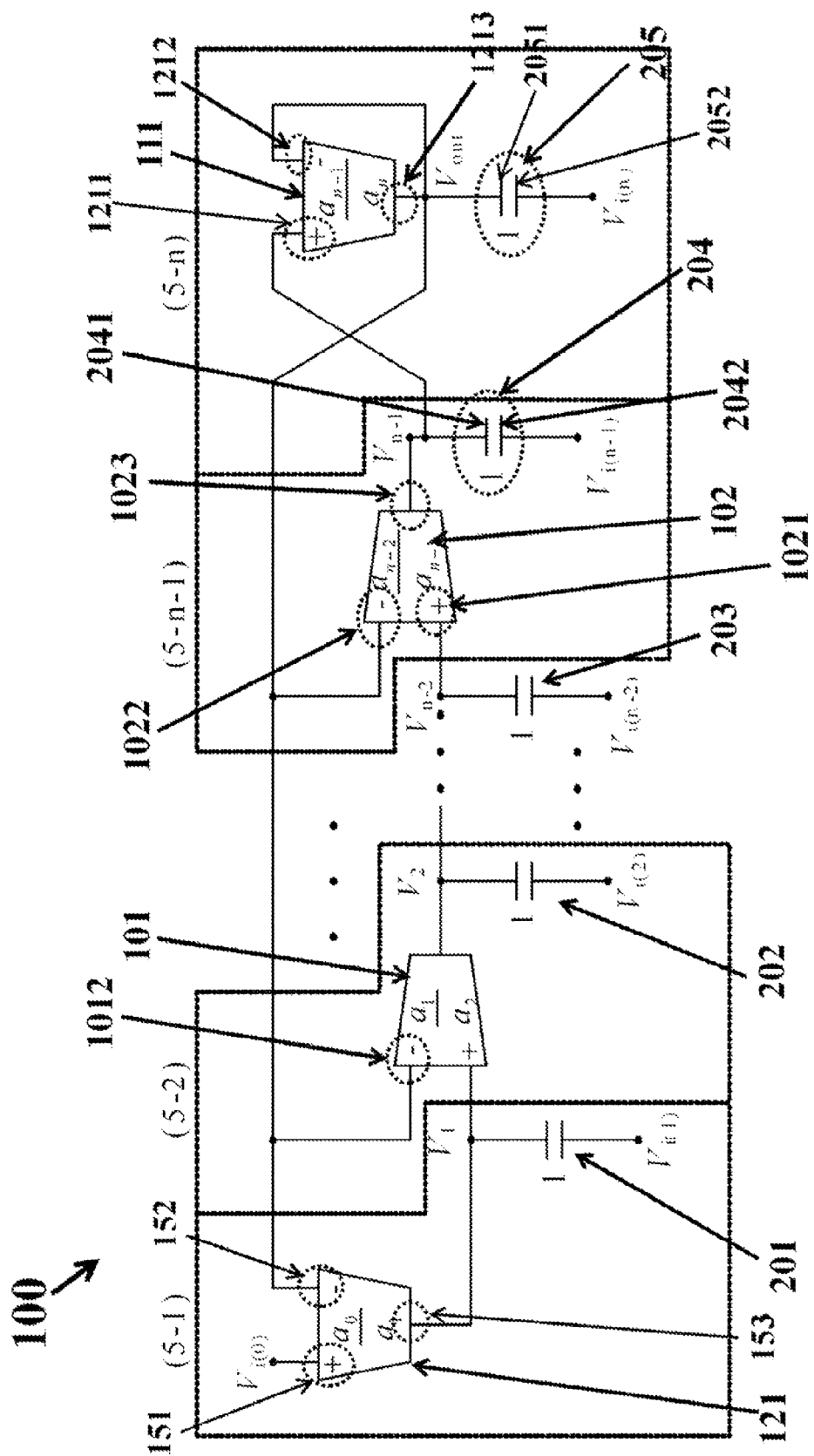
FIG. 1 shows a voltage-mode n-th order OTA-C universal filter structure with differential-input OTAs and equal capacitance.
Figure 2A:
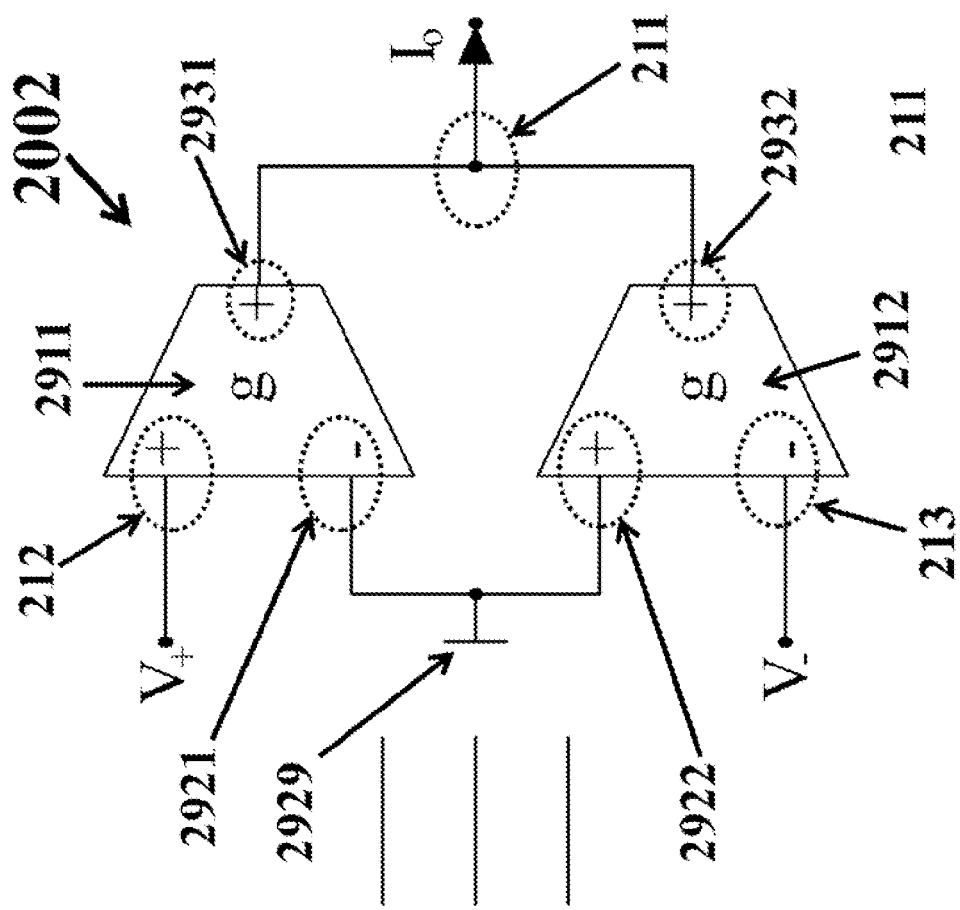
FIG. 2(a) shows a transformation from a differential-input OTA to two parallel and complementary single-ended-input OTAs.
Figure 2A:
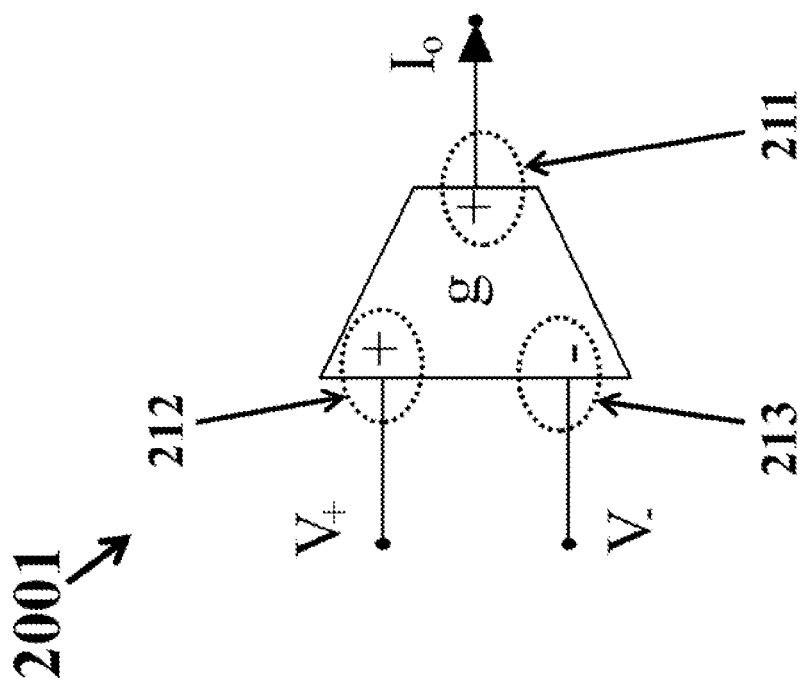
Figure 2B:
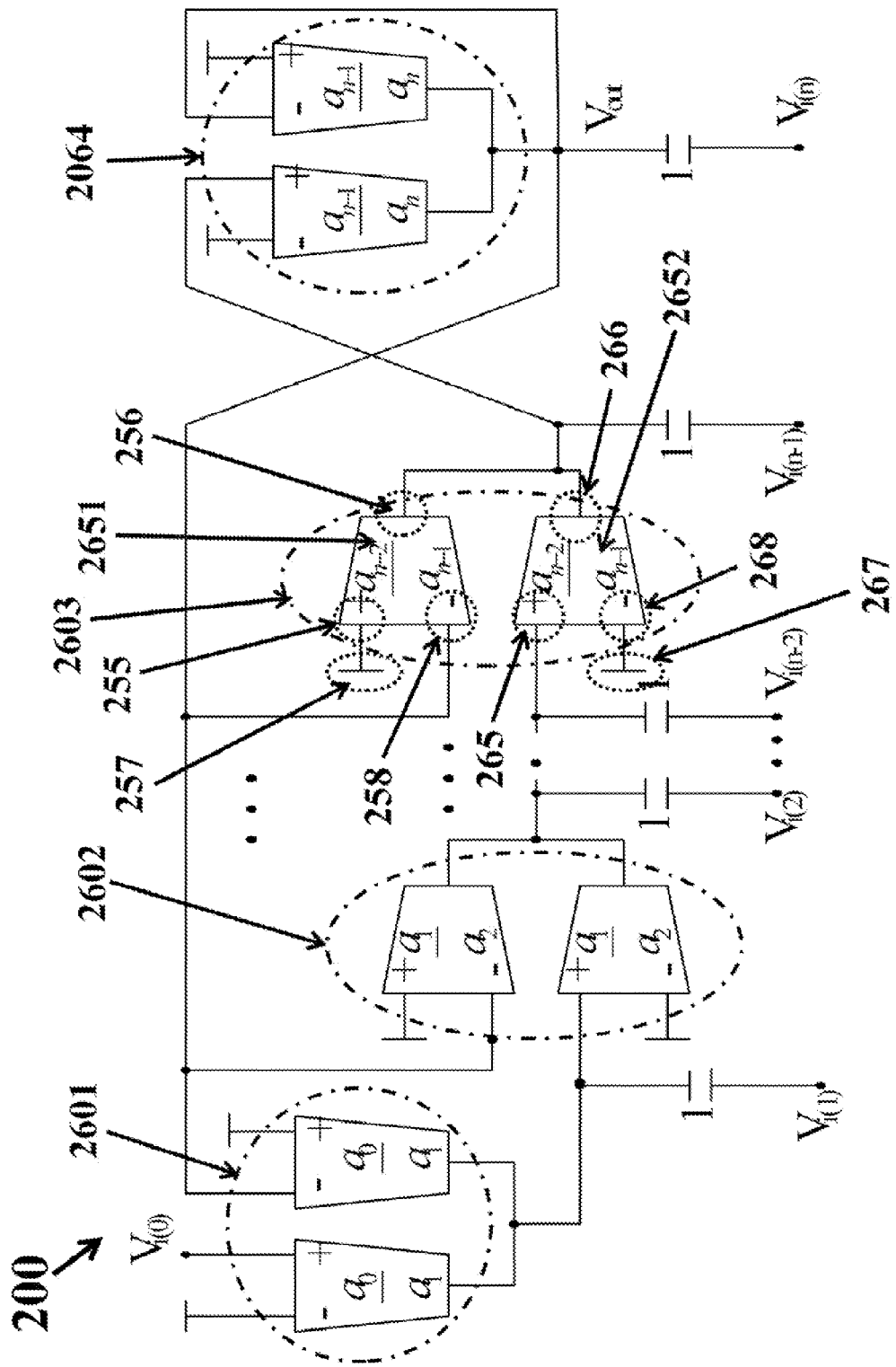
FIG. 2(b) shows a complementary single-ended-input OTA based universal filter structure derived from FIG. 1.
Figure 3:
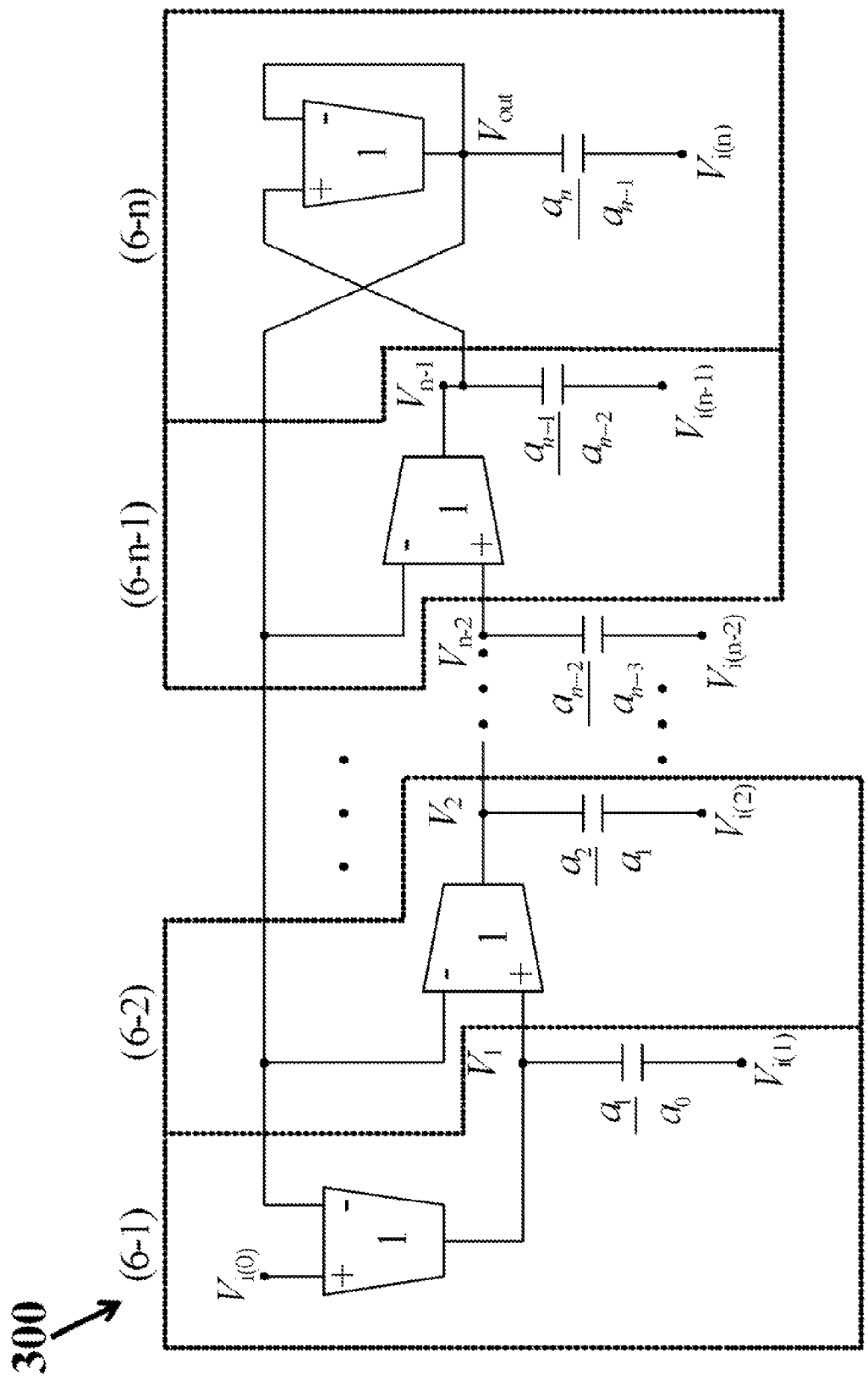
FIG. 3 shows a voltage-mode n-th order OTA-C universal filter structure with differential-input OTAs and equal transconductance.
Figure 4:
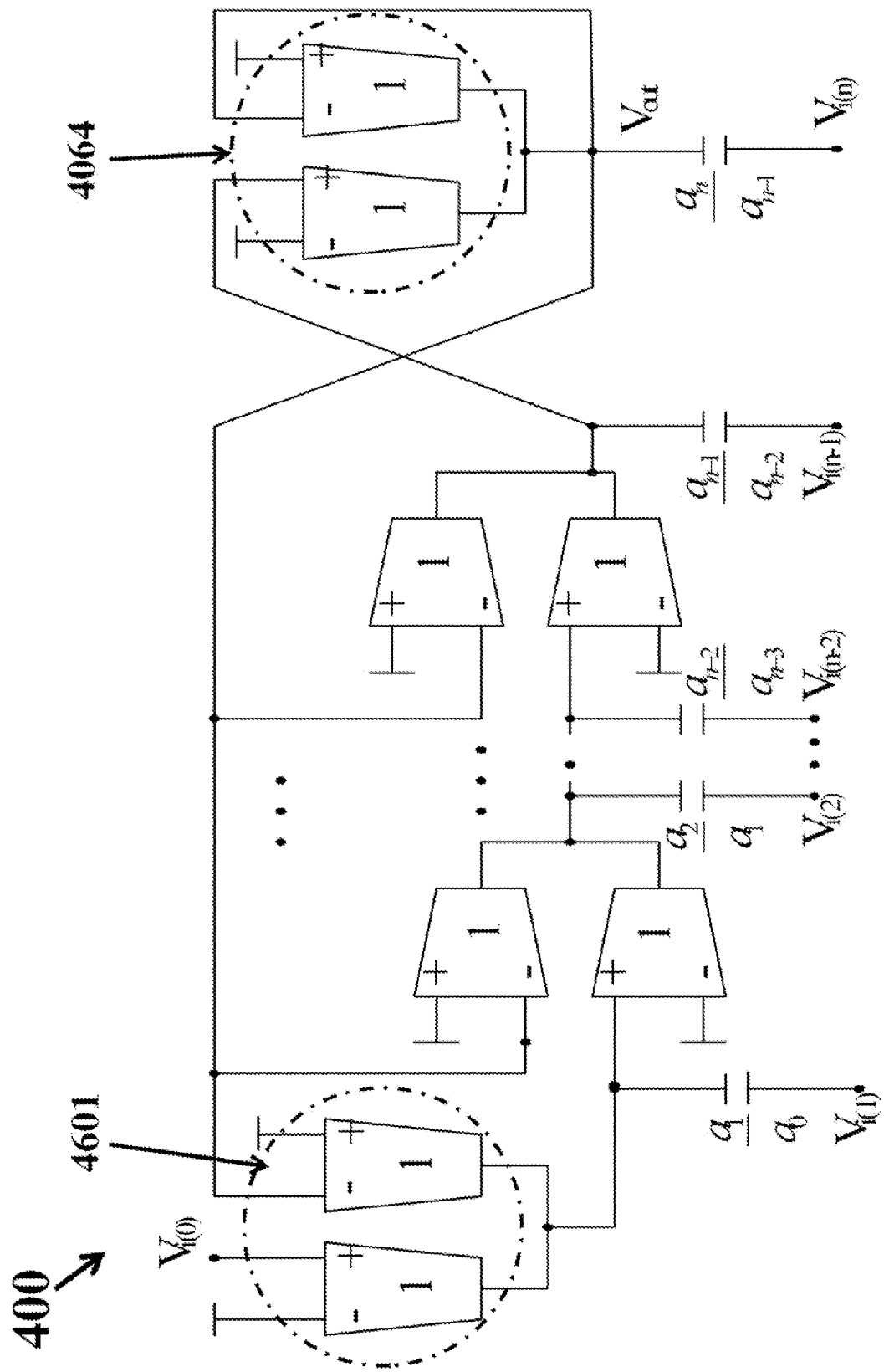
FIG. 4 shows a complementary single-ended-input OTA based universal filter structure derived from FIG. 3.
Figure 5:
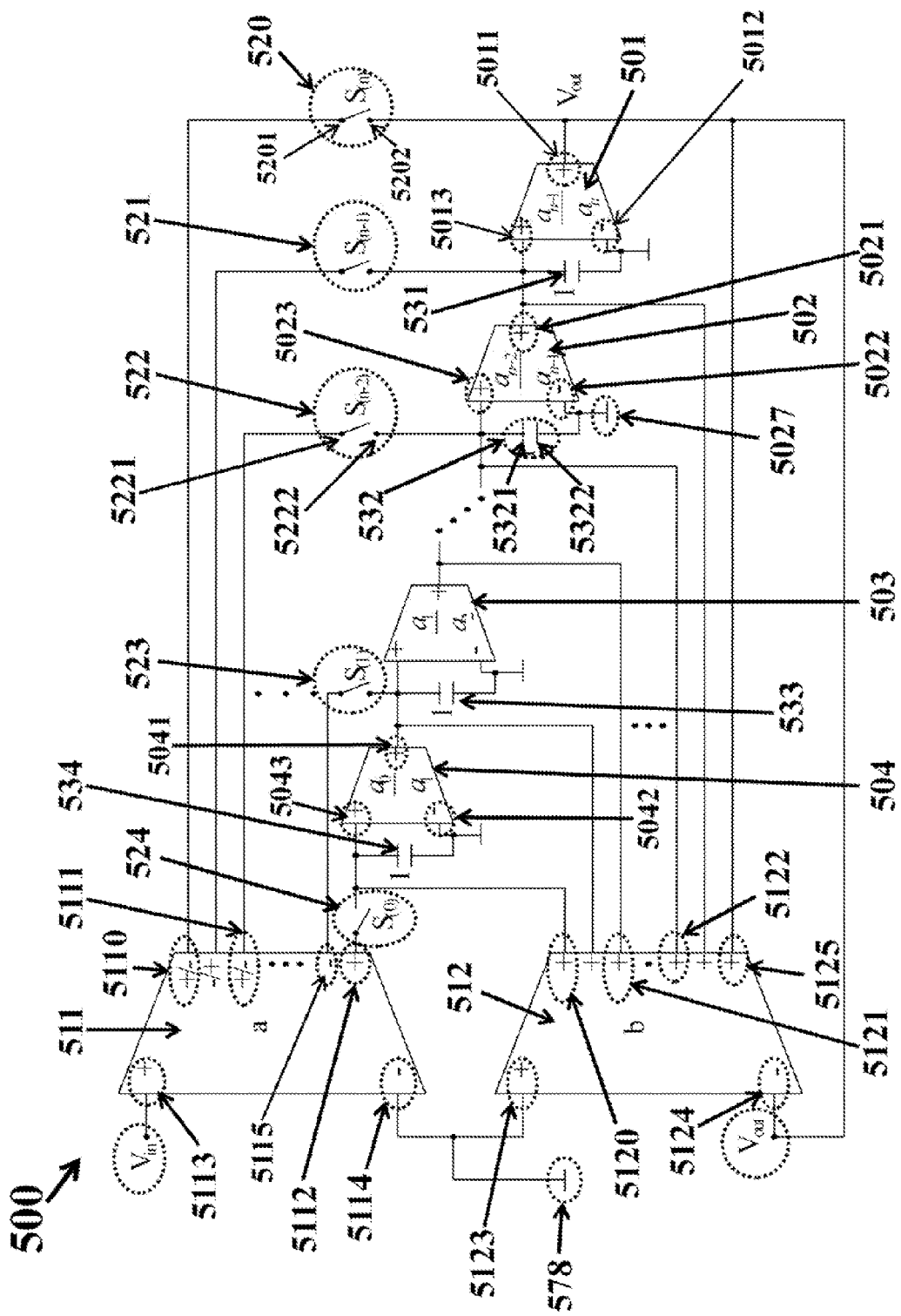
FIG. 5 shows a single-ended-input OTA-grounded C universal filter structure with equal capacitance.
Figure 6:
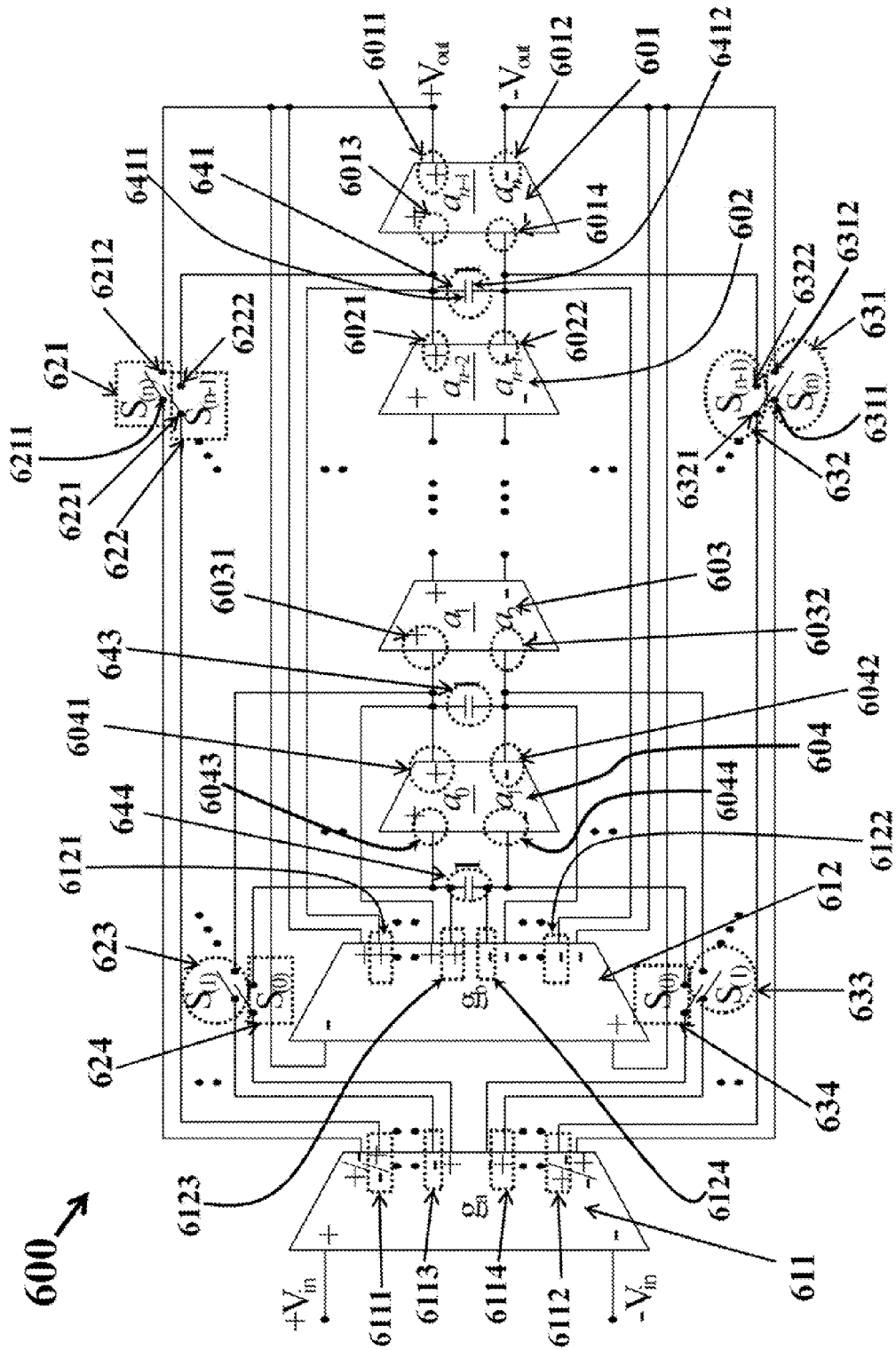
FIG. 6 shows a fully differential OTA-C universal filter structure with equal capacitance.
Figure 7:
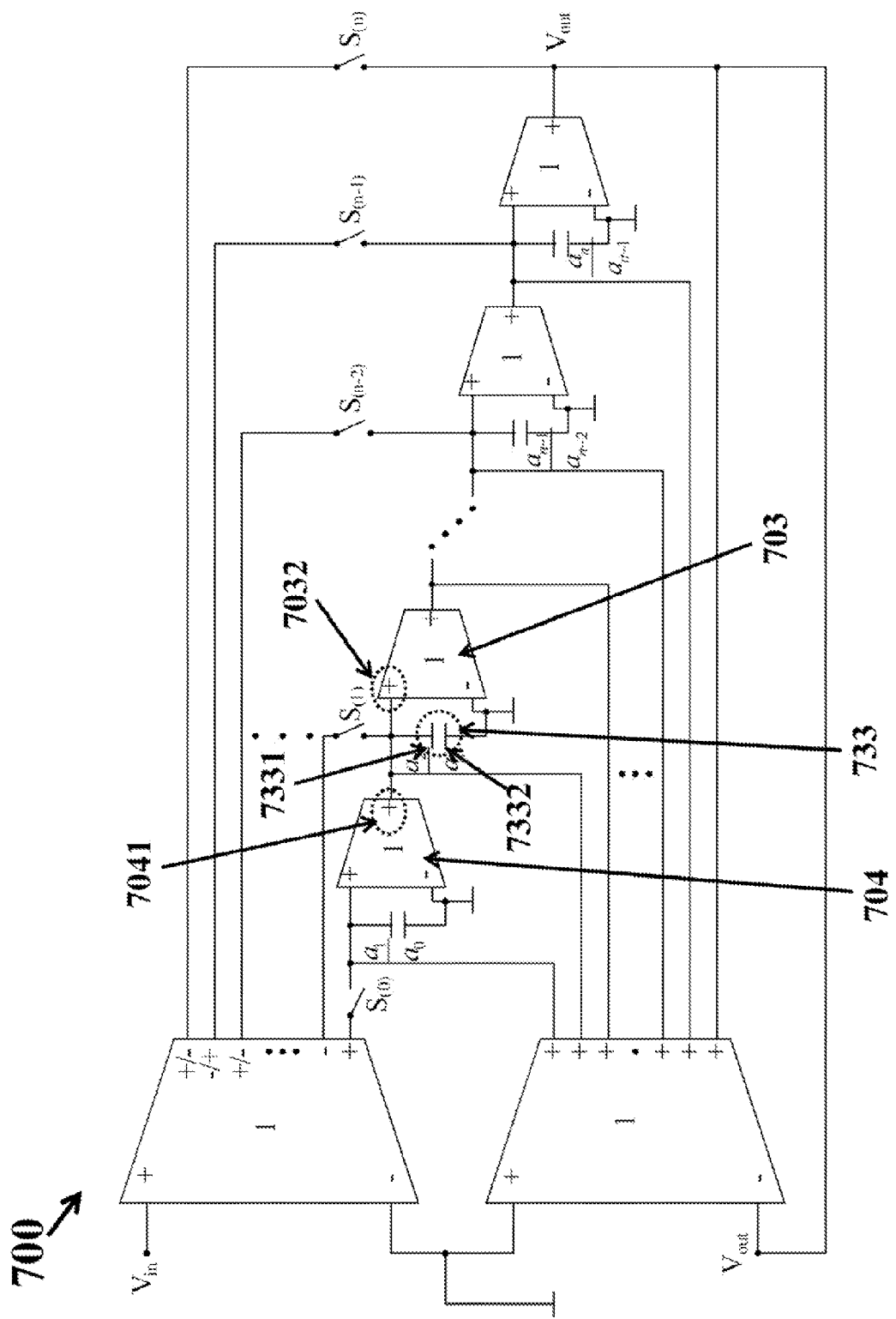
FIG. 7 shows a single-ended-input OTA-grounded C universal filter structure with equal transconductance.
Figure 8:
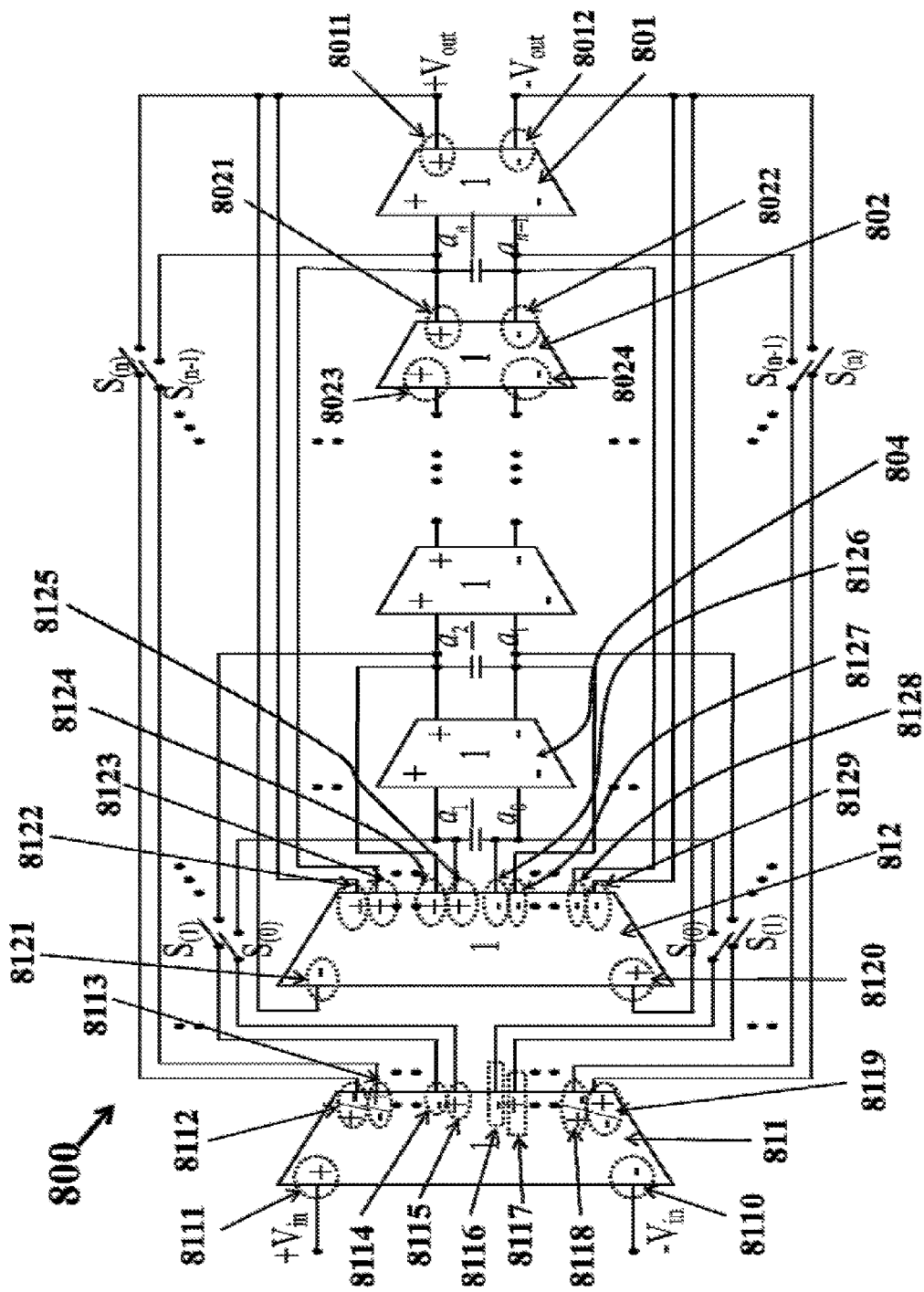
FIG. 8 shows a fully differential OTA-C universal filter structure with equal transconductance.
Figure 9:
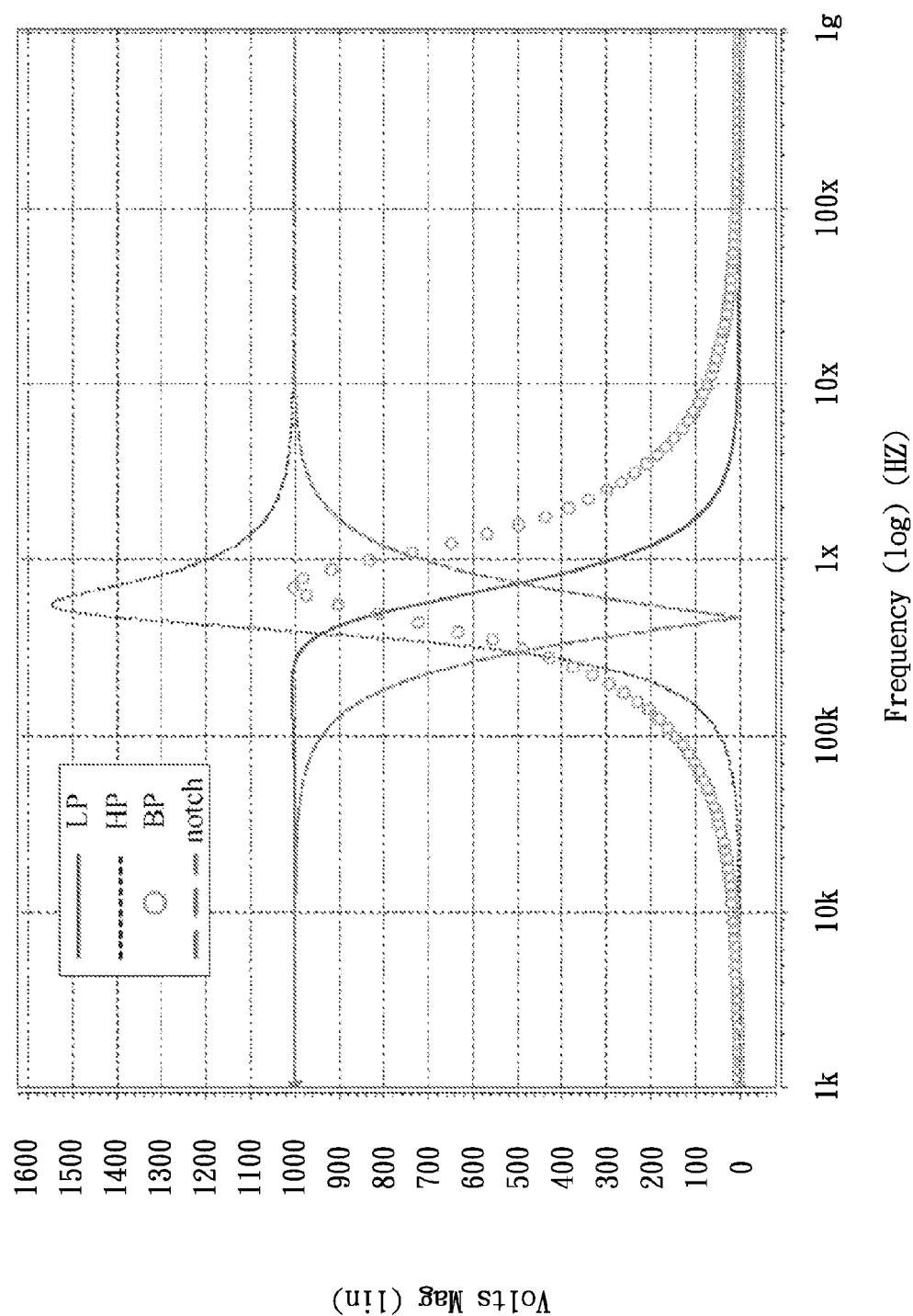
FIG. 9 shows LP, BP, HP, and NH amplitude-frequency responses of the universal biquad derived from FIG. 1.
Figure 10:
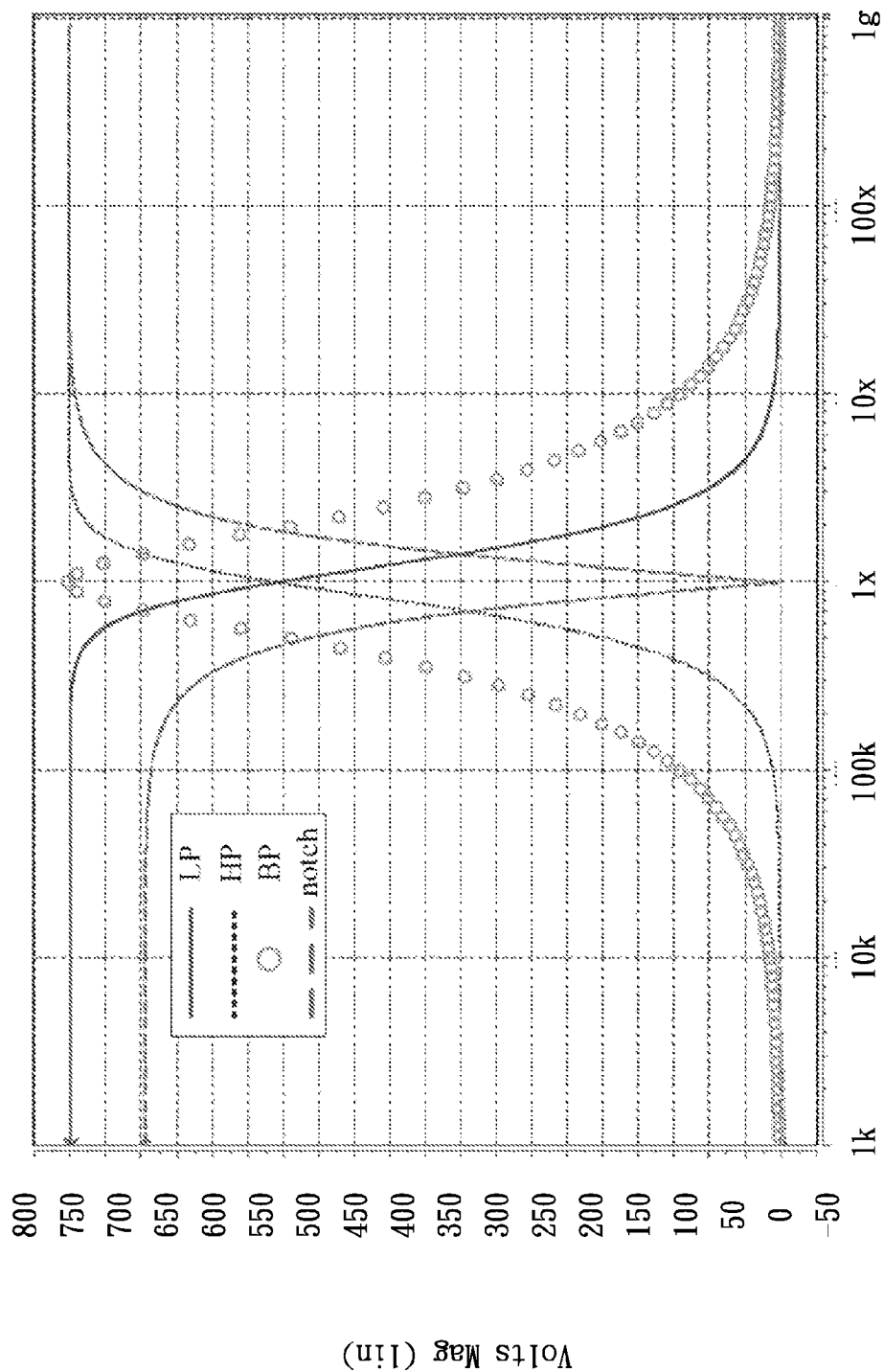
FIG. 10 shows LP, BP, HP, and NH amplitude-frequency responses of the universal biquad derived from FIG. 2.

The present invention provides an integrated circuit as shown in FIGS. 1 and 3. The present invention also provides an integrated circuit as shown in FIGS. 2 and 4. The present invention then provides an integrated circuit as shown in FIGS. 5 and 7. The present invention provides another integrated circuit as shown in FIGS. 6 and 8.

Please refer to FIG. 1. The present invention provides an integrated circuit 100. In some embodiments, the integrated circuit 100 comprises several first amplifiers 101, 102, 111, 121 and several first capacitors 201, 202, 203, 204 and 205.

As shown in FIGS. 1 and 2(a), the amplifier 101 (or, 2001) comprises at least one output 211, at least one negative input 213, and at least one positive input 212. Please refer to FIG. 2(a). For example, the output 211 provides a positive voltage or positive current flow. The negative input 213 may be connected to a negative voltage source. The positive input 212 may be connected to a positive voltage source.

Please refer to FIG. 1. The first capacitor 204 comprises a first electrode 2041 and a second electrode 2042. The first electrode 2041 is electrically connected to the positive input 1211 of its corresponding first amplifier 111.

In FIG. 1, the second electrode 2042 can be electrically connected to a first electrical source $V_{i(n-1)}$.

The first electrode 201 is connected to an electrical source $V_{i(1)}$. The first electrode 202 is connected to an electrical source $V_{1(2)}$. The first electrode 203 is connected to an electrical source $V_{i(n-2)}$. The first electrode 205 is connected to an electrical source $V_{i(n)}$.

As shown in FIG. 1, the output of the first amplifier 121 provides a voltage $V_1$. The output of the first amplifier 101 provides a voltage $V_2$. The output of the first amplifier 102 provides a voltage $V_{n-1}$. The output of the first amplifier 111 provides a voltage $V_{out}$.

As shown in FIG. 1, the negative input 152 of one first amplifier 121 is electrically connected to the negative input 1012 of another first amplifier 101.

The first amplifier 111 in FIG. 1 is treated as a head amplifier 111, while the first amplifier 121 is treated as a tail amplifier 121. As shown in FIGS. 1 and 2(a), the head amplifier 111 (or, 2001) and tail amplifier 121 (or, 2001) also comprise at least one output 211, at least one negative input 213, and at least one positive input 212.

Alternatively, as shown in FIG. 1, the head amplifier 111 also comprises at least one output 1213, at least one negative input 1212, and at least one positive input 1211. For some embodiments, as shown in FIG. 1, the output 1213 provides a voltage $V_{out}$, or positive current flow. The negative input 1212 may be connected to a voltage source. The positive input 1211 may be connected to a voltage source.

Referring to FIG. 1, the output 1213 of the head amplifier 111 is electrically connected to the negative input 1212 of the head amplifier 111. For some embodiments, the output 1213 of the head amplifier 111 is also electrically connected to the negative inputs (e.g., negative input 152) of other amplifiers 121, 101, 102, as shown in FIG. 1.

The positive input 151 of the tail amplifier 121 can be electrically connected to a general electrical source $V_{i(0)}$.

Please refer to FIG. 1. For some embodiments, among the first capacitors 201, 202, 203, 204, 205, there is a head capacitor 205. The head capacitor 205 also comprises a first electrode 2051 and a second electrode 2052. The first electrode 2051 of the head capacitor 205 is electrically connected to the negative input 1212 of the head amplifier 111. For some embodiments, the first electrode 2051 of the head capacitor 205 is also electrically connected to the negative inputs (e.g., negative input 152) of other first amplifiers 121, 101, 102, as shown in FIG. 1.

The present invention also provides an integrated circuit as shown in FIGS. 2 and 4. In any first amplifier used in the embodiments related to FIGS. 1 and 3 could be replaced by a different type of amplifier 2002 as shown in FIG. 2(a).

In FIG. 2(a), the first amplifier 2002 further comprises a first component amplifier 2911 and a second component amplifier 2912.

The first component amplifier 2911 comprises at least one positive input 212, at least one negative input 2921 and at least one output 2931. The second component amplifier 2912 also comprises at least one positive input 2922, at least one negative input 213 and at least one output 2932.

As shown in FIG. 2(a), compared to a single amplifier 2001, the duel amplifier 2002 has some common features that are seen in the single amplifier 2001. For instance, the positive input 212 of the first component amplifier 2911 is equivalent to the positive input 212 of the first amplifier 2001. The negative input 213 of the second component amplifier 2912 is the negative input 213 of the first amplifier 2001.

For some embodiments, as shown in FIG. 2(a), the negative input 2921 of the first component amplifier 2911 is electrically connected to the positive input 2922 of the second component amplifier 2912.

For some embodiments, both the negative input 2921 of the first component amplifier 2911 and the positive input 2922 of the second component amplifier 2912 can be electrically connected to a ground 2929, as shown in FIG. 2(a).

It should be noted that not all first amplifiers used in the embodiments related to FIGS. 1 and 3 are necessary to be replaced by a duel amplifier 2002 as shown in FIG. 2(a). Even though one first amplifier used in the embodiments related to FIGS. 1 and 3 can be replaced with a duel amplifier 2002 as shown in FIG. 2(a), some modifications may be done due to the applicability of circuit design or manufacturing concerns.

In FIG. 2(b), the present invention provides another integrated circuit 200 that applies a duel amplifier (labeled as 2002 in FIG. 2(a)) as a first amplifier 121, 101, 102, 111 used in FIG. 1.

As shown in FIG. 2(b), the integrated circuit 200 comprises several first amplifiers 2601, 2602, 2603 and 2064. For instance, one first amplifier 2603 comprises a first component amplifier 2652 and a second component amplifier 2651. The second component amplifier 2651 comprises at least one positive input 255, at least one negative input 258 and at least one output 256. The first component amplifier 2652 comprises at least one positive input 265, at least one negative input 268 and at least one output 266.

Please refer to FIGS. 1 and 2(b). Assume the first amplifier 102 in FIG. 1 is equivalent to the first amplifier 2603 in FIG. 2(b). So, the positive input 265 of the first component amplifier 2652 in FIG. 2(b) is equivalent to the positive input 1021 of the first amplifier 102 in FIG. 1. The negative input 258 of the second component amplifier 2651 in FIG. 2(b) is equivalent to the negative input 1022 of the first amplifier 102 in FIG. 1.

For some embodiments, as shown in FIG. 2(b), the negative input 268 of the first component amplifier 2652 can be electrically connected to a ground 267.

For some embodiments, as shown in FIG. 2(b), the positive input 255 of the second component amplifier 2651 can be electrically connected to a second ground 257.

For some embodiments, the outputs 266, 256 of both the first component amplifier 2652 and second component amplifier 2651 in FIG. 2(b) are jointly equivalent to the output 1023 of the first amplifier 102 in FIG. 1.

Please refer to FIGS. 2(b) and 4 again. An integrated circuit 200, 400 of the present invention has a head amplifier 2064, 4064 and a tail amplifier 2601, 4601. The details of each head amplifier or tail amplifier are equivalent to those of the first amplifier 2603 as shown in FIG. 2(b).

Please refer to FIGS. 5 and 7. The present invention provides another integrated circuit 500. The integrated circuit 500 comprises a first multi-output amplifier 511, a second multi-output amplifier 512, a plurality of first amplifiers 501, 502, 503, 504, a plurality of switches 520, 521, 522, 523, 524 and a plurality of first capacitors 531, 532, 533, 534, as shown in FIG. 5.

The first multi-output amplifier 511 comprises several outputs 5110, 5111, 5112, at least one negative input 5114 and at least one positive input 5113. For some embodiments, as shown in FIG. 5, the positive input 5113 can be electrically connected to a general electrical source $V_{in}$.

The second multi-output amplifier 512 comprises several outputs 5120, 5121, 5122, 5125, at least one negative input 5124, and at least one positive input 5123.

For some embodiments, as shown in FIG. 5, both the negative input 5114 of the first multi-output amplifier 511 and the positive input 5123 of the second multi-output amplifier 512 can be electrically connected to a ground 578.

The first amplifier 502, for example, comprises at least one output 5021, at least one negative input 5022 and at least one positive input 5023. For some embodiments, as shown in FIG. 5, the positive input 5023 of the first amplifier 502 is electrically connected to one output 5122 of the second multi-output amplifier 512. For some embodiments, the positive input 5023 of the first amplifier 502 is electrically connected to one output 5111 of the first multi-output amplifier 511 through a switch 522. Specifically, when the switch 522 is on, the positive input 5023 of the first amplifier 502 and the output 5111 of the first multi-output amplifier 511 are electrically connected. When the switch 522 is off, no electrical connection exists between the positive input 5023 of the first amplifier 502 and the output 5111 of the first multi-output amplifier 511.

In FIG. 5, a switch comprises a first node and a second node. For instance, the switch 522 comprises a first node 5221 and a second node 5222.

The switch is electrically connected to its corresponding first amplifier. For instance, the switch 522 is electrically connected to its corresponding first amplifier 502. The switch 521 is electrically connected to its corresponding first amplifier 501.

The switch 520 and switch 521 are electrically connected to the same first amplifier 501.

As shown in FIG. 5, a switch is electrically connected to one output of the first multi-output amplifier 511. Specifically, the first node 5221 of a switch 522 is electrically connected to one output 5111 of the first multi-output amplifier 511.

The first capacitor comprises a first electrode and a second electrode. For example, the first capacitor 532 comprises a first electrode 5321 and a second electrode 5322. The first electrode 5321 of the first capacitor 532 is electrically connected to the positive input 5023 of its corresponding first amplifier 502. The second electrode 5322 of the first capacitor 532 is electrically connected to the negative input 5022 of its corresponding first amplifier 502.

As shown in FIG. 5, for some embodiments, the second electrode 5322 of the first capacitor 532 can be electrically connected to a first electrical source 5027. For some embodiments, the second electrode 5322 of the first capacitor 532 can be electrically connected to a ground 5027, as shown in FIG. 5.

Please refer to FIG. 7, where the integrated circuit 700 is equivalent to the integrated circuit 500 in FIG. 5. A first capacitor 733 in FIG. 7 is electrically connected to the positive input 7032 of its corresponding first amplifier 703. The first capacitor 733 is also electrically connected to the output 7041 of its neighboring first amplifier 704.

Specifically, please refer to FIG. 7 again. A first capacitor 733 has a first electrode 7331 and a second electrode 7332. The first electrode 7331 is electrically connected to the positive input 7032 of the first amplifier 703. For some embodiments, the first electrode 7331 is also electrically connected to the output 7041 of its neighboring first amplifier 704.

Please refer to FIG. 5 again. The present invention provides an integrated circuit 500 that comprises several first amplifiers. Among those first amplifiers are a head amplifier 501 and a tail amplifier 504.

The head amplifier 501 comprises at least one output 5011, at least one negative input 5012, and at least one positive input 5013. The tail amplifier 504 comprises at least one output 5041, at least one negative input 5042 and at least one positive input 5043.

As shown in FIG. 5, the output 5011 of the head amplifier 501 is electrically connected to the negative input 5124 of the second multi-output amplifier 512. For some embodiments, the output 5011 of the head amplifier 501 is electrically connected to one output 5125 of the second multi-output amplifier 512.

The present invention provides an integrated circuit 500 that comprises several switches. Among those switches is a head switch 520. The head switch 520 comprises a first node 5201 and a second node 5202.

For some embodiments, the second node 5202 of the head switch 520 is electrically connected to the output 5011 of the head amplifier 501. The first node 5201 of the head switch 520 is electrically connected to one output 5110 of the first multi-output amplifier 511.

As shown in FIG. 5, the output 5011 ($V_{out}$) of the head amplifier 501 is electrically connected to one output 5110 of the first multi-output amplifier 511 through the head switch 520 when the head switch 520 is on. When the head switch 520 is off, there is no current flow between the output 5011 ($V_{out}$) of the head amplifier 501 and one output 5110 of the first multi-output amplifier 511.

Please refer to FIG. 5 again. The present invention provides an integrated circuit 500 with a first multi-output amplifier 511. The first multi-output amplifier 511 has at least one positive output 5112. For some embodiments, the positive input 5043 of the tail amplifier 504 is electrically connected to one positive output 5112, for instance, of the first multi-output amplifier 511.

For some embodiments, as shown in FIG. 5, the first multi-output amplifier 511 comprises at least one negative output 5115.

For some embodiments, as shown in FIG. 5, the first multi-output amplifier 511 comprises at least one duel output 5110, 5111. A "duel output" means an output providing a positive signal or negative signal. Such a duel output may provide a positive signal and a negative signal, simultaneously. Alternatively, such a duel output may provide a signal shape that combines positive and negative magnitudes.

For some embodiments, as shown in FIG. 5, the output 5011 ($V_{out}$) of the head amplifier 501 is electrically connected to one duel output 5110 of the first multi-output amplifier 511. For some embodiments, the output 5011 ($V_{out}$) of the head amplifier 501 is electrically connected to one duel output 5110 of the first multi-output amplifier 511 through a switch 520. When the switch 520 is on, there current will flow between the output 5011 ($V_{out}$) of the head amplifier 501 and the duel output 5110 of the first multi-output amplifier 511. When the switch 520 is off, there will be no current flow between them.

The present invention provides another integrated circuit 600, as shown in FIG. 6. The integrated circuit 600 comprises a first multi-output amplifier 611, a second multi-output amplifier 612, several first amplifiers 601, 602, 603, 604, several first switches 621, 622, 623, 624, several second switches 631, 632, 633, 634 and several first capacitors 641, 643, 644.

Please refer to FIG. 8. The present invention also provides another integrated circuit 800 that is similar to the integrated circuit 600.

As shown in FIG. 8, the integrated circuit 800 comprises a first multi-output amplifier 811 (equivalent to the element 611 in FIG. 6). The first multi-output amplifier 811 comprises several outputs 8112, 8113, 8114, 8115, 8116, 8117, 8118, 8119, at least one negative input 8110 and at least one positive input 8111.

As shown in FIG. 8, the positive input 8111 of the first multi-output amplifier 811 can be electrically connected to an electrical source that may a positive voltage. The negative input 8110 of the first multi-output amplifier 811 can be electrically connected to an electrical source that may provide a negative voltage.

As shown in FIG. 8, the integrated circuit 800 comprises a second multi-output amplifier 812 (equivalent to the element 612 in FIG. 6). The second multi-output amplifier 812 comprises several outputs 8122, 8123, 8124, 8125, 8126, 8127, 8128, 8129, at least one negative input 8121 and at least one positive input 8120.

As shown in FIGS. 6 and 8, the integrated circuit 600, 800 has several first amplifiers. As shown in FIG. 8, the first amplifier 802 comprises at least one positive output 8021, at least one negative output 8022, at least one negative input 8024, and at least one positive input 8023.

Please refer to FIG. 6. The positive output 6041 of one first amplifier 604 is electrically connected to the positive input 6031 of another first amplifier 603. The negative output 6042 of one first amplifier 604 is electrically connected to the negative input 6032 of another first amplifier 603.

Please refer to FIG. 8. For some embodiments, the positive output 8021 of the first amplifier 802 is electrically connected to one output 8123 of the second multi-output amplifier 812. The negative output 8022 of the first amplifier 802 is electrically connected to one output 8128 of the second multi-output amplifier 812.

Referring back to FIG. 6, for some embodiments, the positive input 6031 of the first amplifier 603 is electrically connected to one output 6113 of the first multi-output amplifier

611. The negative input 6032 of the first amplifier 603 is electrically connected to one output 6114 of the first multi-output amplifier 611.

Regarding the switches used in some embodiments of the present invention, as shown in FIG. 6, a first switch 622 comprises one first node 6221 and one second node 6222. The first switch 622 is electrically connected to its corresponding first amplifier 602. The first switch 621 is electrically connected to its corresponding first amplifier 601. The first switch 623 is electrically connected to its corresponding first amplifier 604. The first switch 624 is electrically connected to its corresponding first amplifier 604.

As shown in FIG. 6, a second switch 632 comprises one first node 6321 and one second node 6322. The second switch 631 is electrically connected to its corresponding first amplifier 601. The second switch 632 is electrically connected to its corresponding first amplifier 602. The second switch 633 is electrically connected to its corresponding first amplifier 604. The second switch 634 is electrically connected to its corresponding first amplifier 604.

Among the first switches, a first head switch 621 also comprises one first node 6211 and one second node 6212. For some embodiments, the second node 6212 of the first head switch 621 is electrically connected to the positive output 6011 of the head amplifier 601.

Among the second switches in FIG. 6, a second head switch 631 is provided. The second head switch 631 also comprises one first node 6311 and one second node 6312. The second node 6312 of the second head switch 631 is electrically connected to the negative output 6012 of the head amplifier 601.

Please refer to FIG. 6. An integrated circuit 600 of the present invention comprises a first capacitor that is connected to its adjacent first amplifier(s). For some embodiments, a first capacitor 641 comprises a first electrode 6411 and a second electrode 6412. The first electrode 6411 of the first capacitor 641 is electrically connected to the positive input 6013 of its corresponding first amplifier 601, while the second electrode 6412 is electrically connected to the negative input 6014 of its corresponding first amplifier 601. In addition, the first electrode 6411 is electrically connected to one output 6121 of the second multi-output amplifier 612, while the second electrode 6412 is electrically connected to one output 6122 of the second multi-output amplifier.

In FIG. 6, a first capacitor 641 also comprises a first electrode 6411 and a second electrode 6412. The first electrode 6411 of the first capacitor 641 is electrically connected to the positive output 6021 of another first amplifier 602, while the second electrode 6412 is electrically connected to the negative output 6022 of the first amplifier 602. In addition, the first electrode 6411 is electrically connected to one output 6111 of the first multi-output amplifier 611 through a switch 622, while the second electrode 6412 is electrically connected to one output 6112 of the first multi-output amplifier 611 through a switch 632.

Please refer to FIGS. 6 and 8 again. The first amplifiers include a head amplifier 601, 801 and a tail amplifier 604, 804. As shown in FIG. 6, the head amplifier 601 also comprises at least one positive output 6011, at least one negative output 6012, at least one negative input 6014 and at least one positive input 6013. The tail amplifier 604 also comprises at least one positive output 6041, at least one negative output 6042, at least one negative input 6044 and at least one positive input 6043.

Please refer to FIG. 8. For some embodiments, the positive output 8011 of the head amplifier 801 is electrically connected to the negative input 8121 of the second multi-output amplifier 812, and the negative output 8012 of the head amplifier 801 is electrically connected to the positive input 8120 of the second multi-output amplifier 812.

Referring back to FIG. 6, the positive input 6043 of the tail amplifier 604 is electrically connected to one output 6123 of the second multi-output amplifier 612, and the negative input 6044 of the tail amplifier 604 is electrically connected to one output 6124 of the second multi-output amplifier 612.

In FIG. 8, one integrated circuit 800 of the present invention comprises a first multi-output amplifier 811. As shown in FIG. 8, for some embodiments, the first multi-output amplifier 811 comprises at least one positive output 8115, 8117. The first multi-output amplifier 811 comprises at least one negative output 8114, 8116 and the first multi-output amplifier 811 comprises at least one duel output 8112, 8113, 8118 and 8119.

For the embodiment of FIG. 8, one integrated circuit 800 of the present invention comprises a second multi-output amplifier 812. The second multi-output amplifier 812 comprises at least one positive output 8122, 8123, 8124, 8125 and at least one negative output 8126, 8127, 8128, 8129.

As shown in FIG. 8, for some embodiments, the positive output 8123 of the second multi-output amplifier 812 is electrically connected to the positive output 8021 of the first amplifier 802. The negative out 8128 of the second multi-output amplifier 812 is electrically connected to the negative output 8022 of the first amplifier 802.

Please refer to FIG. 6 again. An integrated circuit 600 of the present invention also comprises a tail amplifier 604. The positive input 6043 of the tail amplifier 604 is electrically connected to one positive output 6123 of the second multi-output amplifier 612. The negative input 6044 of the tail amplifier 604 is electrically connected to one negative output 6124 of the second multi-output amplifier 612.

It should be noted that an "amplifier" used in the present invention (e.g., "first amplifier," "component amplifier," "head amplifier," "tail amplifier," and so on) is an electronic amplifier that is a device for increasing the power of a signal. It does this by taking energy from a power supply and controlling the output of the amplifier to match the input signal shape but with a larger amplitude.

It should be noted that the mark "+" in FIGS. 1-8 expresses an idea that either an input or output with the mark "+" is associated with a positive voltage, or positive voltage source. As for the mark "−", similarly, an input or output with the mark "−" is associated with a negative voltage, or negative voltage source.

It should be noted that the mark "•" in FIGS. 1-8 expresses two meanings. When the mark "•" is jointed with a solid line, the mark "•" means a node. The word "node" refers to any point on a circuit where two or more circuit elements meet. Two nodes are different when their voltages are different, as well.

On the other hand, when the mark "•" is not associated with a solid line, the mark "•" means a repetitive feature of one single circuit element, such as outputs, switches, amplifiers, capacitors, as so on.

It should be noted that the term "electrically connected" used in the present invention means that two elements are connected through a conductive line (e.g., metal lines in an integrated circuit which are formed by semiconductor technology).

It should be noted that the term "ground" used in the present invention may be a ground, or an electrical reference (e.g., voltage).

It should be noted that the specification of the present invention is viewed in terms of electrical engineering, electronic engineering, or any fields related to semiconductor technology or integrated circuit design.

The synthesis methods for acquiring the integrated circuit embodiments of the present invention are described as follows.

II. Analytical Synthesis Method I

Although the analytical synthesis method was applied to the design of prior art filter structures, yet each analytical synthesis method is different from another and then the realized filter structures are different from each other. Therefore, the analytical synthesis method is just one of the classifications of circuit design approaches. It is similar to the signal flow diagram which is also one of the classifications of circuit design approaches. Different signal flow diagram leads to distinct circuit structure. In the section, a new analytical synthesis method using some differential-input OTAs and some floating capacitors is investigated. Although this new kind of filter structure is without the aforementioned three important criteria, a new complementary single-ended-input OTA-based filter structure produced from the new differential-input OTA-based one will be validated to have much better output precision, even better than the well-known single-ended-input OTA based one. The voltage-mode nth-order universal filter transfer function is given by $$V_{out} = \frac{\sum_{j=0}^{n} V_{i(j)}(s^j a_j)}{\sum_{j=0}^{n} (s^j a_j)} \quad (1)$$

To realize the highest-order and lowest-order terms, $s^n a_n$ and $a_0$, we need a minimum numbers of n capacitors and n transconductances (of OTAs), respectively; for consistence with the same unit. Thus the minimum number of passive and active components required for synthesizing equation (1) is n capacitors and n OTAs. In order to use the minimum number of active and passive components, differential-input OTAs and floating capacitors are used in the following new ASM.

Cross-multiplying equation (1), dividing by $s^n a_n$, and re-arranging the sequence of terms, we obtain $$V_{out} = \left(\frac{a_o}{s^n a_n}\right)(V_{i(o)} - V_{out}) + \quad (2)$$
$$\left(\frac{a_1}{s^{n-1} a_n}\right)(V_{i(1)} - V_{out}) + \left(\frac{a_2}{s^{n-2} a_n}\right)(V_{i(2)} - V_{out}) + \ldots +$$
$$\left(\frac{a_{n-2}}{s^2 a_n}\right)(V_{i(n-2)} - V_{out}) + \left(\frac{a_{n-1}}{s a_n}\right)(V_{i(n-1)} - V_{out}) + V_{i(n)}$$

Since
$$\left(\frac{a_o}{s^n a_n}\right) = \left(\frac{a_{n-1}}{s a_n}\right)\left(\frac{a_{n-2}}{s a_{n-1}}\right) \ldots \left(\frac{a_2}{s a_3}\right)\left(\frac{a_1}{s a_2}\right)\left(\frac{a_0}{s a_1}\right)$$
and
$$\left(\frac{a_j}{s^{n-j} a_n}\right) = \left(\frac{a_{n-1}}{s a_n}\right)\left(\frac{a_{n-2}}{s a_{n-1}}\right) \ldots \left(\frac{a_{j+1}}{s a_{j+2}}\right)\left(\frac{a_j}{s a_{j+1}}\right) \quad (3)$$
for $j = 0, 1, 2, 3 \ldots, n-1$.

taking out the same common factor of the right side of equation (2),

A. Part I: Equal Capacitance Approach:
Observing equation (4), we can let $$V_1 = \left(\frac{(a_0/a_1)}{s}\right)(V_{i(0)} - V_{out}) + V_{i(1)}$$

which is equivalent to $$(V_1 - V_{i(1)})s = \left(\frac{a_0}{a_1}\right)(V_{i(0)} - V_{out}) \quad (5\text{-}1)$$

and $V_j = \left(\frac{(a_{j-1}/a_j)}{s}\right)(V_{i(j-1)} - V_{out}) + V_{i(j)}$ for $j = 2, 3 \ldots, n-1, n$ which may be written as $$(V_j - V_{i(j)})s = \left(\frac{a_{j-1}}{a_j}\right)(V_{i(j-1)} - V_{out}) \text{ for } j = 2, 3 \ldots, n-1, n \quad (5\text{-}j)$$

and $V_{out} = V_n$. Each of the above equations is simple and easy to realize using a differential-input OTA, with a transconductance of $a_{j-1}/a_j$, and a floating capacitor with unit capacitance. The OTA-C realizations of these simple first-order equations, (5-1), (5-2), (5-n-1), and (5-n), are presented in the dashed line blocks from the left to the right, respectively, in FIG. 1, which shows the new voltage-mode nth-order OTA-C universal filter structure with the minimum number of active and passive components, namely, n differential-input OTA and n floating capacitors. In particular, all of the capacitances are of equal value. Equal-valued or simple-ratio-value capacitance design overcomes the difficulty of precise variation of capacitances in IC fabrication. Note that when the input impedance is not very large or the output impedance is not very small, as in the case of the filter structure shown in FIG. 1, a voltage buffer is needed at the input or the output stage, respectively. Therefore, since the proposed voltage-mode nth-order OTA-C universal filter structure may need a buffer to connect with the former or latter stage, the aforementioned minimum number of active and passive components is in the case without considering the requirement of buffers. If adding the buffer to the filter core, we cannot positively say that the proposed filter structure is with the minimum number of active and passive components.

Note that since a differential-input OTA can be realized by two parallel and complementary single-ended-input OTAs (please refer to FIG. 2(a)), the differential-input OTA based universal filter structure shown in FIG. 1 can be transferred to a sin complementary gle-ended-input OTA based one shown in FIG. 2(b).

B. Part II: Equal Transconductance Approach:
Observing (4), we can let $$V_1 = \left(\frac{1}{s(a_1/a_0)}\right)(V_{i(0)} - V_{out}) + V_{i(1)}$$

which is equivalent to $$(V_1 - V_{i(1)})\left(s\frac{a_1}{a_0}\right) = (1)(V_{i(0)} - V_{out}) \quad (6\text{-}1)$$

$$V_j = \left(\frac{1}{s(a_j/a_{j-1})}\right)(V_{i(j-1)} - V_{out}) + V_{i(j)}$$

for $j = 2, 3 \ldots, n-1, n$ which may be re-written as $$(V_j - V_{i(j)})\left(s\frac{a_j}{a_{j-1}}\right) = (1)(V_{i(j-1)} - V_{out}) \quad (6\text{-}j)$$

for $j = 2, 3 \ldots, n-1, n$

Each of the above equations is simple and can easily be realized using a differential-input OTA with unity transconductance and a floating capacitor of capacitance $a_j/a_{j-1}$. The OTA-C realizations of these simple first-order equations, (6-1), (6-2), (6-n-1), and (6-n), are presented in the dashed line blocks from the left to the right, respectively, in FIG. 3, which shows the new voltage-mode nth-order OTA-C universal filter structure with the minimum number of active and passive components, namely, n differential-input OTA and n floating capacitors. In particular, all the transconductances are of equal value. Equal transconductance design leads to a simpler architecture in view of the fact that only a single biasing circuitry is needed for the entire filter structure.

It is apparent that both FIGS. 1 (equal capacitance) and 3 (equal transconductance) have the same circuit structure. FIGS. 1 and 3 show that the circuit structures with equal capacitance and equal transconductance are realizable using analytical synthesis approaches, I and II, respectively. As a matter of fact, the values of capacitances and tranconductances can be given variably. For example, given a fourth-order universal biquad with the circuit structure same as FIGS. 1 and 3, and let the transconductances of the OTAs (resp. the capacitances of the capacitors) from left to right be $g_1$, $g_2$, $g_3$, and $g_4$, (resp. $C_1$, $C_2$, $C_3$, and $C_4$), circuit analysis yields $$V_{out} = \frac{\left[\begin{array}{l} s^4 C_1 C_2 C_3 C_4 V_{i(4)} + s^3 C_1 C_2 C_3 G_4 V_{i(3)} + s^2 C_1 C_2 G_3 G_4 V_{i(2)} + \\ sC_1 G_2 G_3 G_4 V_{i(1)} + G_1 G_2 G_3 G_4 V_{i(0)} \end{array}\right]}{s^4 C_1 C_2 C_3 C_4 + s^3 C_1 C_2 C_3 G_4 + s^2 C_1 C_2 G_3 G_4 + sC_1 G_2 G_3 G_4 + G_1 G_2 G_3 G_4}$$

Therefore, any values of capacitances and transconductances can be given to the circuit structures shown in FIGS. 1 and 3 for achieving the above transfer function.

A corresponding complementary single-ended-input OTA based universal filter structure shown in FIG. 4 is obtained from the differential-input OTA based one shown in FIG. 3 using the transformation shown in FIG. 2(*a*). Note that a single-ended-input OTA is with much lower parasitics than, and without feed-through effect unlike, a differential-input OTA. In view of this, a very interesting question arises: "Which one has more accurate output signals? Is the differential-input OTA based one (FIGS. 1 and 3) with fewer OTAs or the complementary single-ended-input OTA based one (FIGS. 2(*b*) and 4) with more OTAs?"

III. Analytical Synthesis Method II

This section presents an analytical synthesis method for a multifunction filter, which can simultaneously realize nth-order LP BP, HP, BR (or notch), and AP filtering signals programmably, using single-ended-input OTAs and grounded capacitors. The method is based upon a succession of innovative algebraic decomposition of an n-th order versatile filtering transfer function, which represents the LP BP, HP, BR (or notch), and AP transfer functions, into n first-order simple and feasible equations and one collateral constraint. The following shows the methodology.

The realized nth-order transfer function is $$V_{out} = \left(\frac{a}{b}\right)\left[\frac{V_{in}\sum_{i=0}^{n}(-1)^i a_i s^i}{\sum_{i=0}^{n} a_i s^i}\right] = \quad (7)$$

$$\left(\frac{1}{b}\right)\left[\frac{\sum_{i=0}^{n}(-1)^i(aV_{in})a_i s^i}{\sum_{i=0}^{n} a_i s^i}\right] \equiv \left(\frac{1}{b}\right)\left[\frac{\sum_{i=0}^{n}[(-1)^i a_{(i)} V_{in}]a_i s^i}{\sum_{i=0}^{n} a_i s^i}\right]$$

The value of $[(-1)^i a_{(i)} V_{in}]$ may be zero or non-zero as controlled by a switch. Depending on the type of filter to be realized, the position of the switch, (whether it is to be open or closed) is determined. The analytical synthesis method for the realization of the filtering Equation (7) with a gain (a/b) is given below.

Cross multiplying Eq. (7), dividing by $a_n s^n$, and rearranging, we have $$bV_{out} - (-1)^n a_{(n)} V_{in} = \sum_{i=0}^{n-1}[(-1)^i a_{(i)} V_{in} - bV_{out}]\left(\frac{a_i}{a_n s^{n-i}}\right) \quad (8)$$

We now provide an insight into the analytical decomposition of the first two and the last two terms of the right side of Eq. (8) as follows.

$$\sum_{i=n-2}^{n-1}[(-1)^i a_{(i)} V_{in} - bV_{out}]\left(\frac{a_i}{a_n s^{n-i}}\right) = \left[((-1)^{n-1} a_{(n-1)} V_{in} - bV_{out}) + \quad (9)\right.$$
$$\left.((-1)^{n-2} a_{(n-2)} V_{in} - bV_{out})\left(\frac{a_{n-2}}{a_{n-1} s}\right)\right]\left(\frac{a_{n-1}}{a_n s}\right)$$

$$\sum_{i=0}^{1}[(-1)^i a_{(i)} V_{in} - bV_{out}]\left(\frac{a_i}{a_n s^{n-i}}\right) = \left[((-1)a_{(1)} V_{in} - bV_{out}) + \quad (10)\right.$$
$$\left.((-1)^0 a_{(0)} V_{in} - bV_{out})\left(\frac{a_0}{a_1 s}\right)\right]\left(\frac{a_1}{a_n s^{n-1}}\right)$$

Note $$\left(\frac{a_0}{a_n s^n}\right) = \left(\frac{a_0}{a_1 s}\right)\left(\frac{a_1}{a_2 s}\right)\ldots\left(\frac{a_{n-3}}{a_{n-2} s}\right)\left(\frac{a_{n-2}}{a_{n-1} s}\right)\left(\frac{a_{n-1}}{a_n s}\right) \quad (11)$$

Substituting (11) in (8) we get $$bV_{out} - (-1)^n a_{(n)} V_{in} = \quad (12)$$

$$\left(\frac{a_{n-1}}{a_n s}\right)\left[\left(\frac{a_{n-2}}{a_{n-1} s}\right)\left[\begin{array}{l}(-1)^{n-1} a_{(n-1)} V_{in} - bV_{out} + \\ (-1)^{n-2} a_{(n-2)} V_{in} - bV_{out} + \ldots \\ (-1)^2 a_{(2)} V_{in} - bV_{out} + \\ (-1)a_{(1)} V_{in} - bV_{out} + \\ \left(\frac{a_0}{a_1 s}\right)[(-1)^0 a_{(0)} V_{in} - bV_{out}]\end{array}\right]\right]$$

Part I: Equal Capacitance Approach
Observing Eq. (12), we let $$[(-1)^0 a_{(0)} V_{in} - bV_{out}] \quad (13\text{-}0)$$

$$\left(\frac{a_0}{a_1 s}\right) = [(-1)^0 a_{(0)} V_{in} - bV_{out}]\left(\frac{a_0/a_1}{s}\right) \equiv \left(\frac{a_0}{a_1}\right) V_{out(1)}$$

$$\left[(-1)^i a_{(i)} V_{in} - bV_{out} + \left(\frac{a_{i-1}}{a_i}\right) V_{out(i)}\right]\left(\frac{a_i}{a_{i+1} s}\right) \equiv \left(\frac{a_i}{a_{i+1}}\right) V_{out(i+1)} \quad (13\text{-}i)$$

for $i = 1, 2 \ldots, n-2, n-1$ $$bV_{out} - (-1)^n a_{(n)} V_{in} = \left(\frac{a_{n-1}}{a_n}\right) V_{out(n)} \quad (13\text{-}n)$$

Eq. (13-0) can be realized using the OTA-C structure with the switch $S_{(0)}$ closed, in which we use three single-ended-input OTAs with the three different transconductances, $a(=a_{(0)})$, $b$, and $a_0/a_1$, and one grounded capacitor with unity capacitance. Since $a_{(0)} V_{in}$ is the output current of the OTA with the transconductances a, $a_{(0)} V_{in} \neq 0$ or $a_{(0)} V_{in} = 0$ can be controlled by the switch $S_{(0)}$.

The OTA-C implementation of both Eqs. (13-0) and (13-1) is able to be operated when both switches $S_{(0)}$ and $S_{(1)}$ are closed and both $a_{(0)}$ and $a_{(1)}$ are equal to a. Then $-a_{(1)} V_{in} \neq 0$ or $-a_{(1)} V_{in} = 0$ can be controlled by the second switch $S_{(1)}$.

Implementing Eqs. (13-0) to (13-n) yields the n-th order OTA-C universal filter structure and is shown in FIG. 5. Then $a_{(i)} V_{in} \neq 0$ or $a_{(i)} V_{in} = 0$ can be controlled by the i-th switch $S_{(i)}$, as shown in FIG. 5. All of the n+2 active elements are single-ended-input OTAs and all of the n capacitors are grounded, and are of equal value. Equal capacitance design overcomes the difficulty of accurately tuning the capacitances in IC fabrication.

Then, the five different generic filtering functions can be obtained from the universal filter structure shown in FIG. 5 by the following specifications.

(i) Low-pass: Close $S_{(0)}$, but open all other $S_{(i)}$.
(ii) Band-pass: Close $S_{(n)}$ when n is even or close $S_{(n\pm1)/2}$ when n is odd, but open all other $S_{(i)}$.
(iii) High-pass: Close $S_{(n)}$ but open all other $S_{(i)}$.
(iv) Notch: Close both $S_{(0)}$ and $S_{(n)}$ but open all other $S_{(i)}$.
(v) All-pass: Close all of the switches.

The OTA-C universal filter structure shown in FIG. 5 is then digitally programmable. No component matching is used in the analytical synthesis.

The filter structure shown in FIG. 5 with single-ended-input OTAs and grounded capacitors can be easily transformed to a fully differential structure shown in FIG. 6.

Part II: Equal Transconductance Approach
Observing Eq. (12), we let $$[(-1)^0 a_{(0)} V_{in} - bV_{out}] \quad (14\text{-}0)$$

$$\left(\frac{a_0}{a_1 s}\right) = [(-1)^0 a_{(0)} V_{in} - bV_{out}]\left(\frac{1}{(a_1/a_0)s}\right) \equiv (1) V_{out(1)}$$

$$[(-1)^i a_{(i)} V_{in} - bV_{out} + (1) V_{out(i)}]\left(\frac{a_i}{a_{i+1} s}\right) \equiv (1) V_{out(i+1)} \quad (14\text{-}i)$$

for $i = 1, 2 \ldots, n-2, n-1$ $$bV_{out} - (-1)^n a_{(n)} V_{in} = (1) V_{out(n)} \quad (14\text{-}n)$$

Eq. (14-0) can be realized using the OTA-C structure with the switch $S_{(0)}$ is closed, in which we use three single-ended-input OTAs with the three different transconductances, $a(=a_{(0)})$, $b$, and unity, and one grounded capacitor with the capacitance $a_1/a_0$. Since $a_{(0)} V_{in}$ is the output current of the OTA with a transconductance a, $a_{(0)} V_{in} \neq 0$ or $a_{(0)} V_{in} = 0$ can be controlled by the switch $S_{(0)}$.

The OTA-C implementation of both Eqs. (14-0) and (14-1) is able to be operated when both of the switches $S_{(0)}$ and $S_{(1)}$ are closed and both $a_{(0)}$ and $a_{(1)}$ are equal to a. We note that $-a_{(1)} V_{in} \neq 0$ or $-a_{(1)} V_{in} = 0$ can be controlled by the second switch $S_{(1)}$.

Implementing Eqs. (14-0) to (14-n) yields a different n-th order OTA-C universal filter structure, as shown in FIG. 7 with a=b=1. We note that all of the n+2 active elements are single-ended-input OTAs, all of the n capacitors are grounded, and all the transconductance are of equal value. Equal transconductance design leads to a simpler architecture, since only a single sub-circuitry is used in the entire filter structure for varying the bias current.

The filter structure shown in FIG. 7 with single-ended-input OTAs and grounded capacitors can be easily transformed to a fully differential structure shown in FIG. 8.

Note that two multiple +/− output OTAs are used in the filter structures shown in FIGS. 5 and 7. The current mirror and the inverting-type current mirror are applied to produce an in-phase and an out-of-phase output current, respectively, from a multiple output OTA. Since current mirrors constructed by transistors are not ideal, it is quite interesting to know how much in magnitude the difference between two ++, two −−, or two +− output signals is. A five output, having three +'s and two −'s, OTA with the CMOS implementation is used to do this investigation. H-Spice simulations exhibit that the five +++−− output currents have the magnitudes: 100.0005628 µA, 100.0005628 µA, 100.0005628 µA, 100.0005458 µA, and 100.0005458 µA, respectively, when the OTA has a bias current 9.742 µA at 1 MHz. It can be seen that the error of using a current mirror is near null, and the error of applying an inverting-type current mirror is also very small just about 17µ %. In summary, such an error due to duplicate an output current is negligible.

The proposed filter structures (FIGS. 5 to 8) have a high input impedance (which is cascadable with the former voltage-mode stage), although a voltage buffer is needed at the output terminal due to high output impedance.

The analog switch shown in FIGS. 5 to 8 can be realized using the transmission gate. In a conducting transmission gate, since the source-drain voltage swing of the MOS transistors is small, they work in the linear region and can be modeled as an effective resistance $R_{eff}$, which is a function of the input transition time and load capacitance, bounded by two parallel grounded capacitances $C_T$, which include interconnect parasitic capacitances, capacitances from source and drain-to-substrate, and half the channel capacitance of the transistors. The circuit analysis for the non-ideal second-order filter structure derived from FIG. 5 with the replacement of the transmission gate by its equivalent model produces a complicated sixth-order denominator D(s) and fifth-order numerator N(s). The addition of a non-ideal transmission gate increases the parasitic effect. If the precision of the output signals is critical, the analog switch is not necessary. It is also acceptable to replace an open switch with an open circuit and a closed switch with a short circuit for realizing a filter with a single function. However, if the switch were not used in the design, the filter structure could not be called a digitally programmable one.

Now, four different kinds of OTA-C universal filter structures are synthesized which are (i) two double-input OTA and floating/grounded capacitor based ones (FIGS. 1 and 3), (ii) two complementary single-ended-input OTA and floating/grounded capacitor based ones (FIGS. 2 and 4), (iii) two single-ended-input OTA and grounded capacitor based ones (FIGS. 5 and 7), and (iv) two fully differential OTA and floating capacitor based ones (FIGS. 6 and 8). A comparison among the above four distinct universal filter structures and two recently reported OTA-C universal biquad filters is made in the next section IV. Performance Comparisons The second-order OTA-C universal filters derived from FIGS. 1, 2, 5 and 6 use two differential-input OTAs and two floating/grounded capacitors, four complementary single-ended-input OTAs and two floating/grounded capacitors, four single-ended-input OTAs and two grounded capacitors, and four fully differential-input OTAs and two floating capacitors, respectively.

The TSMC035 level-49 H-Spice simulation, provided by a Taiwanese company, Taiwan Semiconductor Manufacturing Co. Ltd., is used for finding this solution using the CMOS implementation of the OTA with supply voltages $V_{DD}=1.65V$, $V_{SS}=-1.65V$, and W/L=5μ/0.35μ and 10μ/0.35μ for NMOS and PMOS transistors, respectively. Element values are given by $g_a=g_b=100$ μS, $g_1=222.144$ μS, $g_2=444.288$ μS, and $C_1=50$ pF, $C_2=50$ pF for the biquads derived from FIGS. 1, 2, 5 and 6, with the resonant frequency, 1 MHz. All the transconductances are given by 314.159 μS, and $C_1=50$ pF, $C_2=50$ pF for the two prior art universal biquads. The amplitude or phase-frequency responses of the above six universal biquads are shown in FIGS. 9 to 15. The simulated 3 dB or center frequencies and percentage errors are shown in Table I (the resonant frequencies and errors of five generic filtering signals for six different biquads).

TABLE I

| | Filter | | | | |
|---|---|---|---|---|---|
| Biquad | $f_{3dB}$(LP) error % | $f_{3dB}$(HP) error % | $f_c$(BP) error % | $f_c$(BR) error % | $f_c$(AP) error % |
| FIG. 1 | 575.3k | 344.6k | 714.5k | 474.2k | 151.5k |
| | 42.47% | 65.54% | 28.55% | 52.58% | 84.85% |
| FIG. 2 | 1003.0k | 998.4k | 1002.3k | 1000.0k | 996.6k |
| | 0.30% | 0.16% | 0.23% | 0.00% | 0.34% |
| FIG. 5 | 1005.0k | 997.2k | 929.0k | 1000.0k | 970.5k |
| | 0.50% | 0.28% | 7.10% | 0.00% | 2.95% |
| FIG. 6 | 821.6k | 825.3k | 891.3k | 1000.0k | 988.5k |
| | 22.53% | 17.48% | 10.87% | 0.005 | 1.15% |

As can be seen, except the universal biquad derived from FIG. 2, the one derived from FIG. 5 with all single-ended-input OTAs and all grounded capacitors is much more precise than the other four ones, all of which are with some differential-input OTAs and some single-ended-input OTAs. The reason is that filters that employ only single-ended-input OTAs overcome the feed-through effects due to finite input parasitic capacitances associated with differential-input OTAs. However, it should be noticed that although the differential-input OTA based universal biquad derived from FIG. 1 has a large amount of errors, when the differential-input OTA is replaced by two parallel and complementary single-ended-input OTAs, one of which has for its input signal at the + terminal and the other one of which has its input signal entering from the − terminal, leading to a perfect cancellation of their corruptions to output signals. Therefore, as can be seen, the output precision of the universal biquad derived from FIG. 2 is much better than that of the ones with some differential-input OTAs and even a little bit better than the one derived from FIG. 5 with all single-ended-input OTAs and all grounded capacitors.

Figure 16:
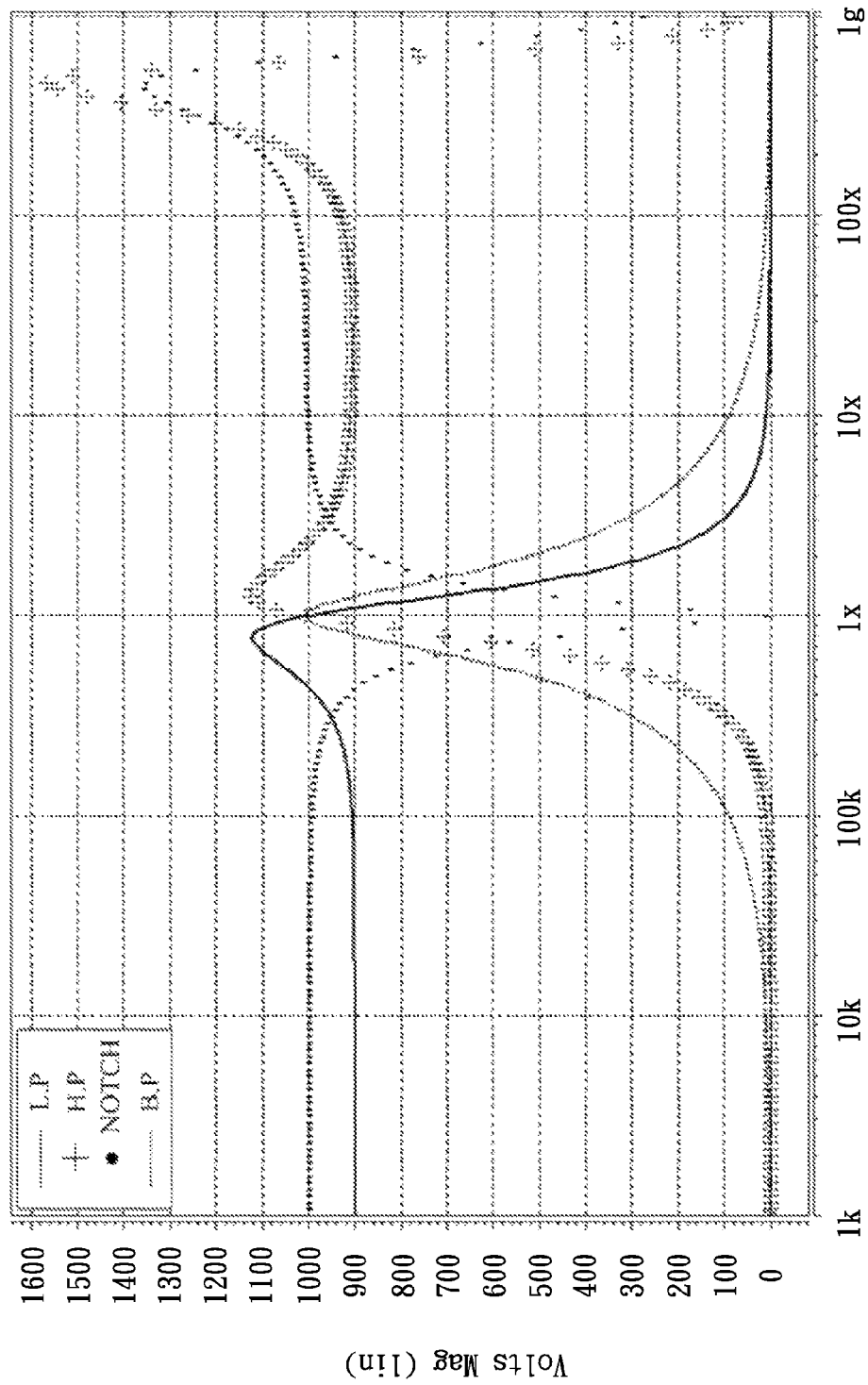
FIG. 16 shows LP, BP, HP, and NH amplitude-frequency responses of the universal biquad with all single-ended-input OTAs transformed from FIG. 13.
Figure 17:
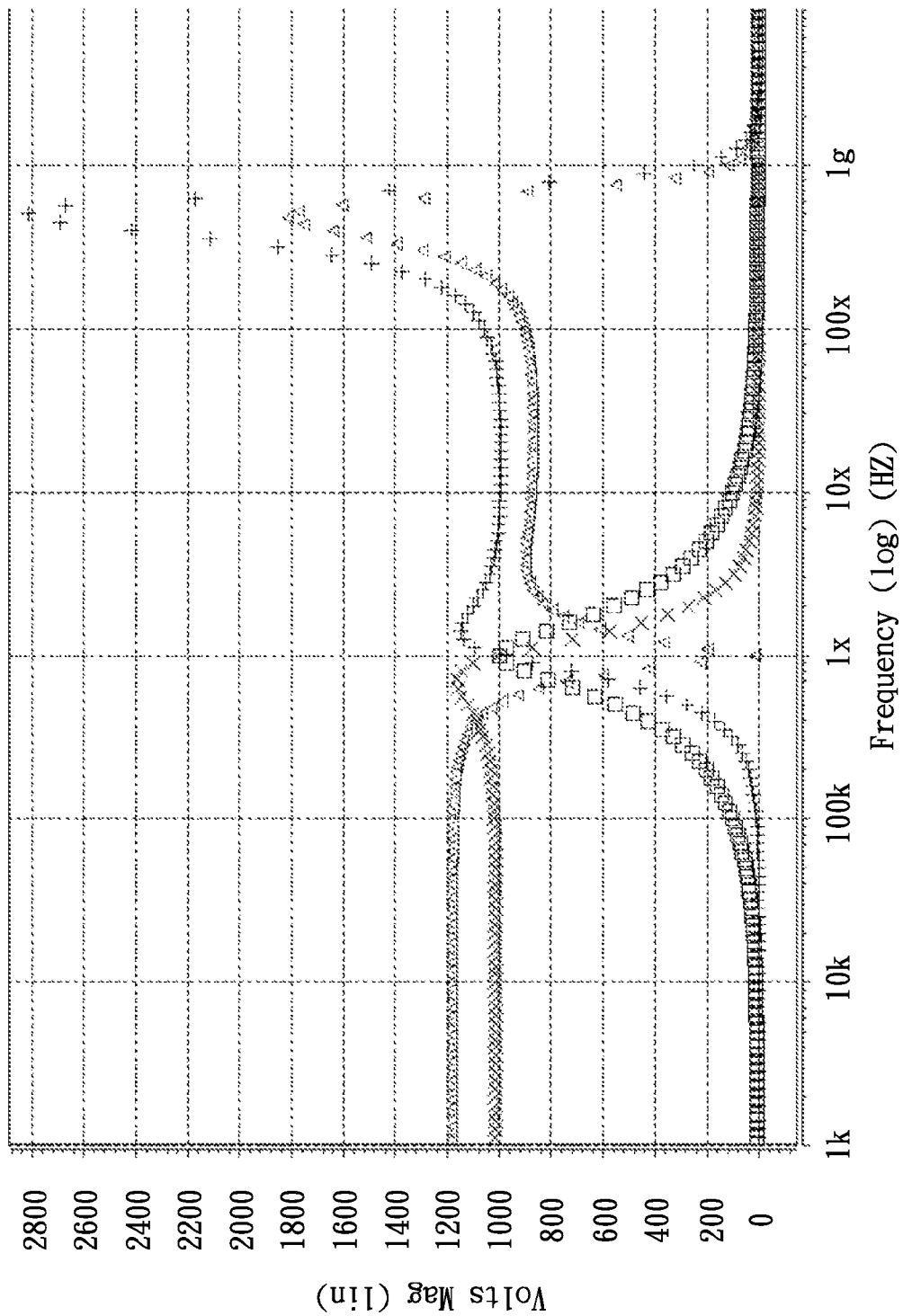
FIG. 17 shows LP, BP, HP, and NH amplitude-frequency responses of the universal biquad with all single-ended-input OTAs transformed from FIG. 14.
Figure 18:
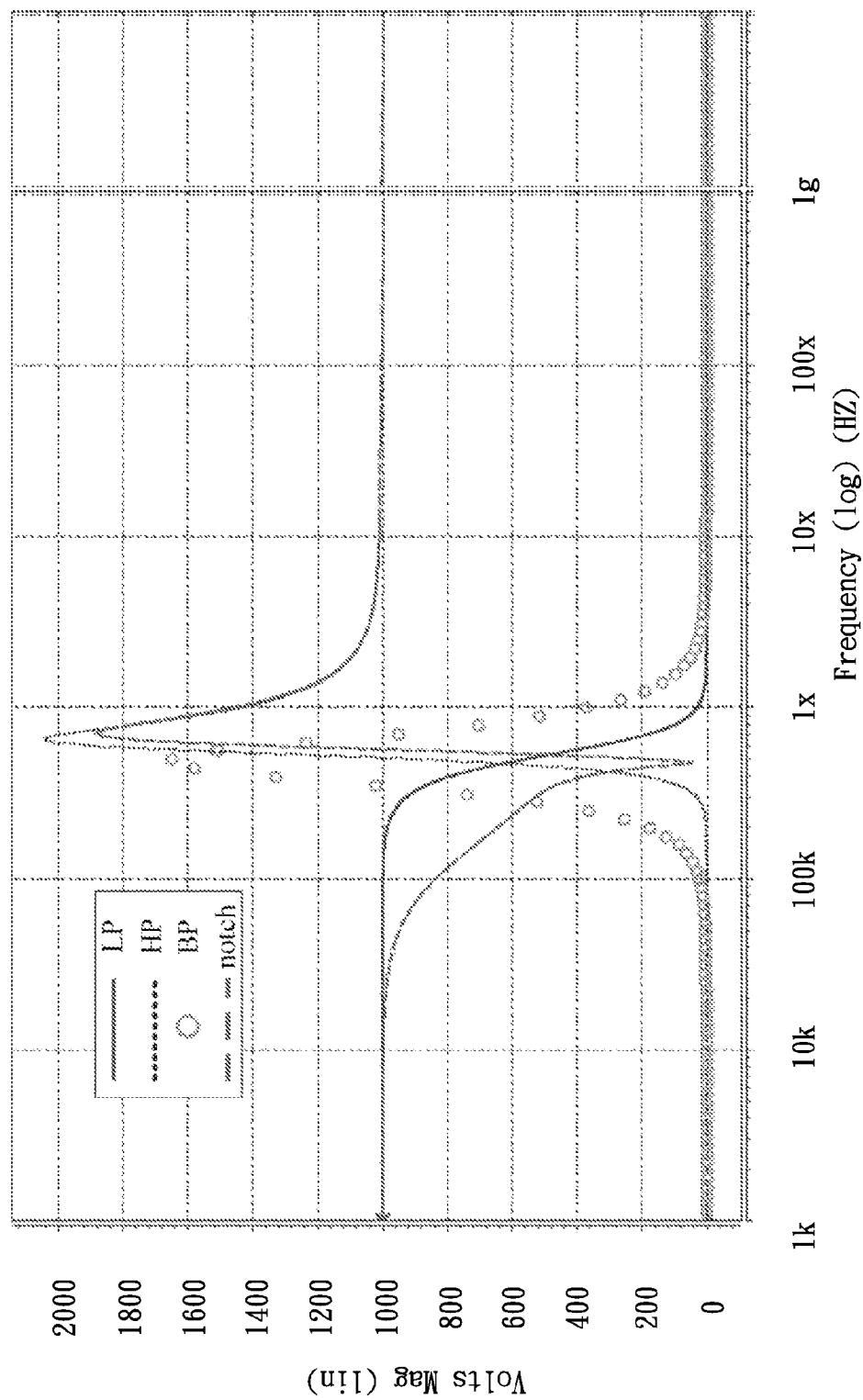
FIG. 18 shows LP, HP, BP, and NH amplitude responses of the sixth-order universal filter derived from FIG. 1.
Figure 19:
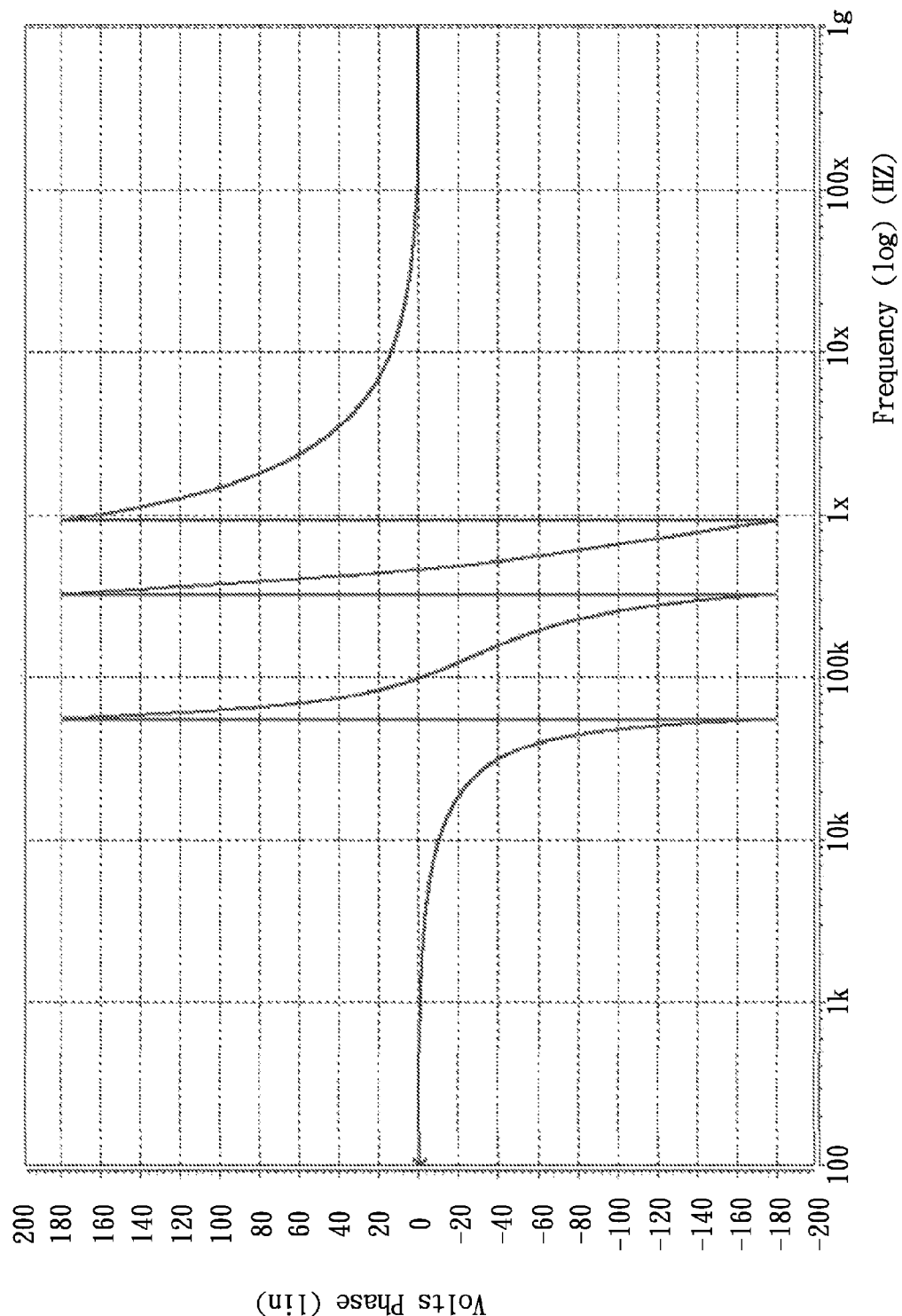
FIG. 19 shows AP phase-frequency responses of the sixth-order universal filter derived from FIG. 1.
Figure 20:
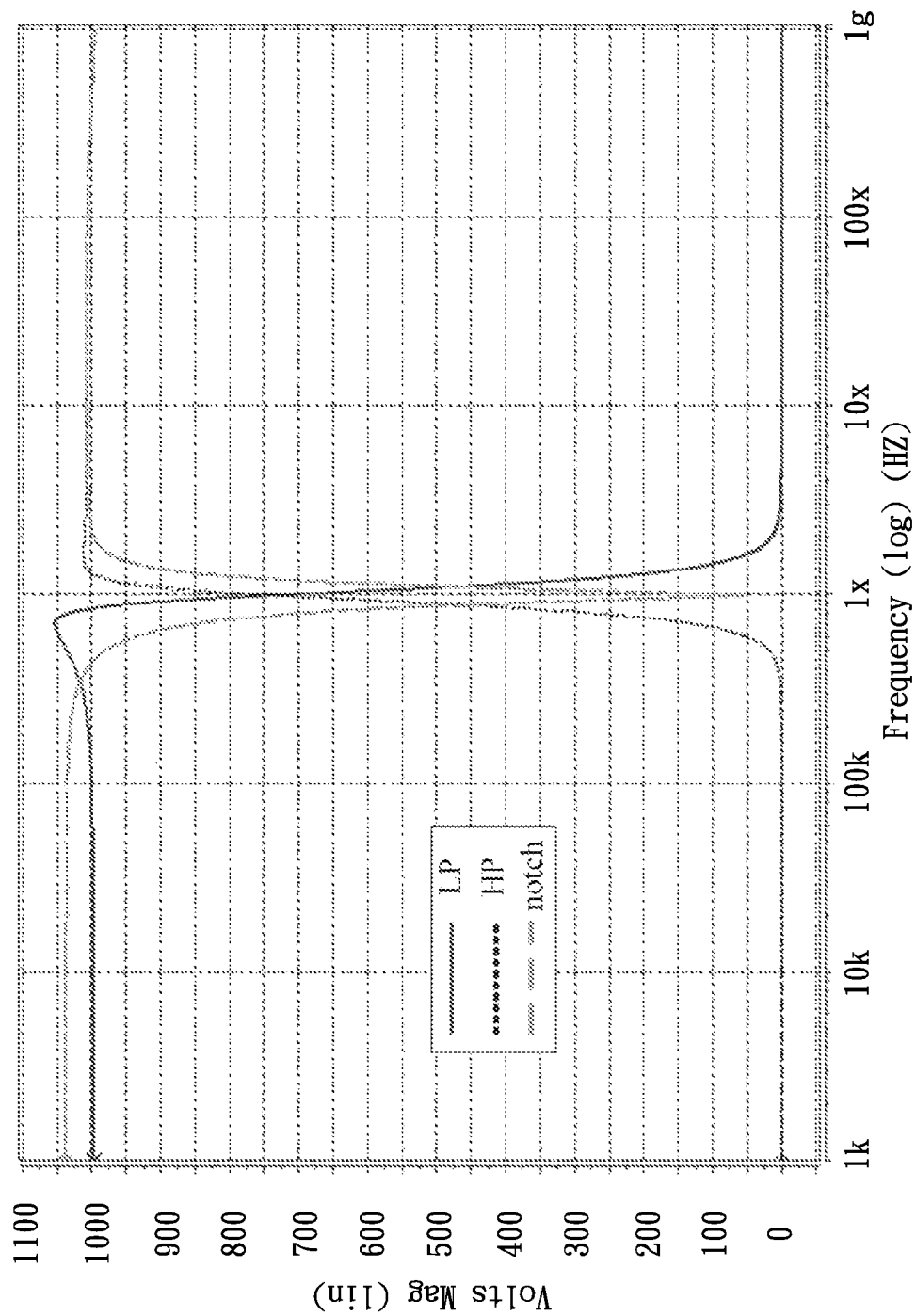
FIG. 20 shows LP, HP, and NH amplitude-frequency responses of the sixth-order universal filter derived from FIG. 2.
Figure 21:
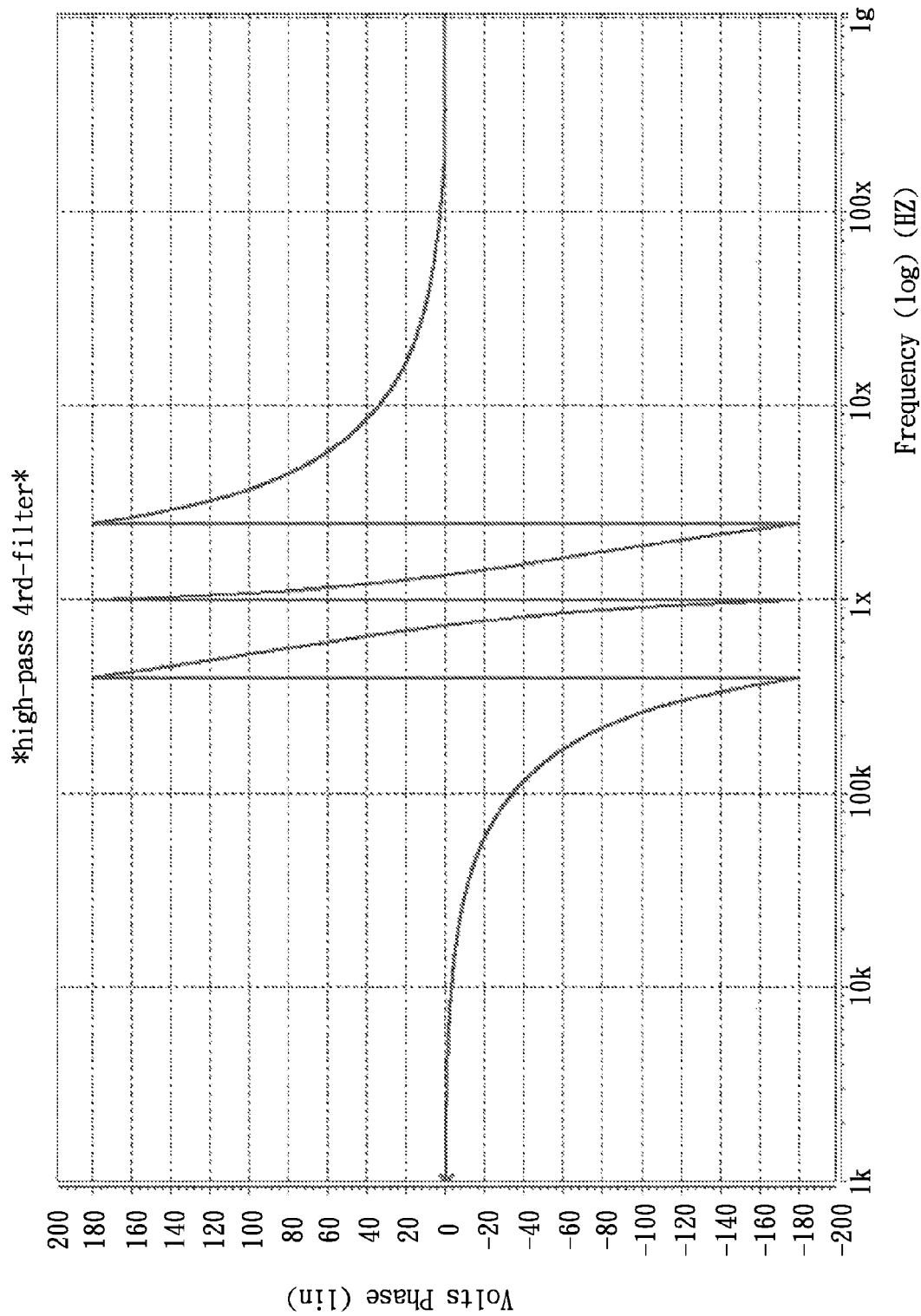
FIG. 21 shows AP phase-frequency responses of the sixth-order universal filter derived from FIG. 2.
Figure 22:
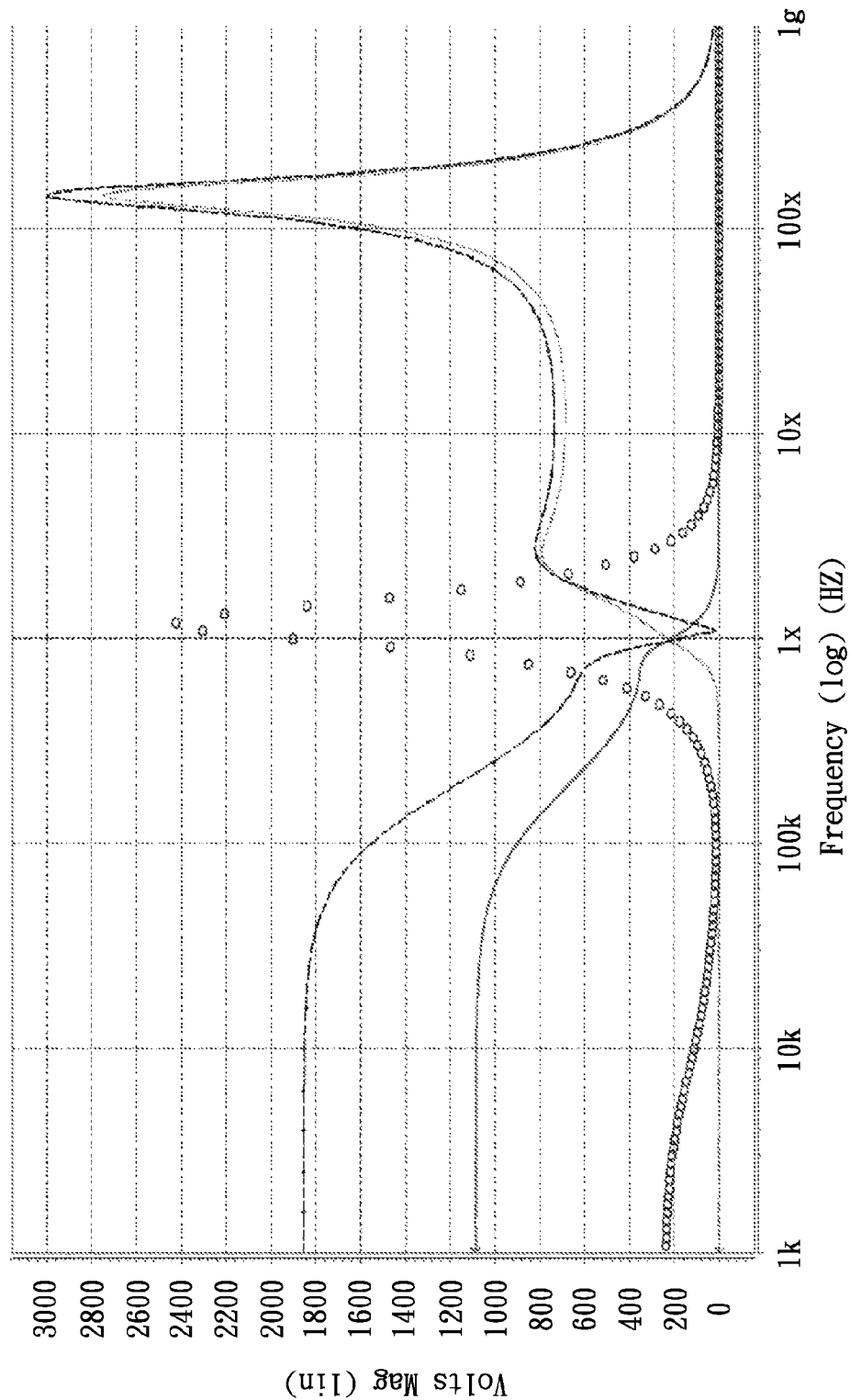
FIG. 22 shows LP, HP, BP, and NH amplitude responses of the sixth-order universal filter derived from FIG. 5.
Figure 23:
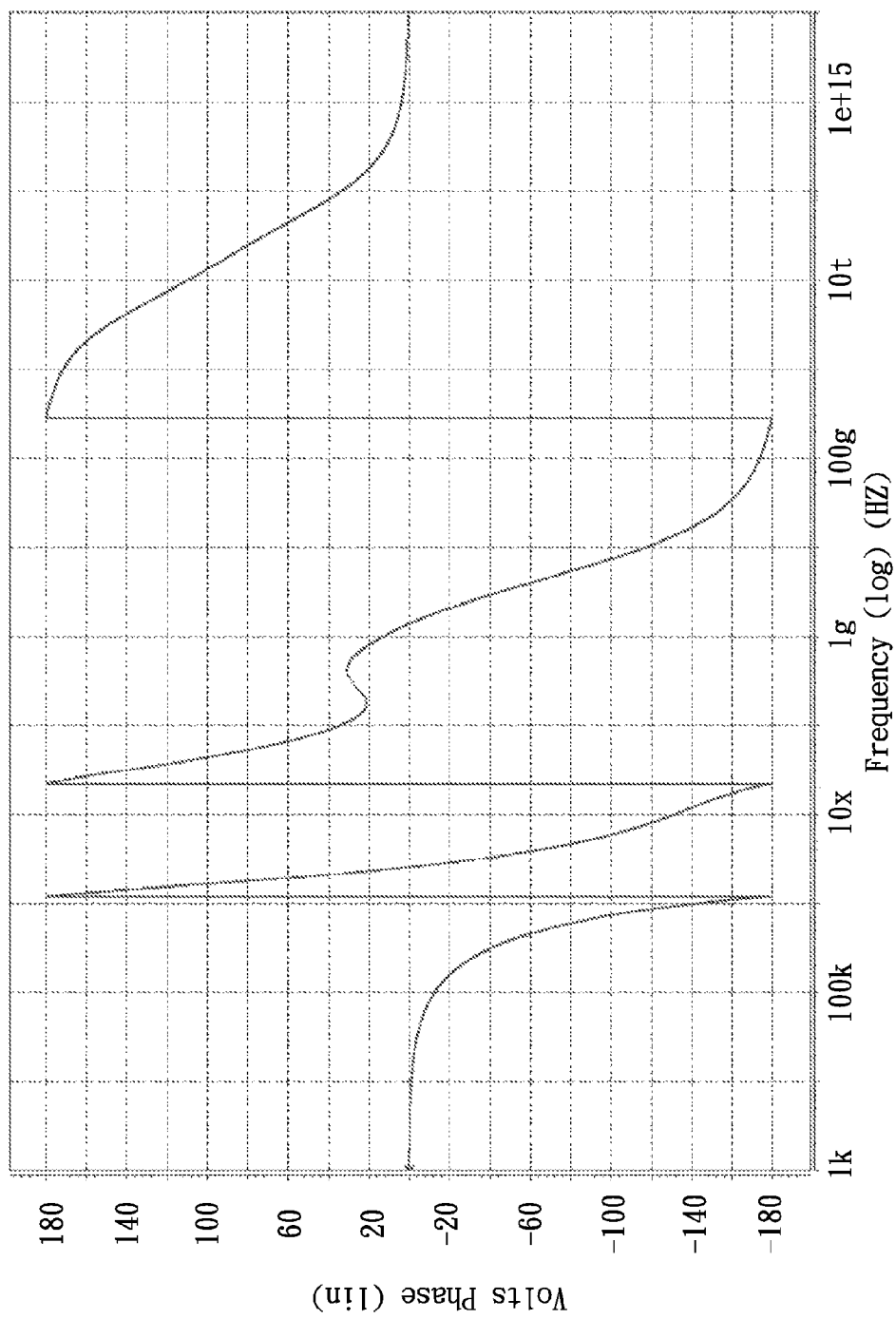
FIG. 23 shows AP phase-frequency responses of the sixth-order universal filter derived from FIG. 5.
Figure 24:
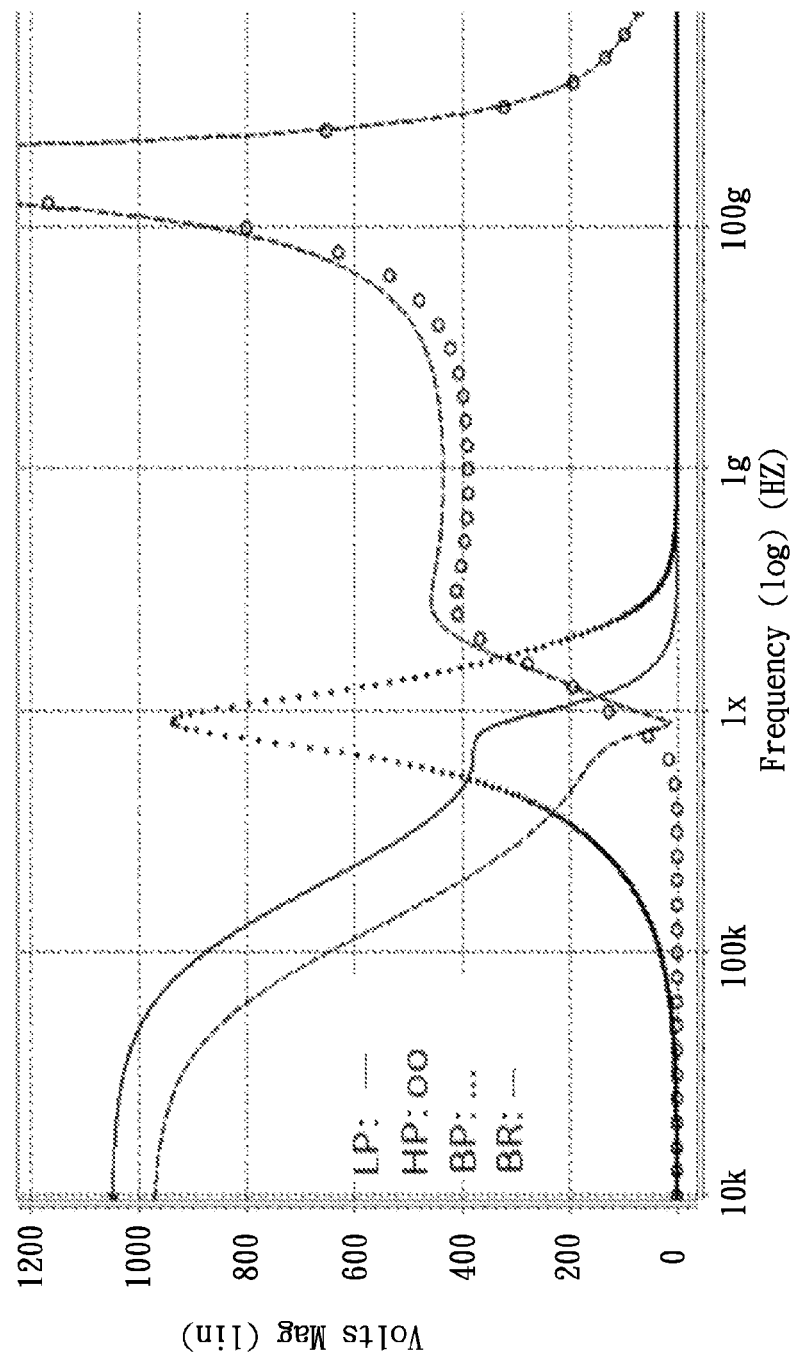
FIG. 24 shows LP, HP, BP, and NH amplitude responses of the sixth-order universal filter derived from FIG. 6.
Figure 25:
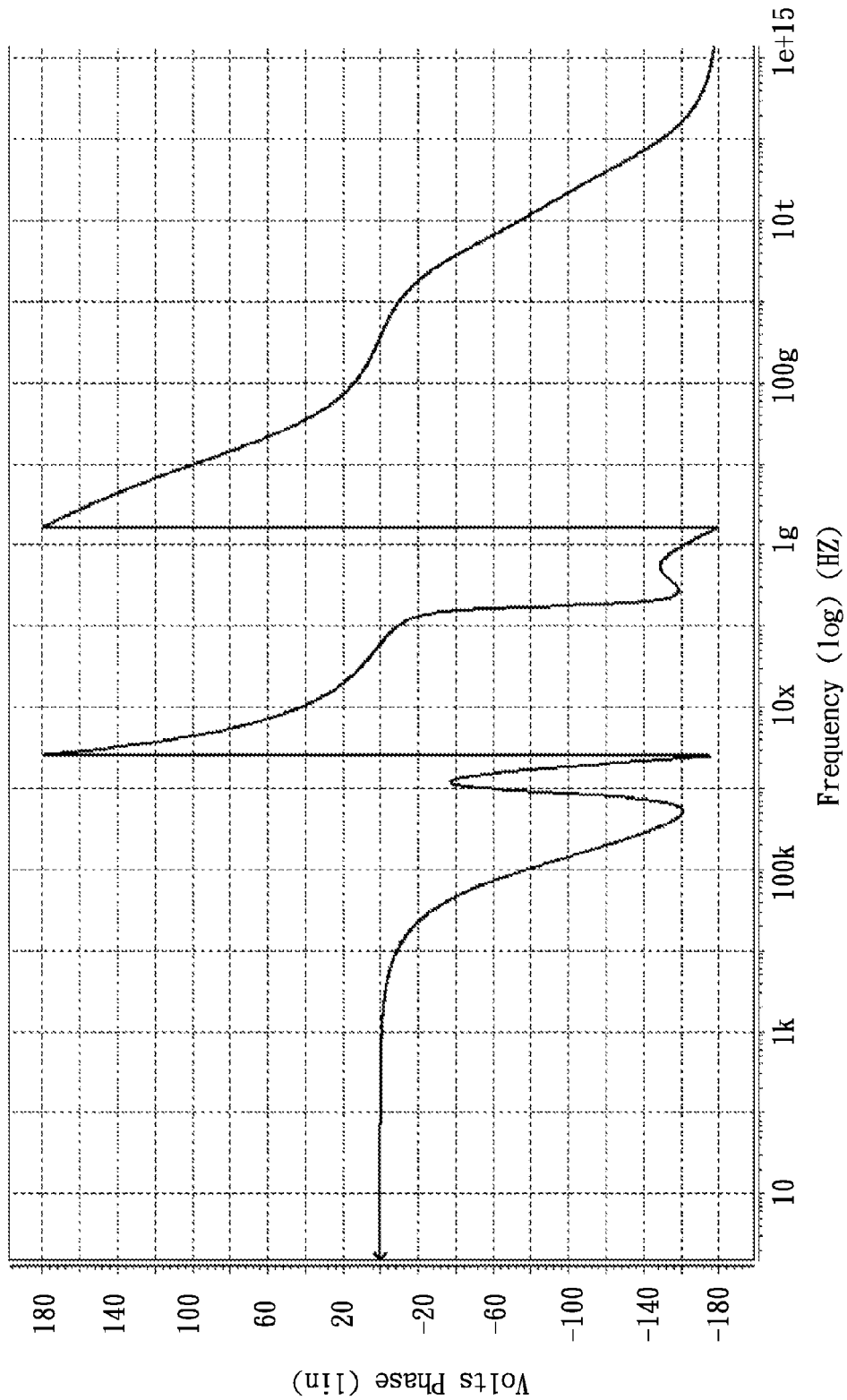
FIG. 25 shows AP phase-frequency responses of the sixth-order universal filter derived from FIG. 6.
Figure 26:
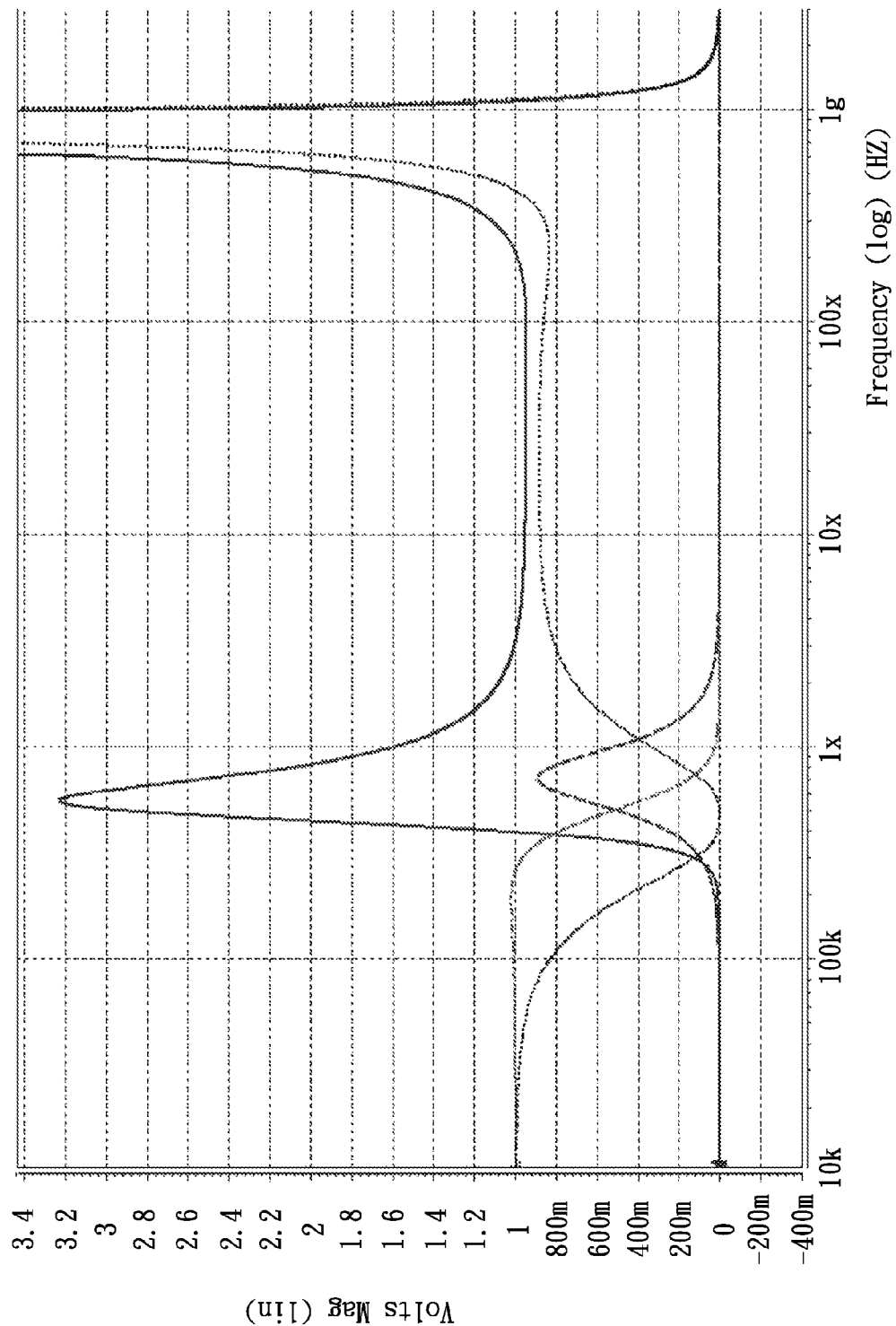
FIG. 26 shows LP, HP, BP, and NH amplitude responses of the 3-biquad-stage universal filter derived from FIG. 1.
Figure 27:
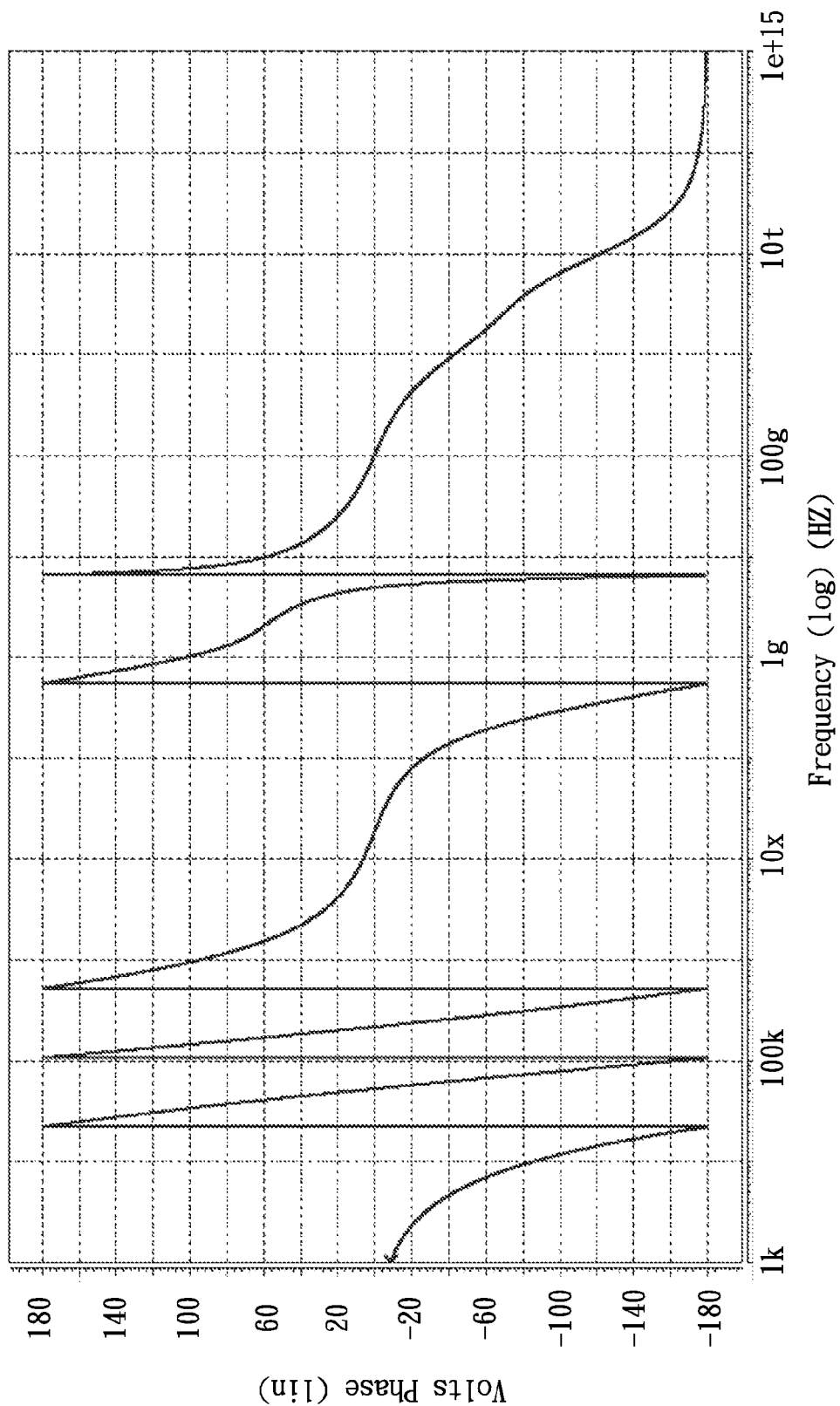
FIG. 27 shows AP phase-frequency responses of the 3-biquad-stage universal filter derived from FIG. 1.
Figure 28:
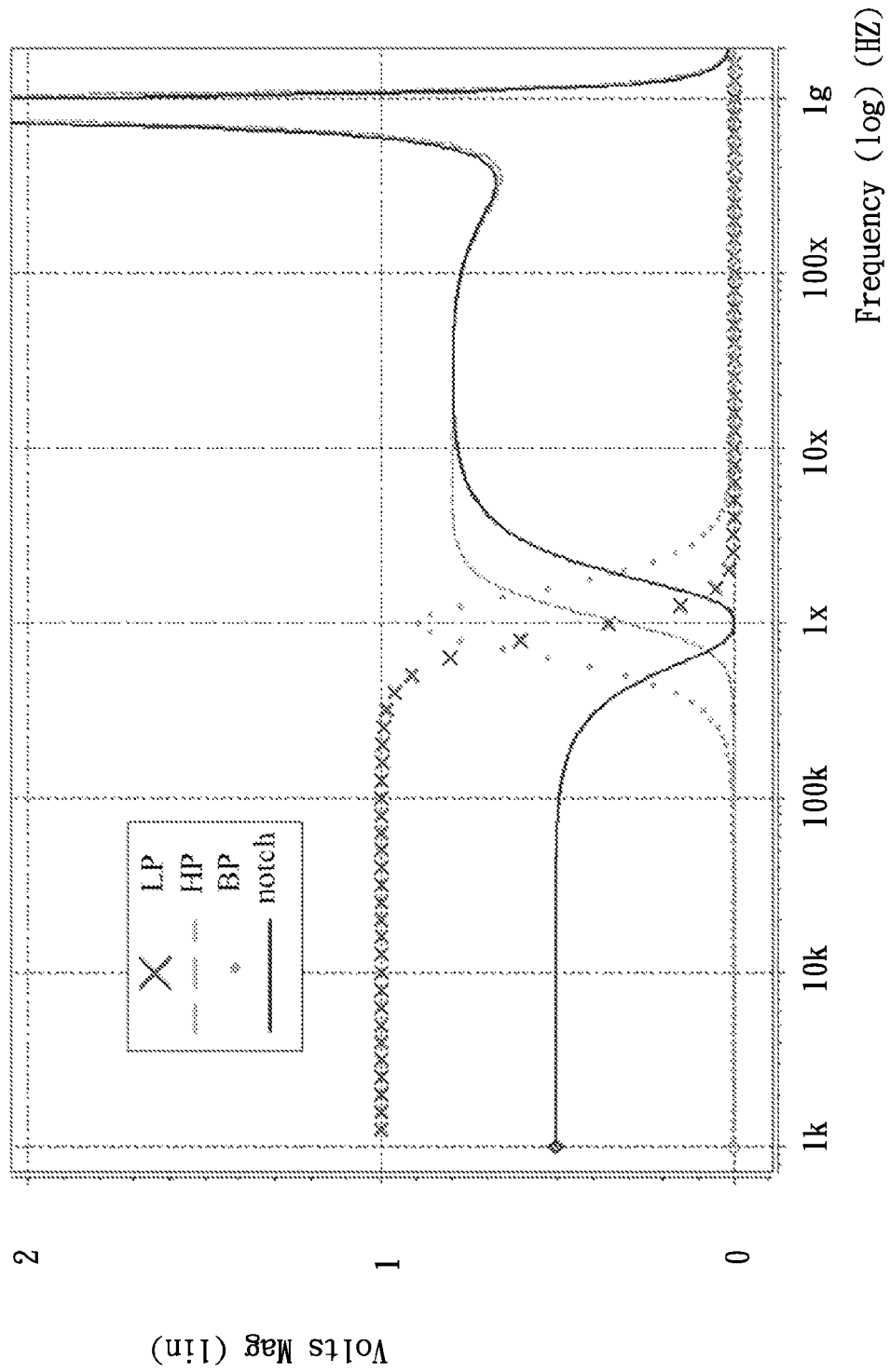
FIG. 28 shows LP, HP, BP, and NH amplitude responses of the 3-biquad-stage universal filter derived from FIG. 2.
Figure 29:
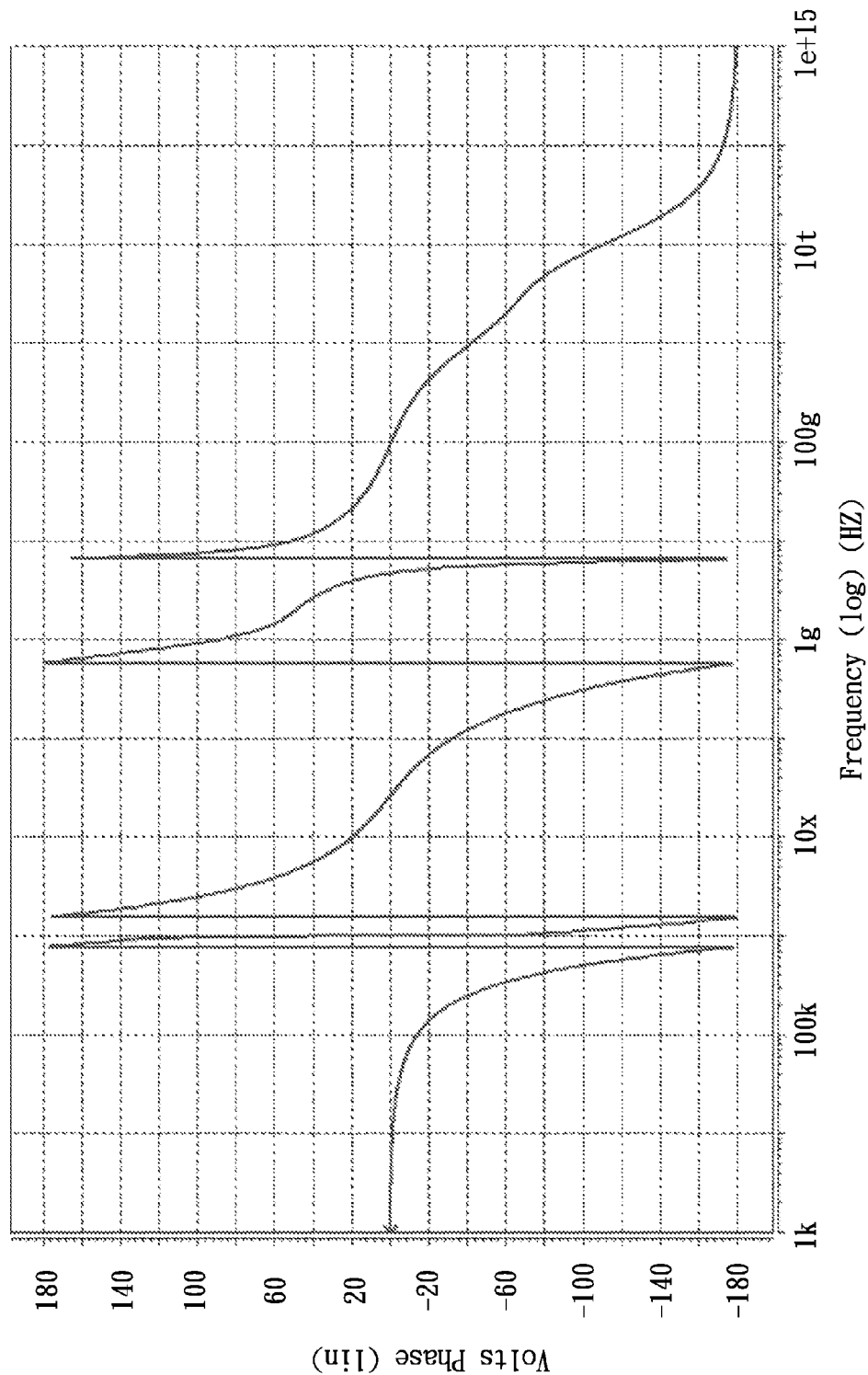
FIG. 29 shows AP phase-frequency responses of the 3-biquad-stage universal filter derived from FIG. 2.
Figure 30:
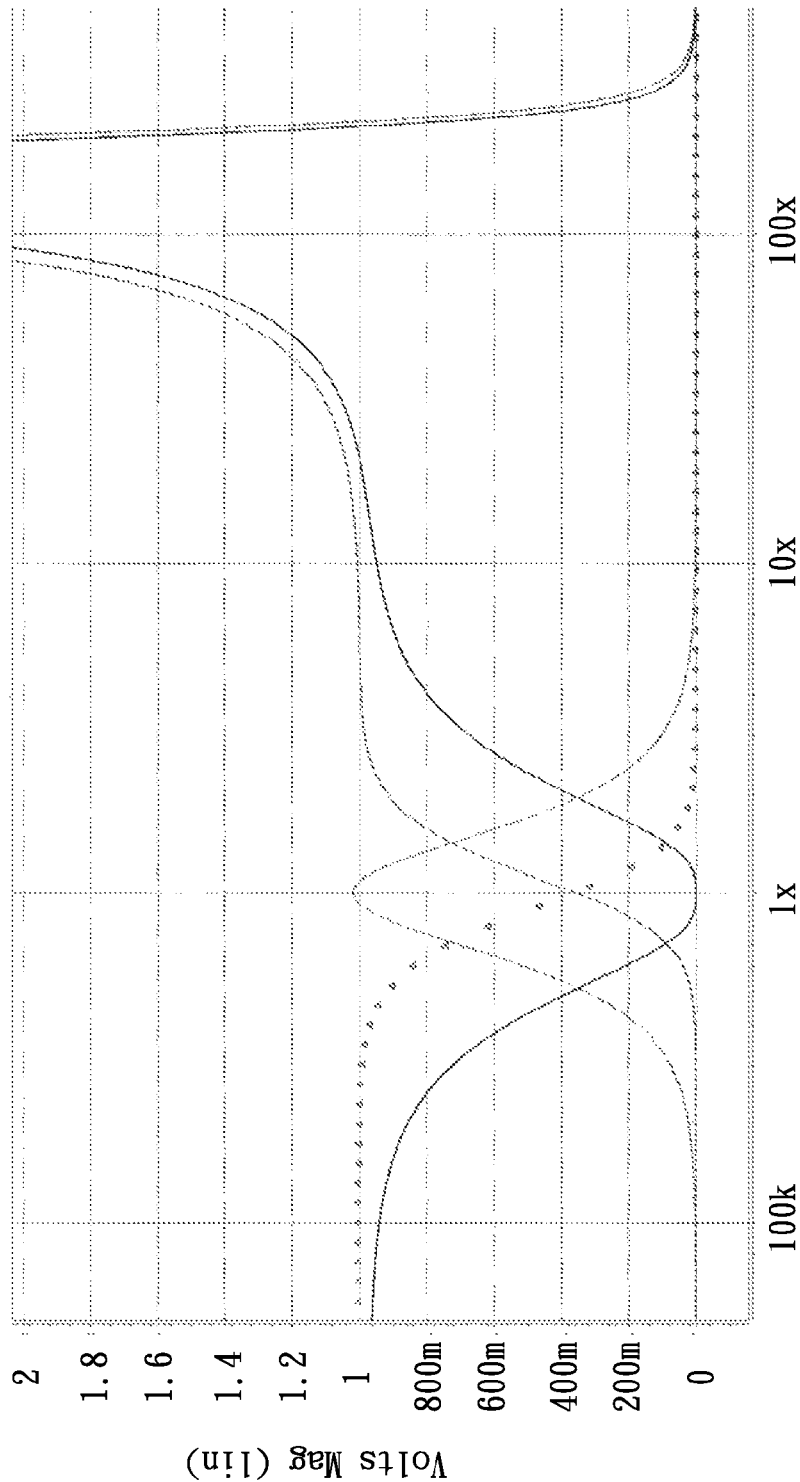
FIG. 30 shows LP, HP, and NH amplitude-frequency responses of the 3-biquad-stage universal filter derived from FIG. 5.
Figure 31:
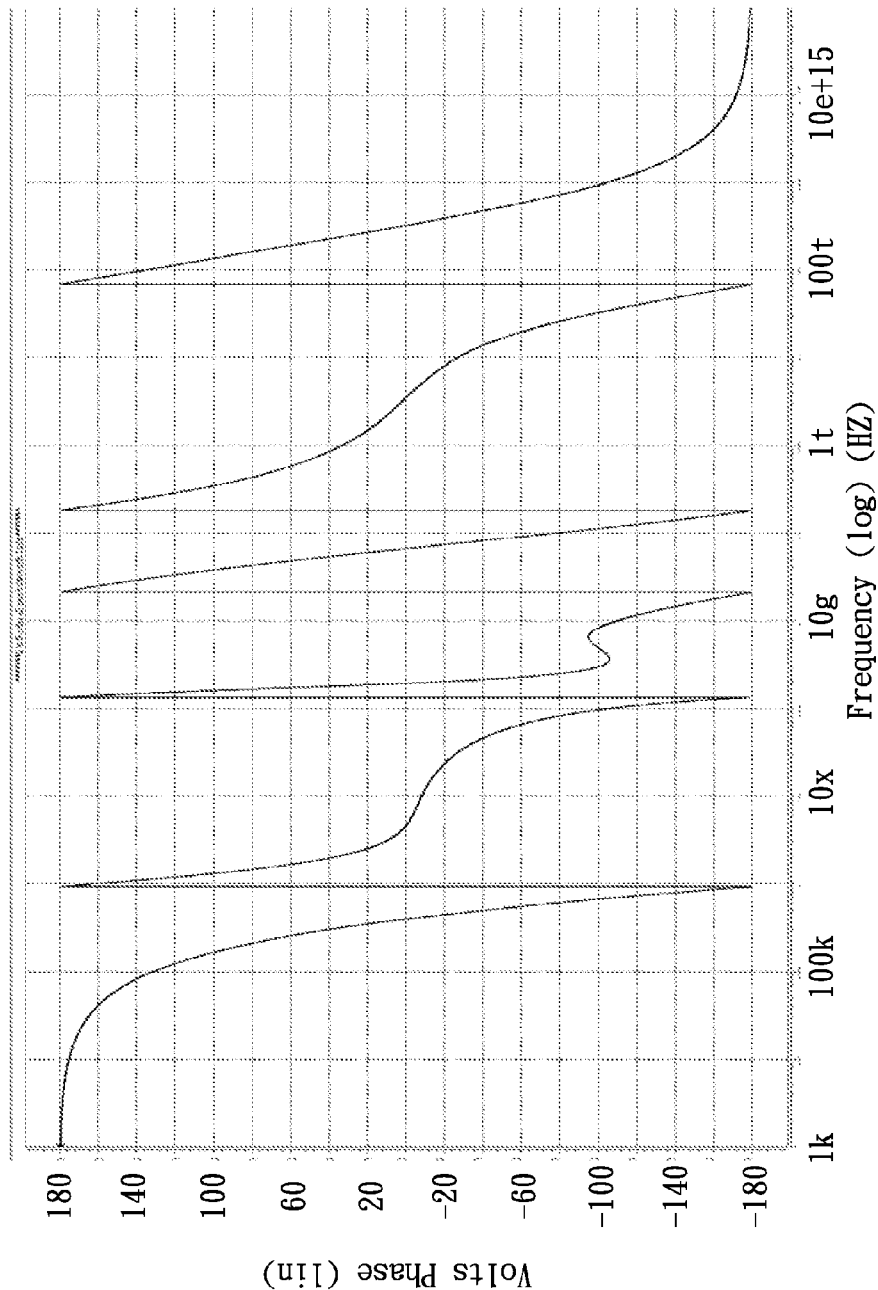
FIG. 31 shows AP phase-frequency responses of the 3-biquad-stage universal filter derived from FIG. 5.
Figure 32:
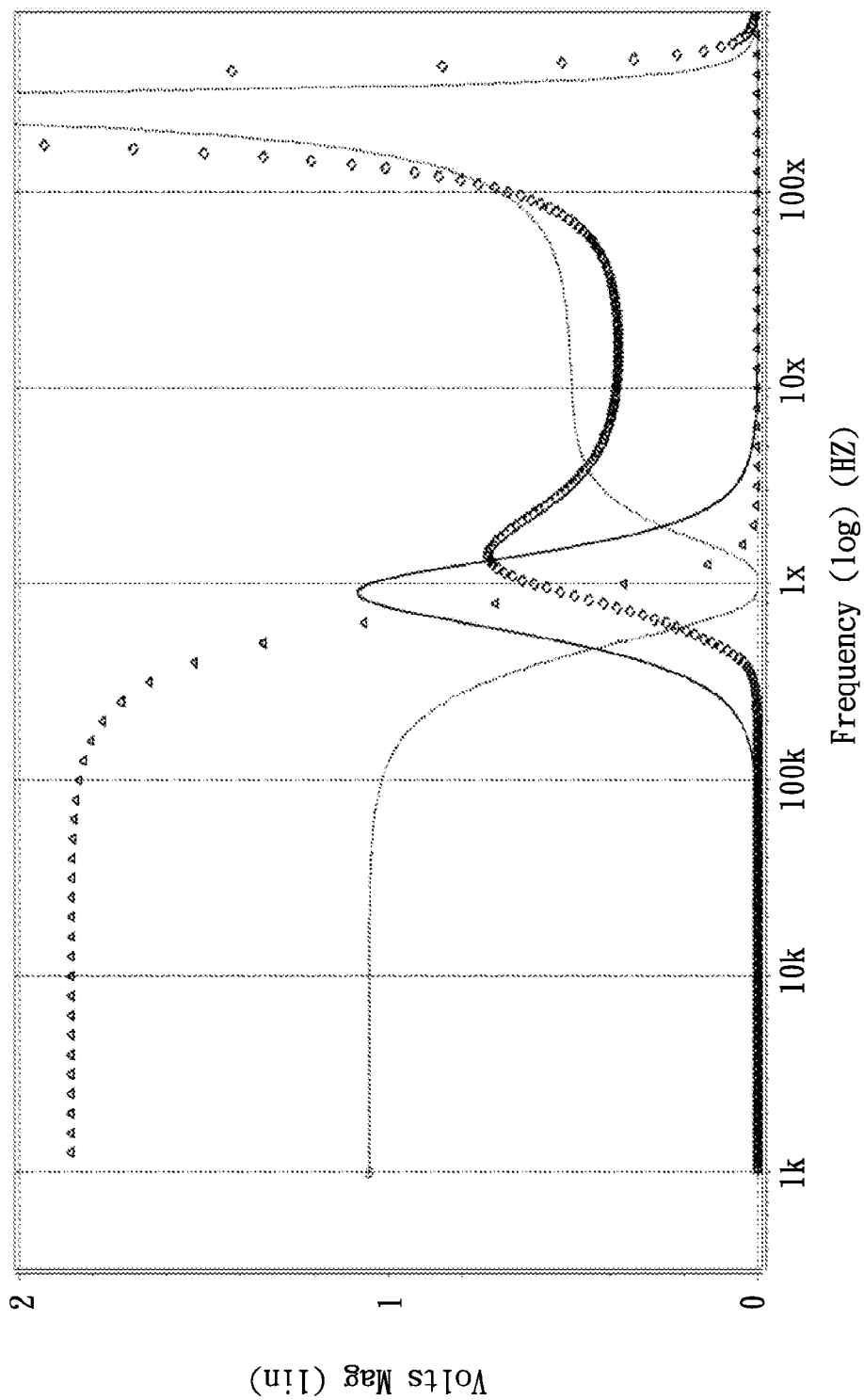
FIG. 32 shows LP, HP, BP, and NH amplitude responses of the 3-biquad-stage universal filter derived from FIG. 6.
Figure 33:
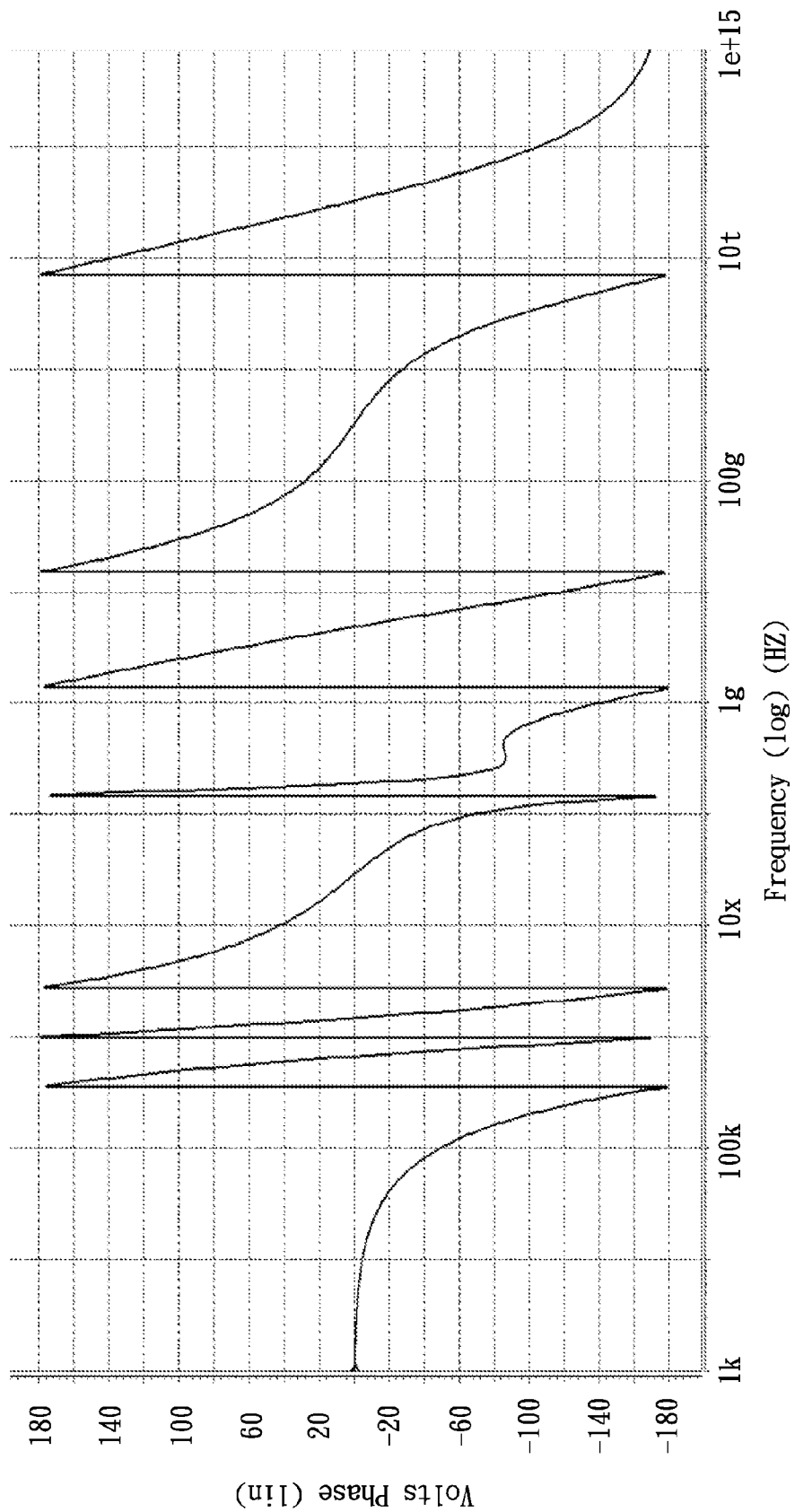
FIG. 33 shows AP phase-frequency responses of the 3-biquad-stage universal filter derived from FIG. 6.

Another question that may be asked is: If the differential-input OTA shown in the prior art is replaced by a couple of complementary single-ended-input OTAs, is the output precision improved further as in the case of the one shown in FIG. 2(b) transformed from FIG. 2(a)? The answer is in the positive. The output responses of the filters obtained by replacing the differential OTAs by single-ended-input OTAs in prior art and responses, are shown in FIG. 16, and FIG. 17, respectively, these have the output errors improved from 37.33% to 32.64% for LP, from 42.46% to 0.69% for BP, from 45.83% to 25.05% for HP, from 42.46% to 0% for BR, and from 41.78% to 0.346% for AP, and improved from 33.63% to 26.25% for LP, from 25.87% to 0.46% for BP, from 46.67% to 20.78% for HP, from 0.23% to 0.23% for BR, and from 59.74% to 1.17% for AP, respectively. These results indicate that: "the replacement of a differential-input OTA with a couple of complementary single-ended-input OTAs is very effective for the output precision of an OTA-C filter structure."

For further reconfirmation, four sixth-order universal filter structures derived from FIGS. 1, 2, 5, and 6 are used to compare their performances. Component values are given by $g_1=16.262$ μS, $g_2=32.524$ μS, $g_{3=51.302}$ μS, $g_{4=76.953}$ μS, $g_5=121.382$ μS, $g_6=242.7640$ μS, and $C_1=C_2=10$ pF for the ones derived from FIGS. 1 and 2 and $g_1=g_2=100$ μS, $g_{3=8.418}$ μS, $g_4=121.382$ μS, $g_5=26.556$ μS, $g_{6=76.953}$ μS, $g_7=121.382$ μS, $g_8=242.764$ μS, and $C_1=C_2=10$ pF for the ones derived from FIGS. 5 and 6. In addition to these, a sixth-order filter structure can also be realized by using three second-order biquad filter in cascade. The above four sixth-order filter structures have their own corresponding three-biquad-stage structures. Then, which one in the above total eight different kinds of sixth-order filter structures has the best output precision? Their amplitude/phase responses are shown in FIGS. 18 to 33 errors are shown in Table II (the resonant frequencies and errors of five generic filtering signals for eight distinct $6^{th}$-order filters).

TABLE II

| | Filter | | | | |
|---|---|---|---|---|---|
| Biquad | $f_{3dB}$(LP) error % | $f_{3dB}$(HP) error % | $f_c$(BP) error % | $f_c$(BR) error % | $f_c$(AP) error % |
| FIG. 1 | 441.8k | 484.8k | 490.9k | 481.9k | 330.0k |
| | 55.82% | 51.52% | 50.91% | 51.81% | 67.00% |
| FIG. 1 3-biquad | 748k | 380.6k | 714.5k | 474.2k | 108.8k |
| | 25.16% | 61.94% | 28.55% | 52.58% | 89.12% |
| FIG. 2 ***** | 1013.5k | 985.3k | 988.6k | 997.7k | 996.5k |
| | 1.35% | 1.47% | 1.14% | 0.23% | 0.35% |
| FIG. 2 3-biquad | 717.0k | 1784k | 1000k | 1000k | 1567k |
| | 28.30% | 78.40% | 0.00% | 0.00% | 56.7% |
| FIG. 5 | 150.8k | 1477.8k | 1180.3k | 1096.5k | 22647k |
| | 84.92% | 47.78% | 18.03% | 9.65% | 2164% |
| FIG. 5 3-biquad | 719.8k | 1389k | 1004.6k | 10000k | 4603k |
| | 28.02% | 38.92% | 0.46% | 0.00% | 360% |
| FIG. 6 | 153.9k | 1635k | 905.7k | 889.2k | 2599.8k |
| | 84.61% | 63.56% | 9.43% | 11.08% | 156.0% |
| FIG. 6 3-biquad | 524.6k | 649.1k | 621.2k | 312.3k | 359.0k |
| | 47.54% | 35.09% | 37.88% | 68.77% | 63.68% |

From these Figures and Table II, the following can be observed. (i) The output precision of the one derived from FIG. 2 with complementary single-ended-input OTAs is still in the range of an 1.5% error, and is far more accurate than any of the other types, including even the single-ended-input OTA-based ones shown in FIGS. 22-23, and 30-31. See Table II; Therefore, an important conclusion is (i) that if a differential-input OTA is replaced by two parallel and complementary single-ended-input OTAs from a structure which is composed of only differential-input OTAs and capacitors, the transformed circuit structure enjoys the most precise output signals, even better than the ones with all single-ended-input OTAs and all grounded capacitors. (ii) It can not be concluded that the direct sixth-order universal filter structure is better in output precision than its counterpart of the three-biquad-stage sixth-order universal filter structure or vice versa. (iii) Only the three-biquad-stage universal filter structure derived from FIG. 5 with single-ended-input OTAs has its output precision better than its counterpart of the direct sixth-order one. (iv) Although the output precision of the direct band-pass and band-reject sixth-order universal filters derived from FIG. 2 is lower than 1.15% error, the lowest error is obtained from the ones with three biquad stages derived from FIGS. 2 and 5. (v) The non-ideal effect, i.e., $I_o/(V_+ - V_-) = G(s) = G_o/(1+s/\omega_o)$ for an OTA, is apparent for all the four three-biquad-stage all-pass phase-frequency responses shown in FIGS. 27, 29, 31, and 33. For example, the numerator of the transfer function of the two-biquad-stage all-pass filter structure derived from FIG. 5 can be analyzed and obtained as $$N(s) = [(b_2 b_2)s^4 - (2b_1 b_2)s^3 + (2b_2 b_0 + b_1 b_1)s^2 - (2b_1 b_0)s + b_0 b_0] + [(a_2 b_2 + a_3 b_3 - 2a_4 b_1)s^5 + 2(a_4 b_0 - a_3 b_1 - a_2 b_2)s^4 + 2(a_3 b_0 + a_2 b_1)s^3 - (2a_2 b_0)s^2] + [(a_4 a_4)s^8 + (2a_4 a_3)s^7 + (2a_4 b_2 + a_3 a_3 - 2a_4 a_2)s^6 + (-2a_3 a_2)s^5 + (a_2 a_2)s^4] = A(s) + B(s) + C(s) \quad (15)$$

Where $$b_2 = C_1 C_2 G_{b0},$$
$$b_1 = C_2 G_{10} G_{b0},$$
$$b_0 = G_{10} G_{20} G_{b0},$$
$$a_4 = (C_1 C_2 G_{b0} / \omega_{10} \omega_{20}),$$
$$a_3 = [C_1 C_2 G_{b0}(\omega_{10} + \omega_{20})/(\omega_{10} \omega_{20})],$$

and $$a_2 = (C_2 G_{10} G_{b0} / \omega_{20}).$$

As we operate the filter at a frequency lower than the 3 dB frequency of the transconductance function G(s) of an OTA, i.e., $\omega_{10}$ and $\omega_{20}$ are very large, the term A(s) of N(s) is the most dominant one, B(s) is the main non-ideal part, and the term C(s) is minor and negligible. Consider the various terms in B(s): (i) $(a_2 b_2 + a_3 b_3 - 2a_4 b_1)$ is positive since $a_4 \ll a_3, a_2$ and (ii) $(a_4 b_0 - a_3 b_1 - a_2 b_2)$ is negative for the same reason. It is evident that the sign sequence of the coefficients of the polynomial B(s) are +, −, +, and −, confirms that the all-pass phase-frequency response due to the other terms in addition to the main phase response resulting from dominant term A(s) is very minor. Thus, the additional phase-frequency responses shown in FIGS. 27, 29, 31, and 33 agree with the theory.

From Equation (15), the analytical synthesis methods do not consider the cases of parasitic elements and mismatches in the design. It may be a more interesting research work to investigate how to involve the parasitic elements and mismatches in the analytical synthesis method through a transfer function with parasitics and mismatches.

In addition to the output precision, nonlinearly, noise, and dynamic range of an OTA-C filter are of concern in the design. H-Spice simulation results for the six biquads under consideration are shown in Tables III to VI.

TABLE III

Power consumptions of the six universal biquads

| | Filter | | | | |
|---|---|---|---|---|---|
| Biquad | LP mW | HP mW | BP mW | BR mW | AP mW |
| FIG. 1 | 0.279 | 0.255 | 0.377 | 0.271 | 0.294 |
| FIG. 2 | 1.780 | 1.593 | 1.593 | 1.812 | 1.980 |
| FIG. 5 | 1.192 | 1.150 | 1.160 | 1.129 | 1.122 |
| FIG. 6 | 1.637 | 1.584 | 1.632 | 1.604 | 3.076 |

TABLE IV

Noise of the six universal biquads

| | Filter | | | | |
|---|---|---|---|---|---|
| Biquad | LP V | HP V | BP V | BR V | AP V |
| FIG. 1 | 80.8μ | 74.2μ | 74.2μ | 83.3μ | 90.0μ |
| FIG. 2 | 148.4μ | 74.2μ | 74.2μ | 132.4μ | 148.0μ |
| FIG. 5 | 147.5μ | 82.4μ | 82.4μ | 164.4μ | 164.3μ |
| FIG. 6 | 2.4n | 8.44n | 0.97n | 2.15n | 81n |

TABLE V

Linear ranges (THD < 1.0%) of the six universal biquads

| | Filter | | | | |
|---|---|---|---|---|---|
| Biquad | LP V | HP V | BP V | BR V | AP V |
| FIG. 1 | 74.2m | 24.4m | 94.8m | 117.8m | 2.0m |
| FIG. 2 | 108.1m | 171.5m | 86.5m | 198.9m | 16.3m |
| FIG. 5 | 24.5m | 1.2m | 1.7m | (1.05m) | (1.7m) |
| FIG. 6 | (22.8m) | (0.65m) | (1.42m) | 1.61m | 13.8m |

TABLE VI

Dynamic ranges of the six universal biquads

| | Filter | | | | |
|---|---|---|---|---|---|
| Biquad | LP V | HP V | BP V | BR V | AP V |
| FIG. 1 | Unlimited | 10 | 0.5 | 20 | 2 |
| FIG. 2 | Unlimited | 46 | 1 | 70 | 6 |
| FIG. 5 | 34m | (1.41m) | (1.85m) | (3m) | (1.8m) |
| FIG. 6 | (30m) | 1.5m | 60m | 30m | 42m |

It is seen from these tables that (i) the biquad derived from FIG. 1 has the lowest power consumption and the second lowest noise level due to the use of the minimum number of components, (ii) except for the one derived from FIG. 1, the single-ended-input OTA-based one derived from FIG. 5 has the lowest power consumption in comparison with the ones with differential-input OTAs and the one with complementary single-ended-input OTAs (it means that a single-ended-input OTA has lower power consumption than a complementary single-ended-input OTA), (iii) a fully differential OTA-based biquad has the lowest noise, is much lower than the other kinds of biquad structures, (iv) the complementary single-ended-input OTA-based one derived from FIG. 2 enjoys the largest dynamic range and the largest average linear range (with output signals having the THD lower than 1%), (v) both the single-ended-input OTA based one (FIG. 5)

and the fully differential OTA based one (FIG. 6) have very small linear range and dynamic range. In summary, the present complementary single-ended-input OTA based one derived from FIG. 2 (resp. the single-ended-input OTA based one derived from FIG. 5) has very good (resp. bad) dynamic and linear ranges and acceptable noise level and power consumption. Of course, the fully differential OTA based one derived from FIG. 6 enjoys the lowest noise but suffers from very bad dynamic and linear ranges. Another important circuit parameter is relevant to component sensitivities, and the largest sensitivities are shown in Table VII.

TABLE VII

Largest component sensitivities of the six universal biquads for the five generic filtering signals

| | Filter | | | | |
|---|---|---|---|---|---|
| Biquad | LP | HP | BP | BR | AP |
| FIG. 1 | 0.500 | 0.850 | 0.542 | 0.386 | 0.298 |
| FIG. 2 | 0.999 | 1.031 | 0.542 | 0.533 | 0.542 |
| FIG. 5 | 0.999 | 1.130 | 0.568 | 0.464 | 0.620 |
| FIG. 6 | 1.017 | 0.828 | 0.000 | 0.000 | 4.814 |

Figure 34:
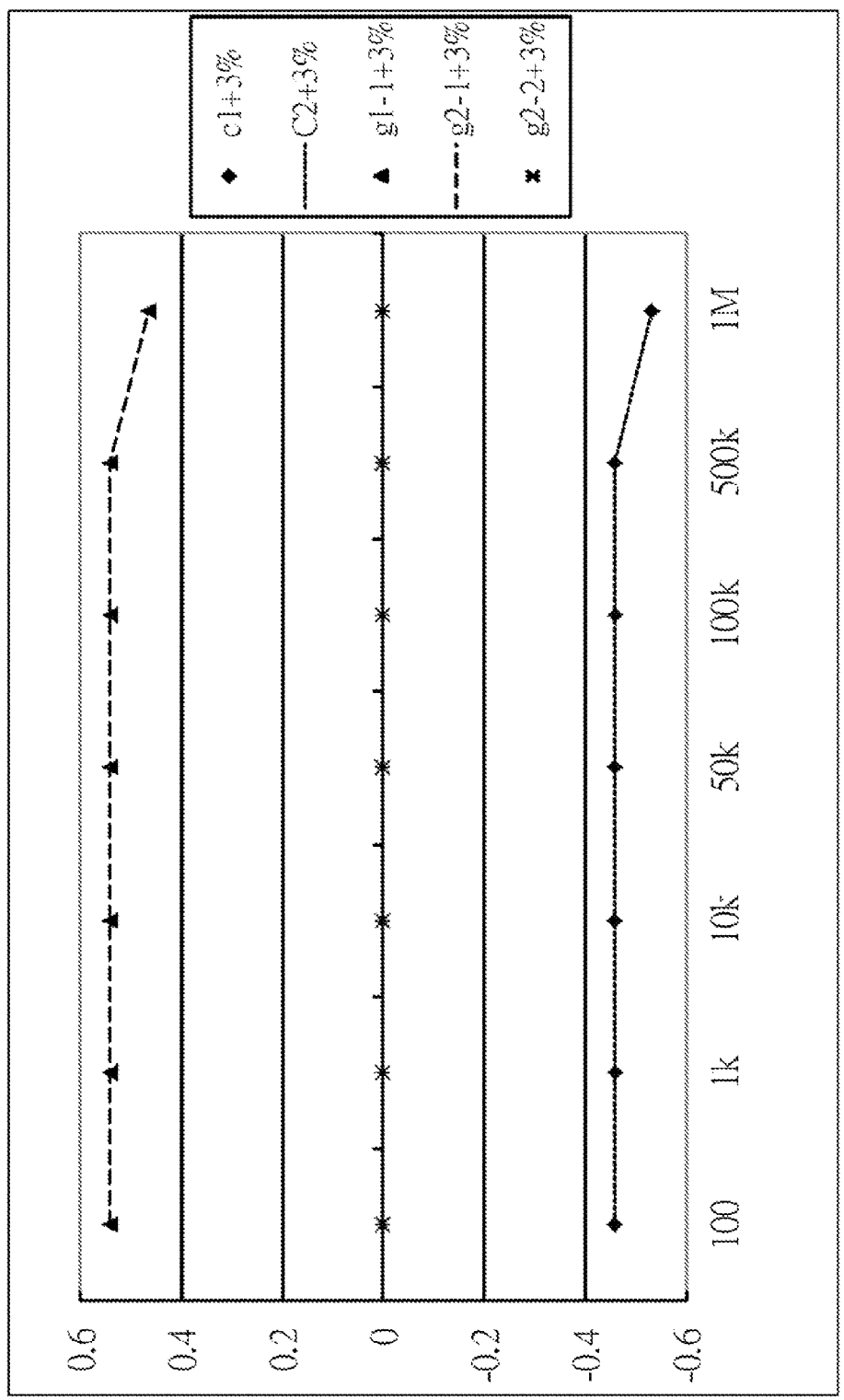
FIG. 34 shows component sensitivities of the band-pass biquad derived from FIG. 2.
Figure 35:
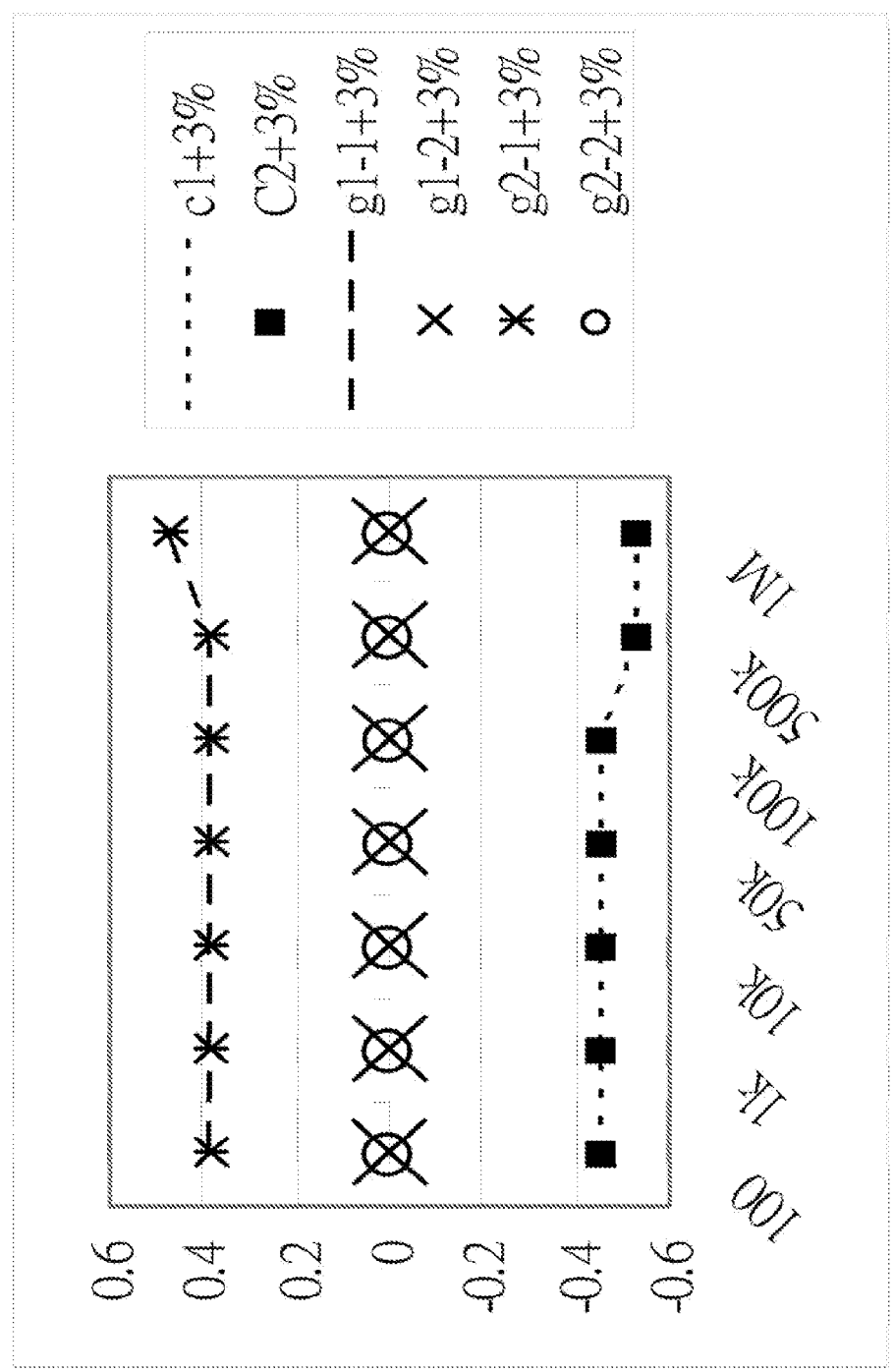
FIG. 35 shows component sensitivities of the band-reject biquad derived from FIG. 2.
Figure 36:
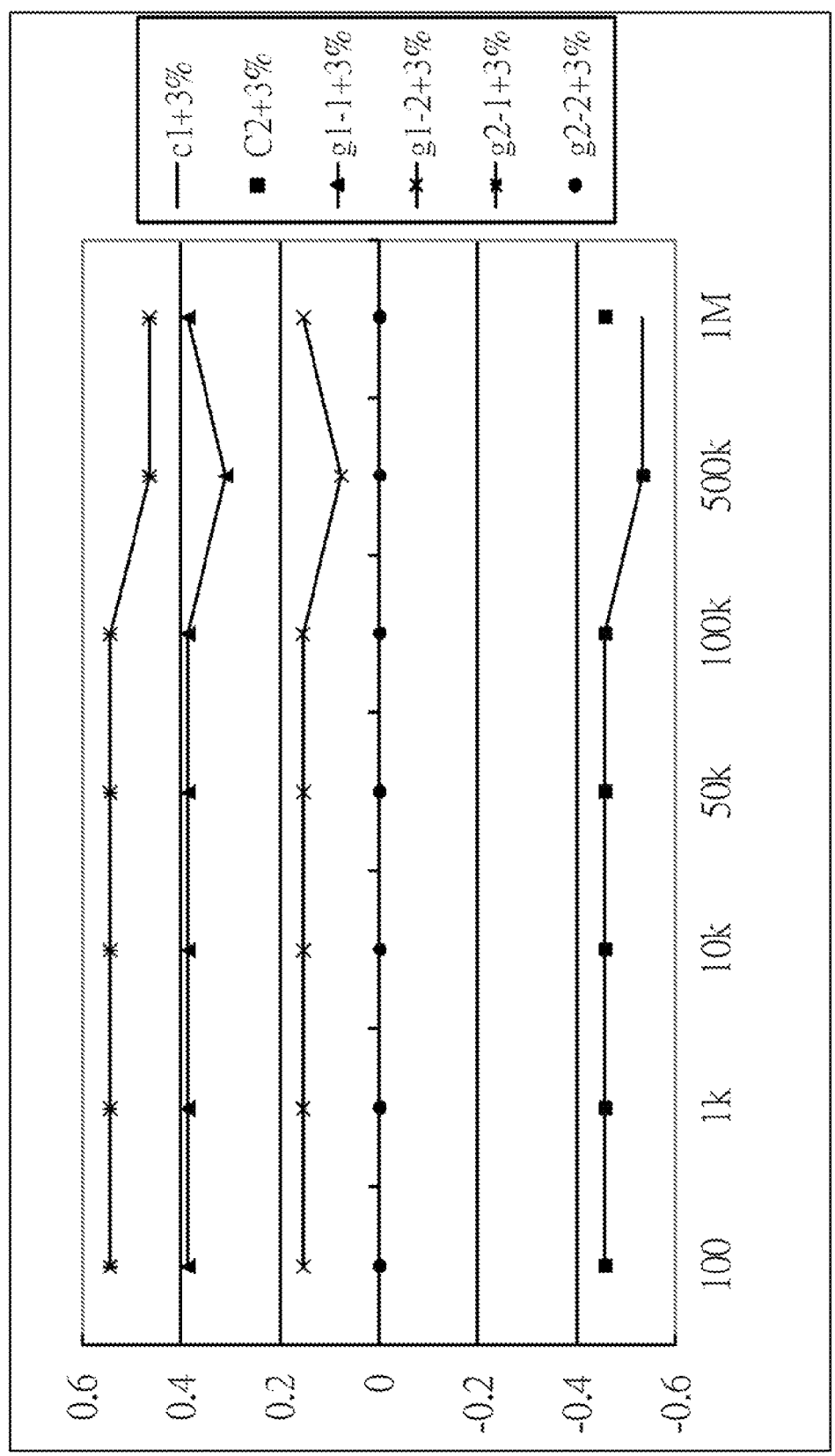
FIG. 36 shows component sensitivities of the all-pass biquad derived from FIG. 2.

In the four new second-order universal biquads derived from FIGS. 1, 2, 5 and 6, band-pass, band-reject, and all-pass (except the one derived from FIG. 6) sensitivities of their center frequencies to each capacitance and conductance have been simulated and illustrated to have the absolute value not larger than 0.620 (the all-pass sensitivity off, to $g_3$ or $g_4$ for the one derived from FIG. 5), which is smaller than 0.630, the largest one of the sensitivities of the second-order passive all-pass filter with a lattice topology. Thus, the three new BP, BR, and AP biquads derived from FIGS. 1, 2, 5, and 6 (except for the all-pass signal) enjoy very low sensitivities that have been achieved by passive LC ladder circuits. The BP, BR, and AP sensitivity-frequency diagrams for the corresponding biquad derived from FIG. 2 are shown in FIGS. 34 to 36, respectively.

It is of interest to know whether the sensitivity of a high-order filter structure is the same as that of a second-order filter structure. In addition to this, since a sixth-order filter structure can also be realized by using a three-stage biquad structures in cascade, it is also of interest to compare the sensitivities of a direct sixth-order one with that of the corresponding three-biquad-stage one.

The component sensitivities of the four different sixth-order filter structures derived from FIGS. 1, 2, 5 and 6 are shown in Table VIII in which the largest sensitivity is presented.

TABLE VIII

Largest component sensitivities of the eight sixth-order universal filter structures for the five generic filtering signals

| | Filter | | | | |
|---|---|---|---|---|---|
| Biquad | LP $6^{th}$-order | HP $6^{th}$-order | BP $6^{th}$-order | BR $6^{th}$-order | AP $6^{th}$-order |
| FIG. 1 | 0.78 | 18.87 | 0.45 | 35.52 | 16.95 |
| FIG. 1* | 1.08 | 0.48 | 0.22 | 0.00 | 0.91 |
| FIG. 2 | 2.16 | 2.24 | 2.33 | 0.00 | 2.51 |
| FIG. 2* | 0.62 | 1.07 | 0.00 | 0.00 | 2.28 |
| FIG. 5 | 1.12 | 0.79 | 1.36 | 0.00 | 1.15 |
| FIG. 5* | 0.51 | 0.83 | 0.48 | 0.49 | 0.19 |
| FIG. 6 | 1.16 | 1.07 | 0.69 | 12.72 | 2.35 |
| FIG. 6* | 1.12 | 1.36 | 2.33 | 0.00 | 2.40 |

Figure 37:
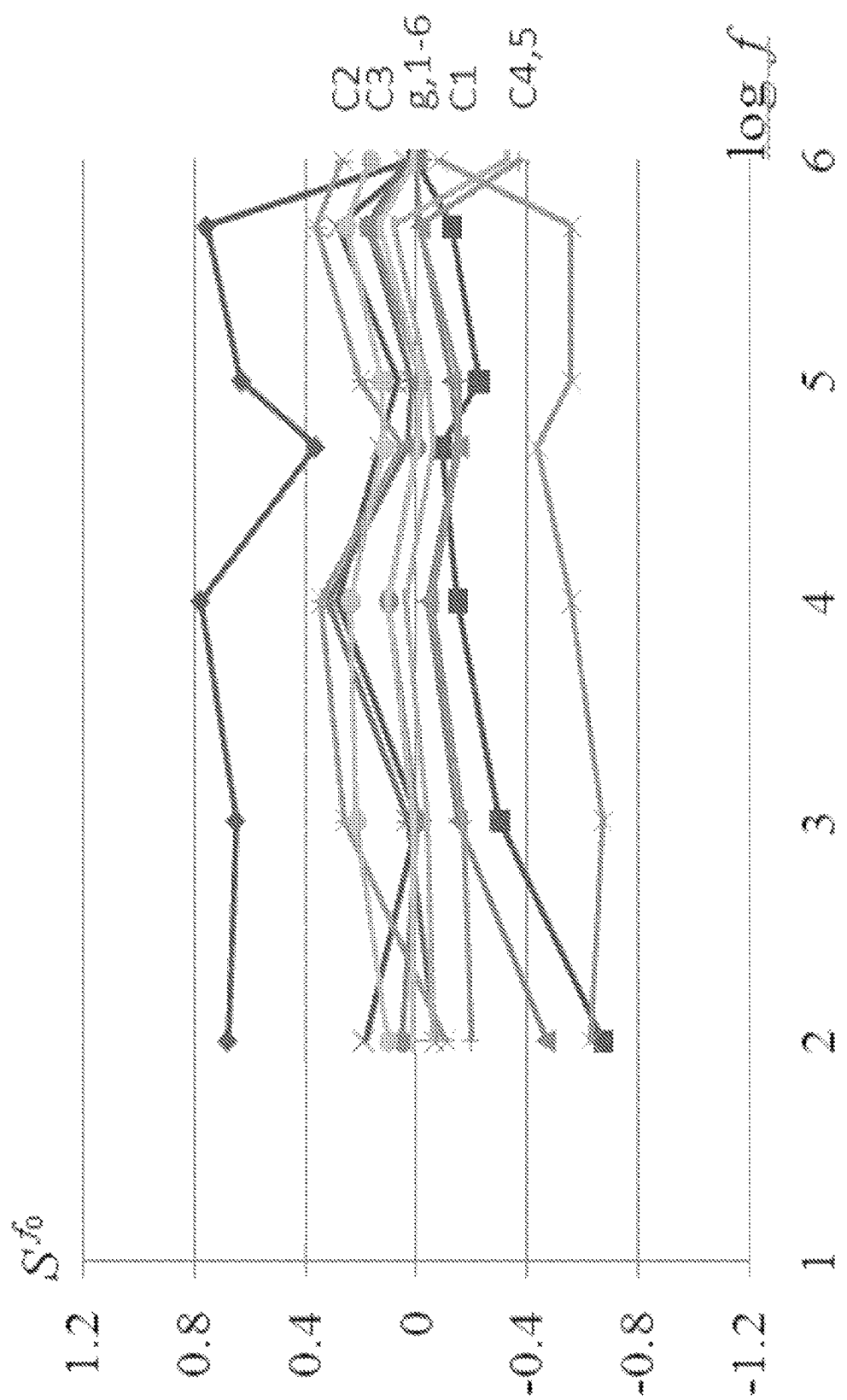
FIG. 37 shows component sensitivities of the straight sixth-order low-pass filter derived from FIG. 1.
Figure 38:
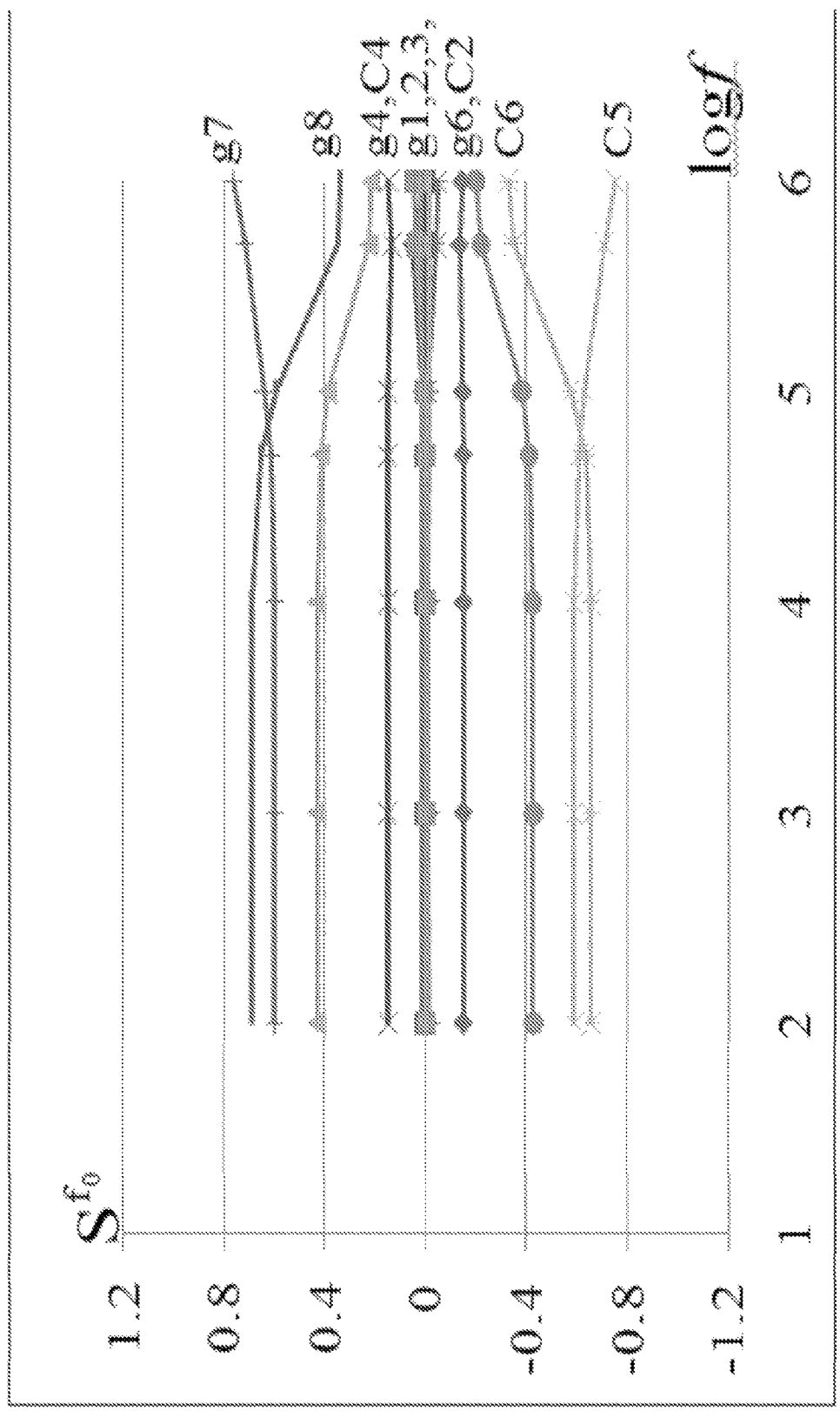
FIG. 38 shows component sensitivities of the straight sixth-order high-pass filter derived from FIG. 5.

Based upon Table VIII, we can conclude that (i) the component sensitivity of the three-biquad-stage sixth-order using the new complementary single-ended-input OTA based one is equal or lower than that of the direct sixth-order one, (ii) the other three types do not have this property as (i), i.e., some direct sixth-order ones enjoy component sensitivity lower than its corresponding three-biquad-stage one, (iii) the case, FIG. 5*, shown in Table VIII, is with the lowest average component sensitivity (in which low-pass, band-pass, band-reject, and all-pass types even enjoy very low sensitivities achieved by passive LC ladder circuits), and (iv) although the direct sixth-order differential-input OTA-based one (FIG. 1) has very large sensitivities, such as 18.87 and 16.95, for high-pass and all-pass cases, respectively, yet its three biquad stages in cascade has low sensitivities, 0.48 and 0.91, leading to the importance of the usage (direct sixth-order or three biquad stages in cascade) of the filter structures. FIGS. 37 and 38 show the component sensitivities of the direct sixth-order low-pass and high-pass filters derived from FIGS. 1 and 5, respectively.

Figure 39:
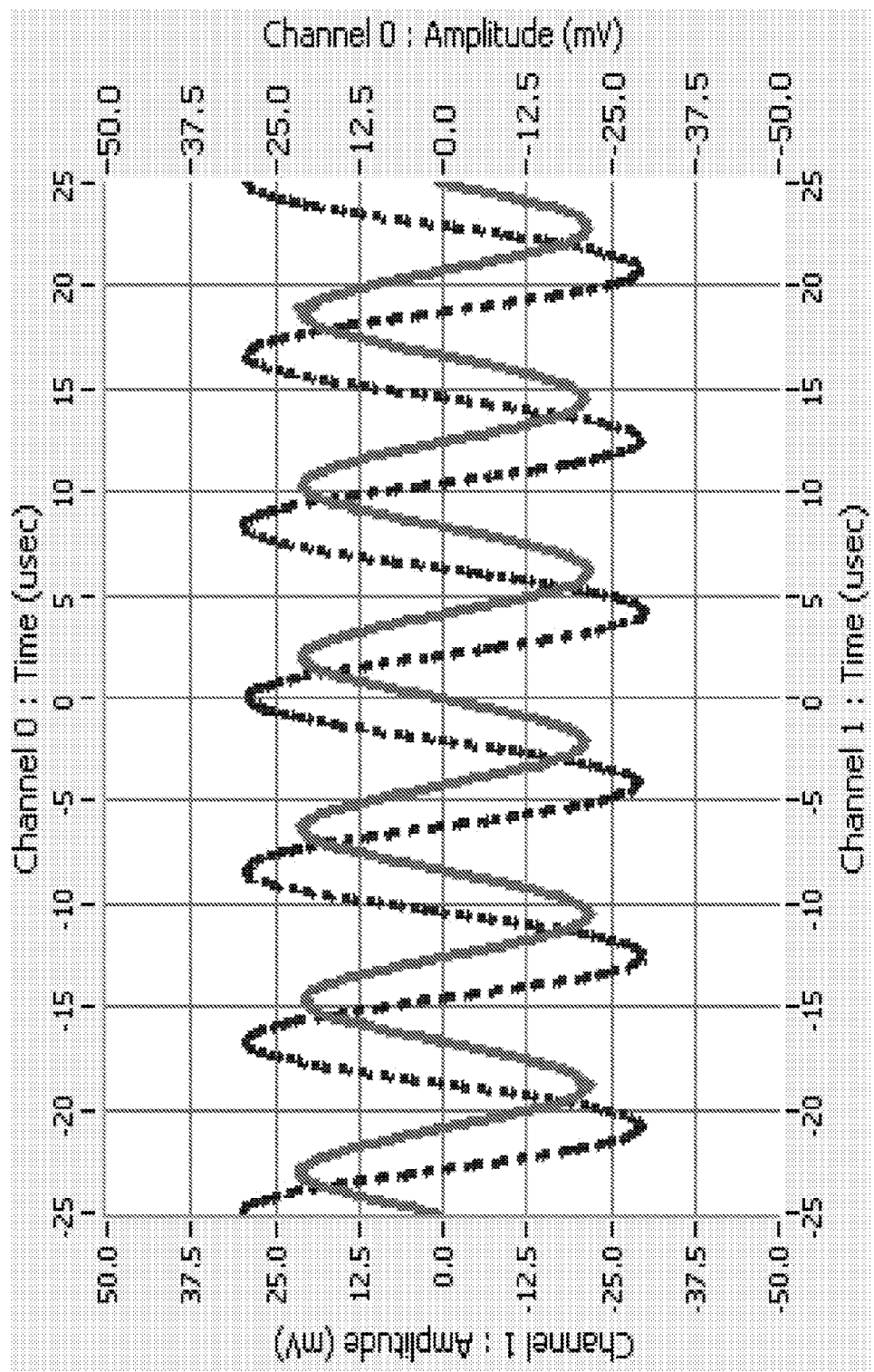
FIG. 39 shows input and output signals of the low-pass biquad derived from FIG. 1.
Figure 40:
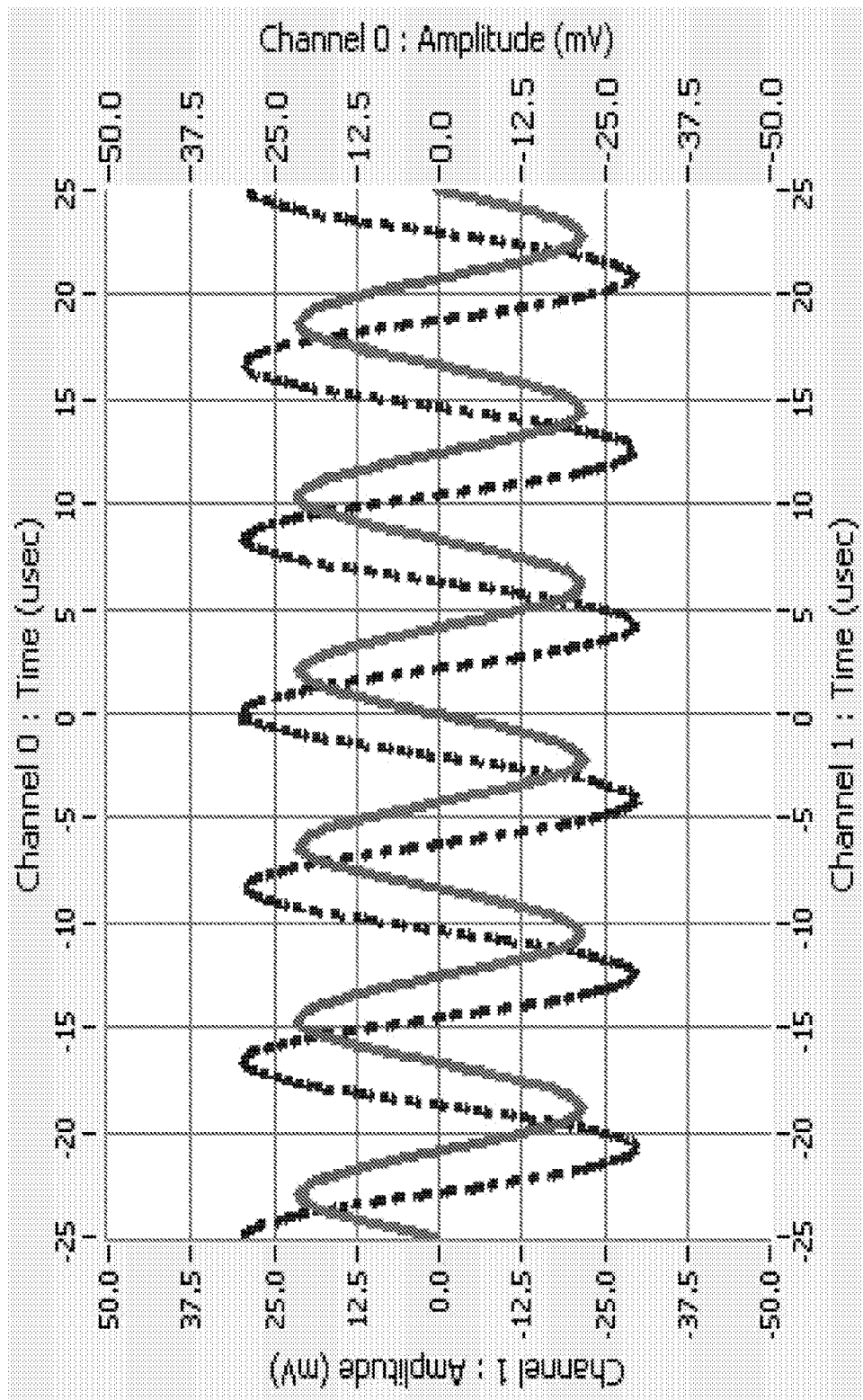
FIG. 40 shows input and output signals of the low-pass biquad derived from FIG. 3.
Figure 41:
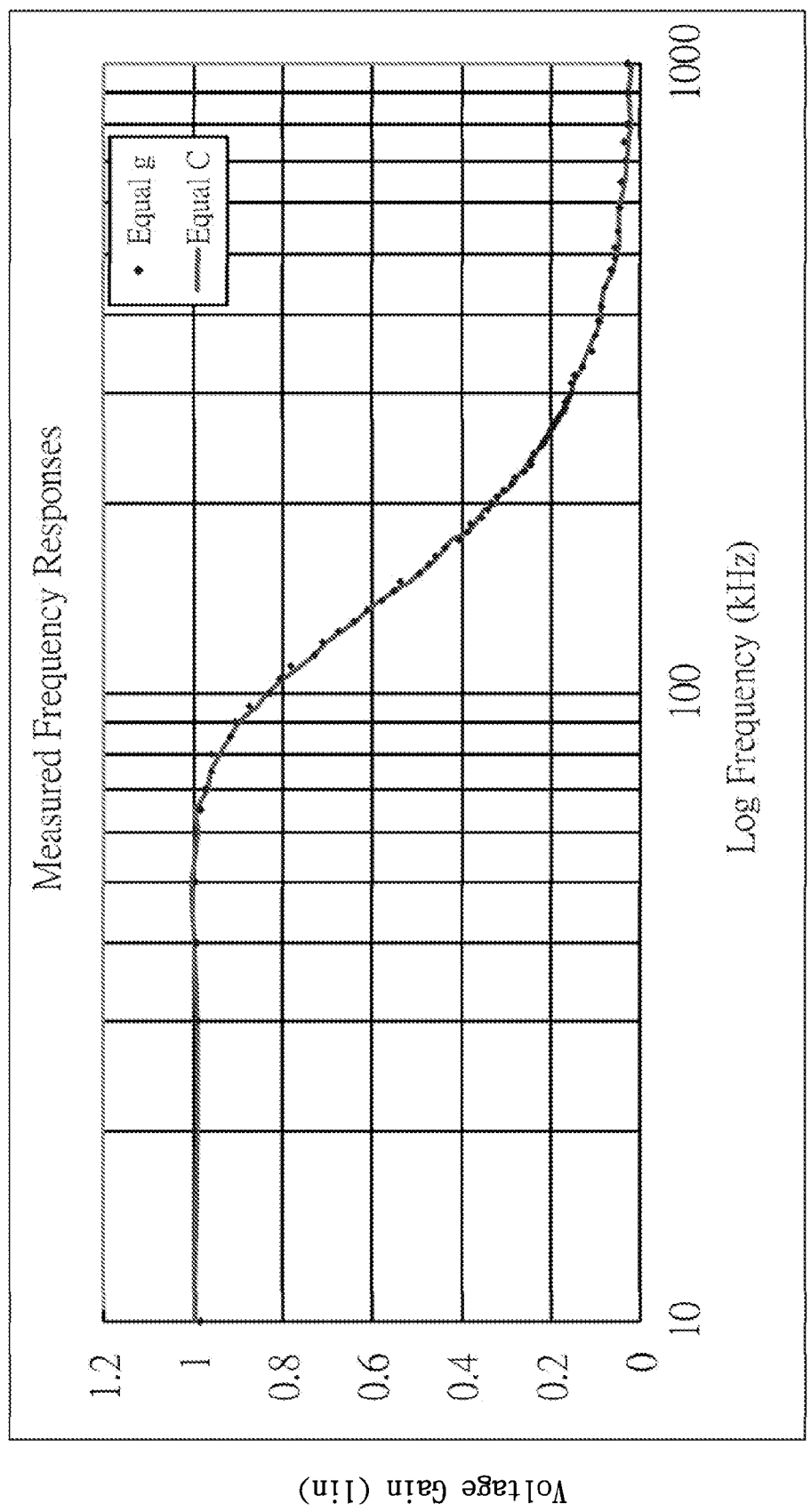
FIG. 41 shows measured amplitude-frequency responses of equal C or equal g low-pass biquads derived from FIGS. 1 and 3.
Figure 42:
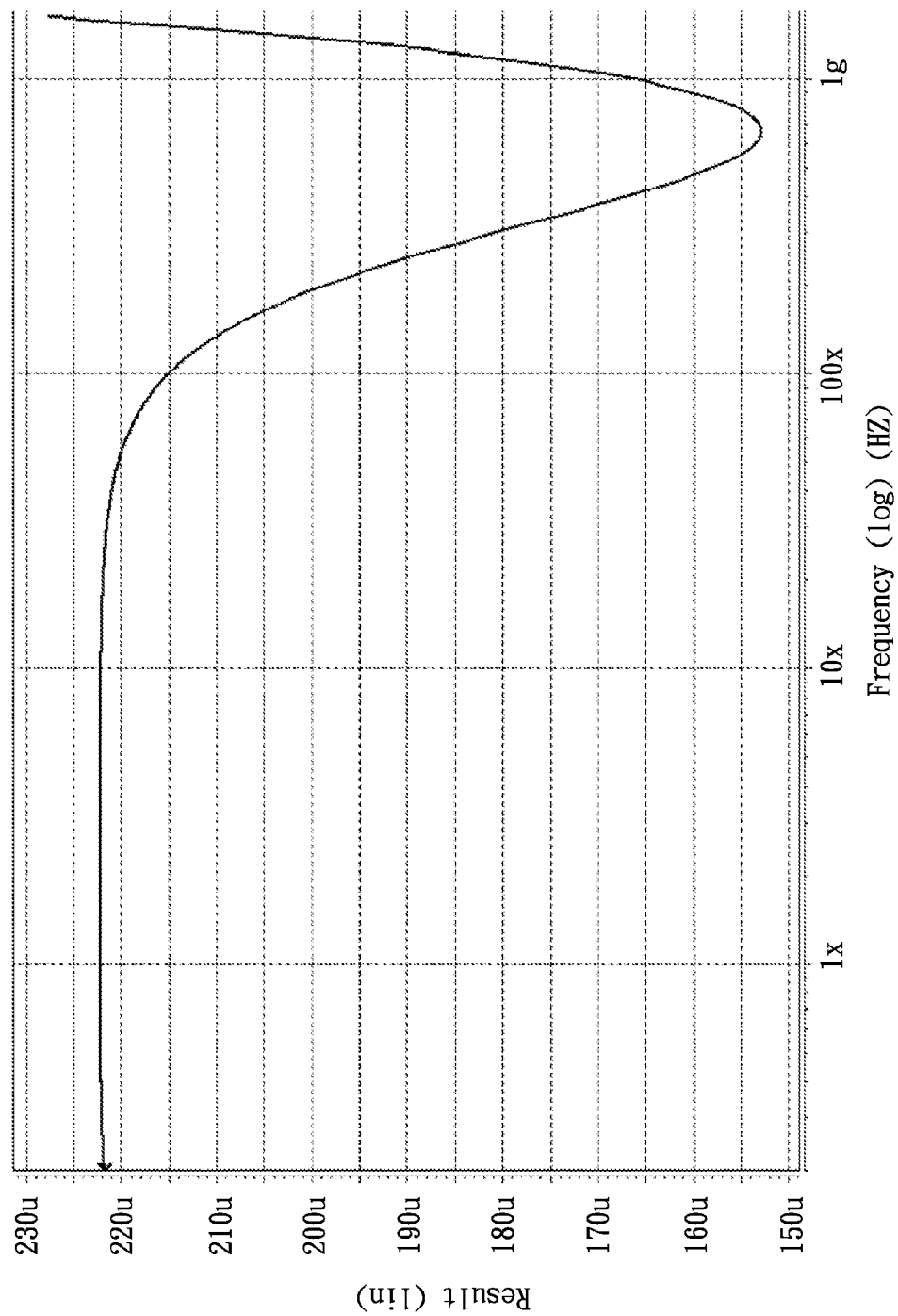
FIG. 42 shows the amplitude-frequency response of $G_1$.

In order to validate the feasibility of the synthesized filter structures, the second-order low-pass biquads derived from FIGS. 1 and 3 are used to do the validation. Component values are given by (i) $C_1=C_2=330$ pF (equal capacitance), $g_1=160$ µS, and $g_2=320$ µS, and (ii) $g_1=g_2=320$ µS (equal transconductance), $C_1=660$ pF, and $C_2=330$ pF for realizing a second-order Butterworth low-pass filter with $f_{3dB}$ at 109.2 kHz. We use the LM13700 as the practical OTA. The experimental results are shown in FIGS. 39-40 with the input-and-output signals at 120 kHz (the former having 57.983 mV input and 41.945 mV output signals and the latter having 58.456 mV input and 41.665 mV output signals). FIG. 41 shows the measured amplitude-frequency responses and the $f_{3dB}$ is the frequency range of 120 kHz to 125 kHz. It is seen that the output signals from the equal capacitance biquad and the equal transconductance biquad are nearly the same. Thus, the synthesized filter structures shown in FIGS. 1 and 3 have been validated to be feasible using this experiment.

V. Modified Frequency Dependent Transconductance

FIGS. 11-14, 16-17, 22, 24 26, 28, 30 and 32 show that a major distortion (sudden magnitude fall) occurs in the frequency range from 200 MHz to 1 GHz. This apparent distortion is investigated below.

Figure 46:
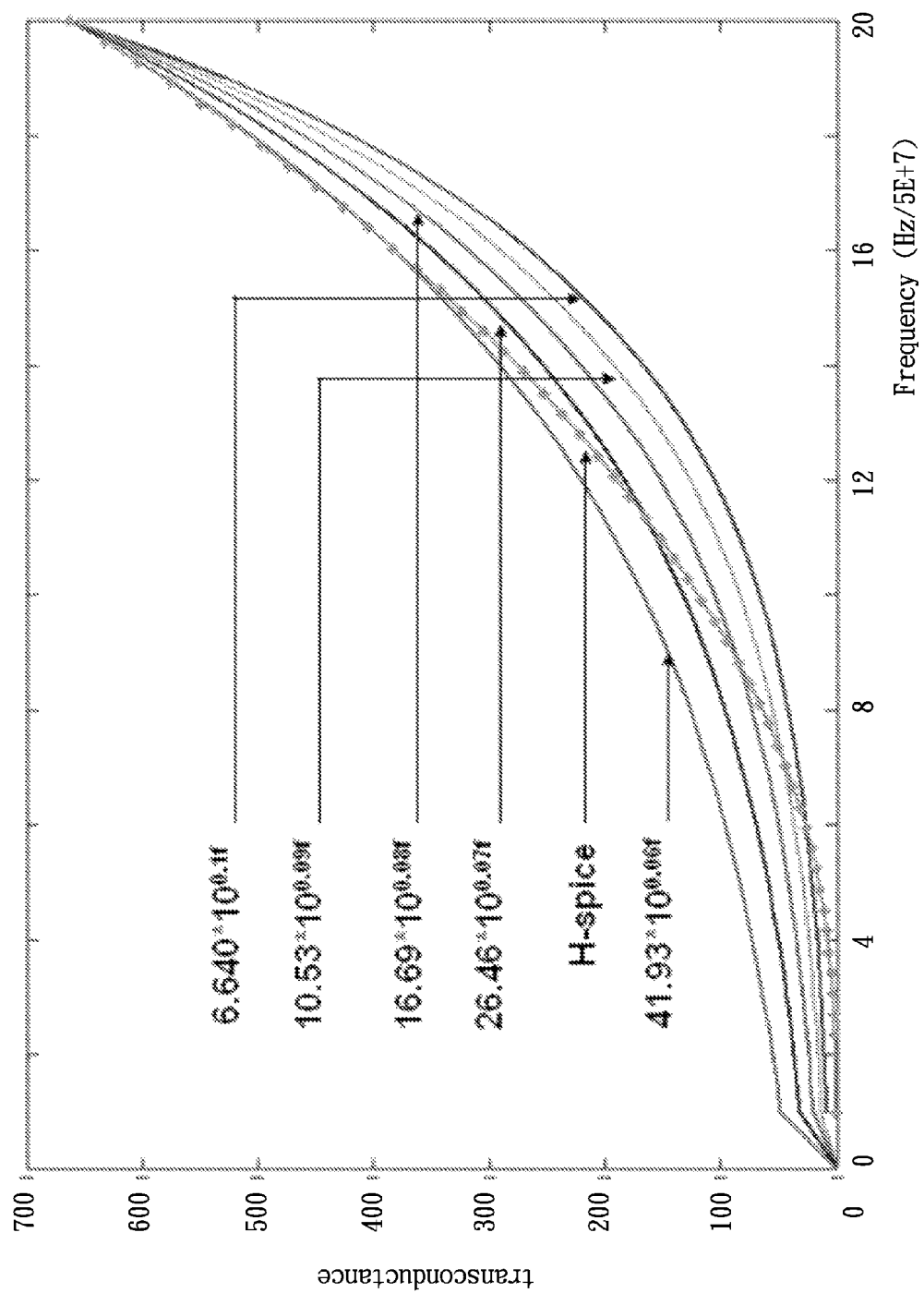
FIG. 46 shows several functions of the exponential-like curve $G_2(s)$ when the operational frequency is over 72 MHz.

The four transconductances, $G_1$, $G_2$, $G_a$, and $G_b$, of the second-order universal biquad derived from FIG. 5 are functions of frequency and are shown in FIGS. 42 to 45, respectively. We note that (i) the initial part of the curves shown in FIGS. 42 to 45 are of a low-pass nature and is in agreement with the traditional representation, $G(s)=[g/(1+s/\omega_o)]$, but the latter part shows an exponential-like increase and this has not been mentioned earlier in the literature. The frequency dependent transconductance G(s) of an OTA needs to be modified as below.

$$G(s) = \begin{cases} \dfrac{g}{\left(1+\dfrac{s}{\omega_o}\right)}, & f < f_{lowest}; \\ a10^{\frac{b}{2\pi}s}, & f \geq f_{lowest}, \end{cases} \quad (16)$$

where $f_{lowest}$ is the frequency with the lowest value of transconductance in the amplitude-frequency response of G(s). For example, $f_{lowest} \approx 660$ MHz, 72 MHz, 10 GHz, and 3.5 GHz for FIGS. 42 to 45, respectively. The exponential-like function is with a=26.46 and b=0.07 for $G_2(s)$ (FIG. 46).

As a result, the present invention also provides an integrated circuit, comprising at least one operational transconductance amplifier, wherein a frequency dependent transconductance G(s) of the operational transconductance amplifier is $$G(s) = \begin{cases} \dfrac{g}{\left(1+\dfrac{s}{\omega_o}\right)}, & f < f_{lowest}; \\ a10^{\frac{b}{2\pi}s}, & f \geq f_{lowest}, \end{cases}$$

wherein s is a amplitude-frequency response of G(s), a is a first constant, b is a second constant, $\omega_o$ is a third constant, f is a frequency with one value of transconductance in the amplitude-frequency response of G(s), and $f_{lowest}$ is a frequency with a lowest value of transconductance in the amplitude-frequency response of G(s).

Figure 11:
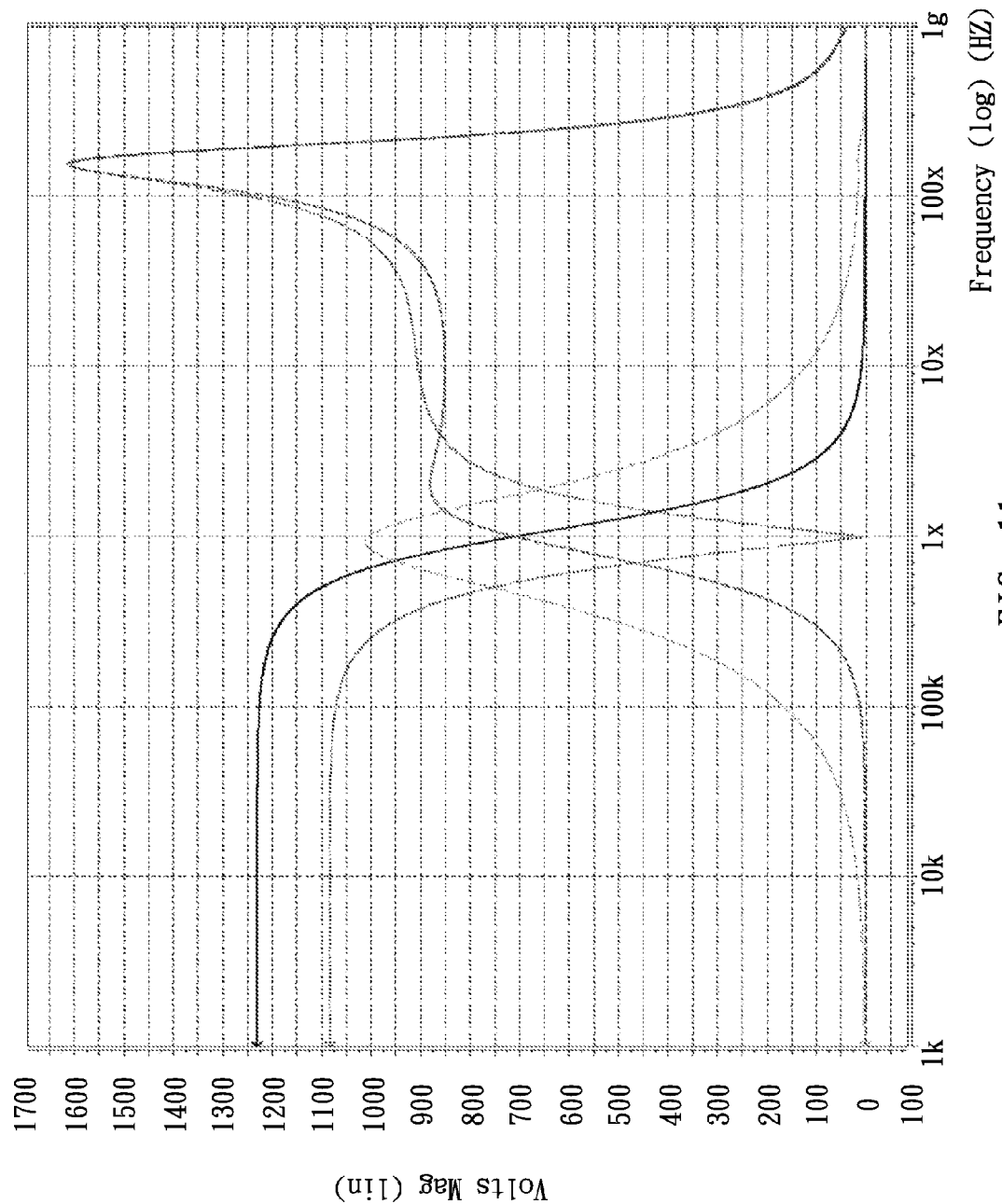
FIG. 11 shows LP, BP, HP, and NH amplitude-frequency responses of the universal biquad derived from FIG. 5.
Figure 12:
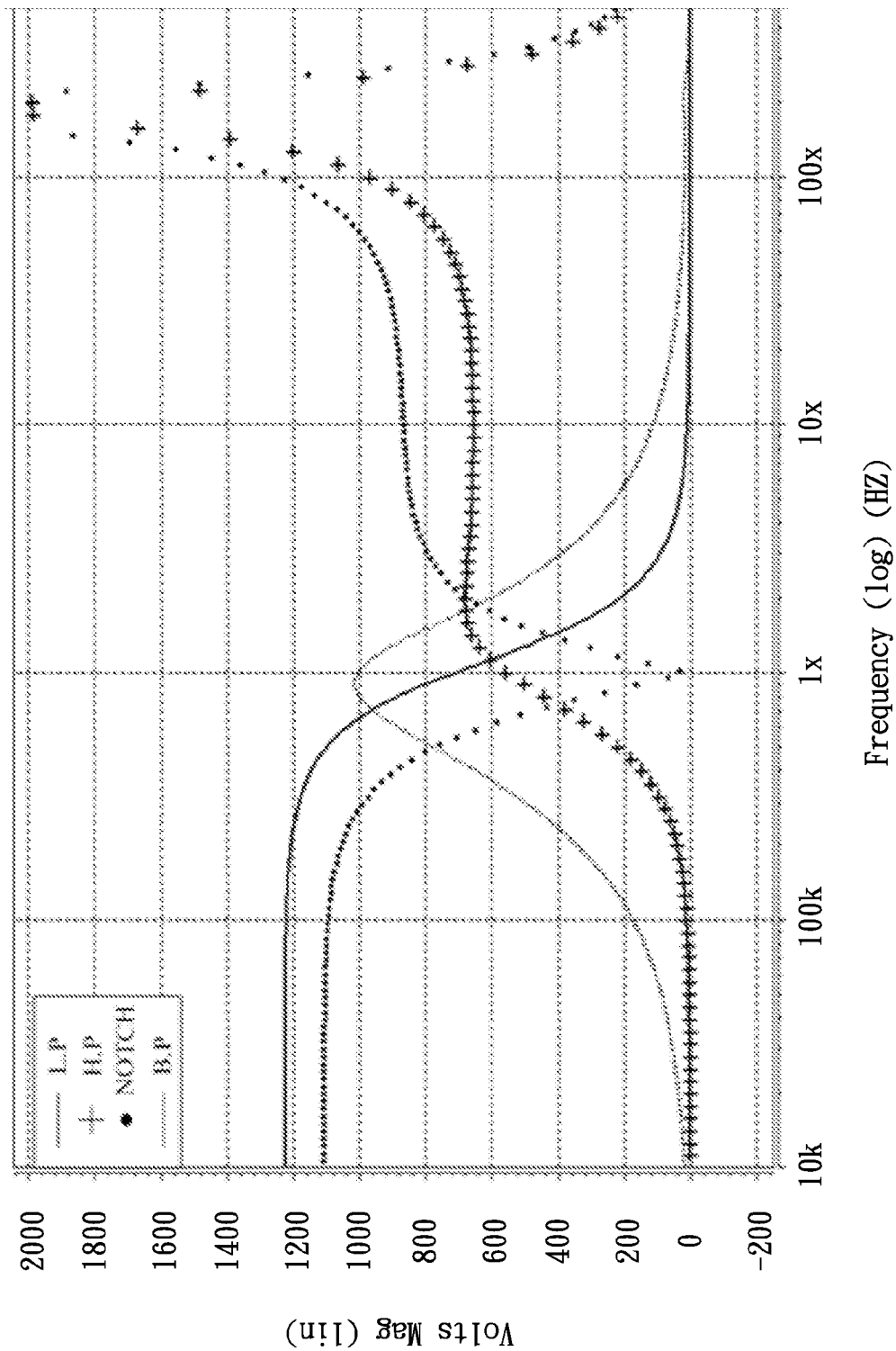
FIG. 12 shows LP, BP, HP, and NH amplitude-frequency responses of the universal biquad derived from FIG. 6.
Figure 13:
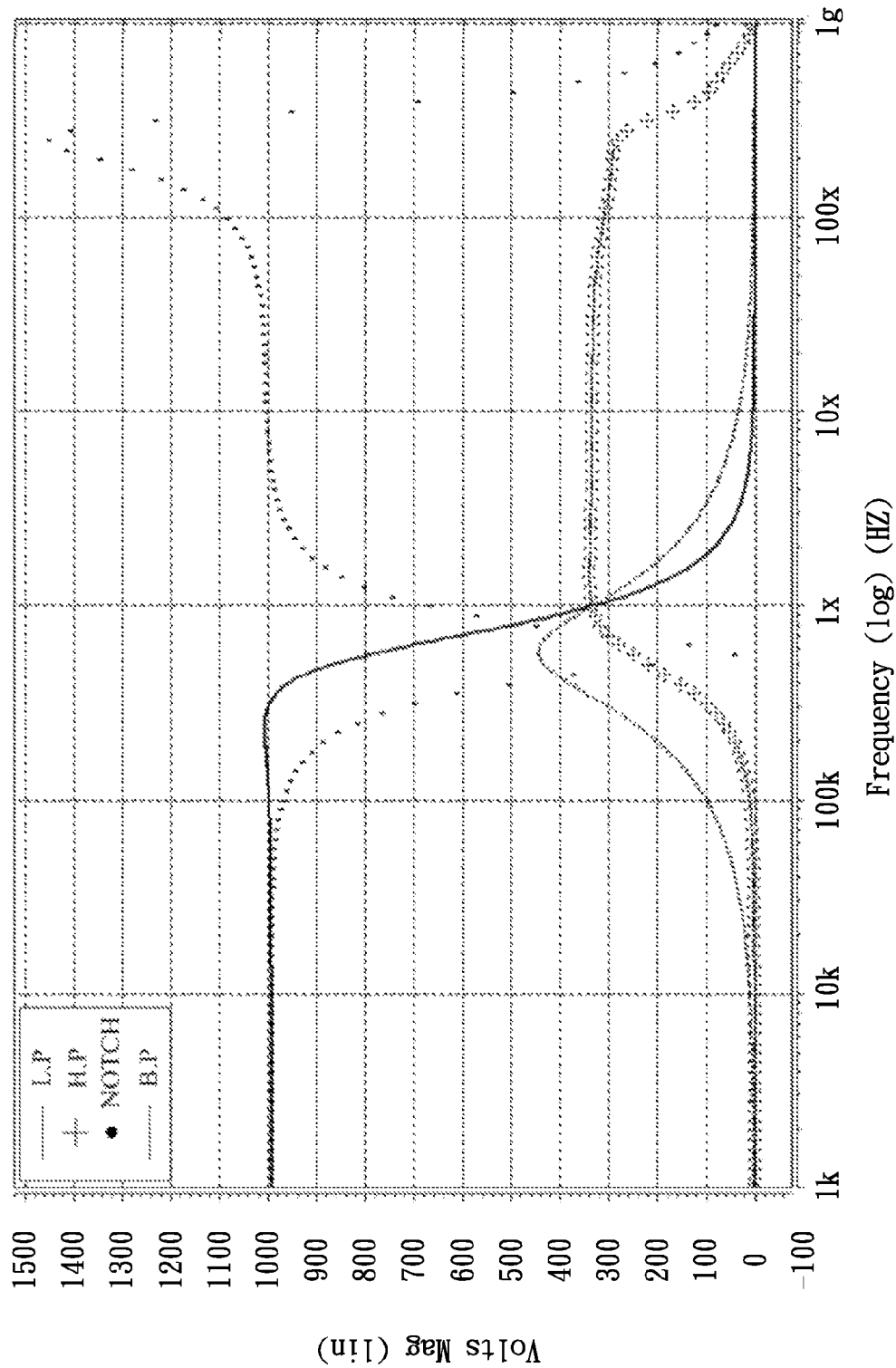
FIG. 13 shows LP, BP, HP, and NH amplitude-frequency responses of the universal biquad.
Figure 14:
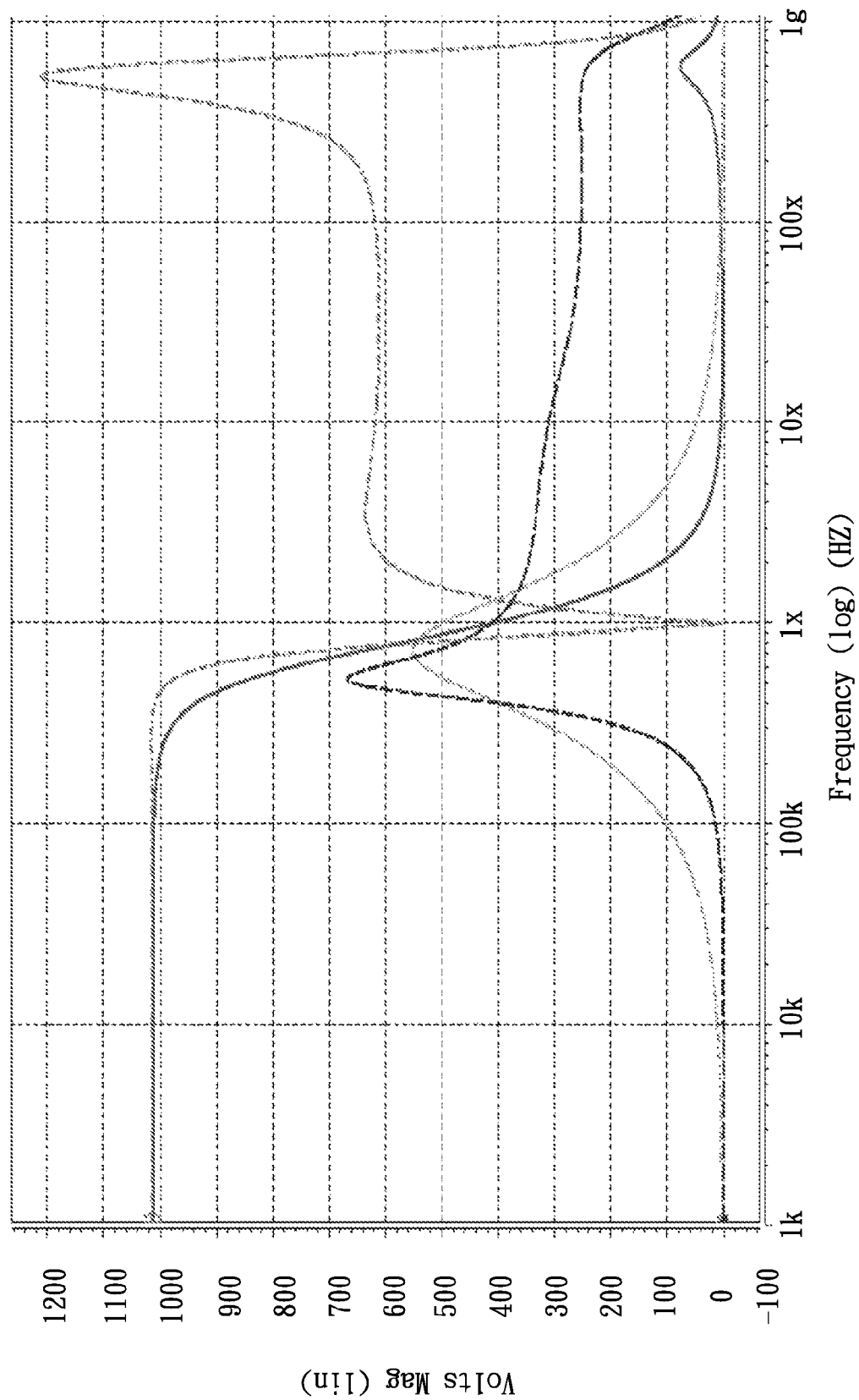
FIG. 14 shows LP, BP, HP, and NH amplitude-frequency responses of the universal biquad.
Figure 15:
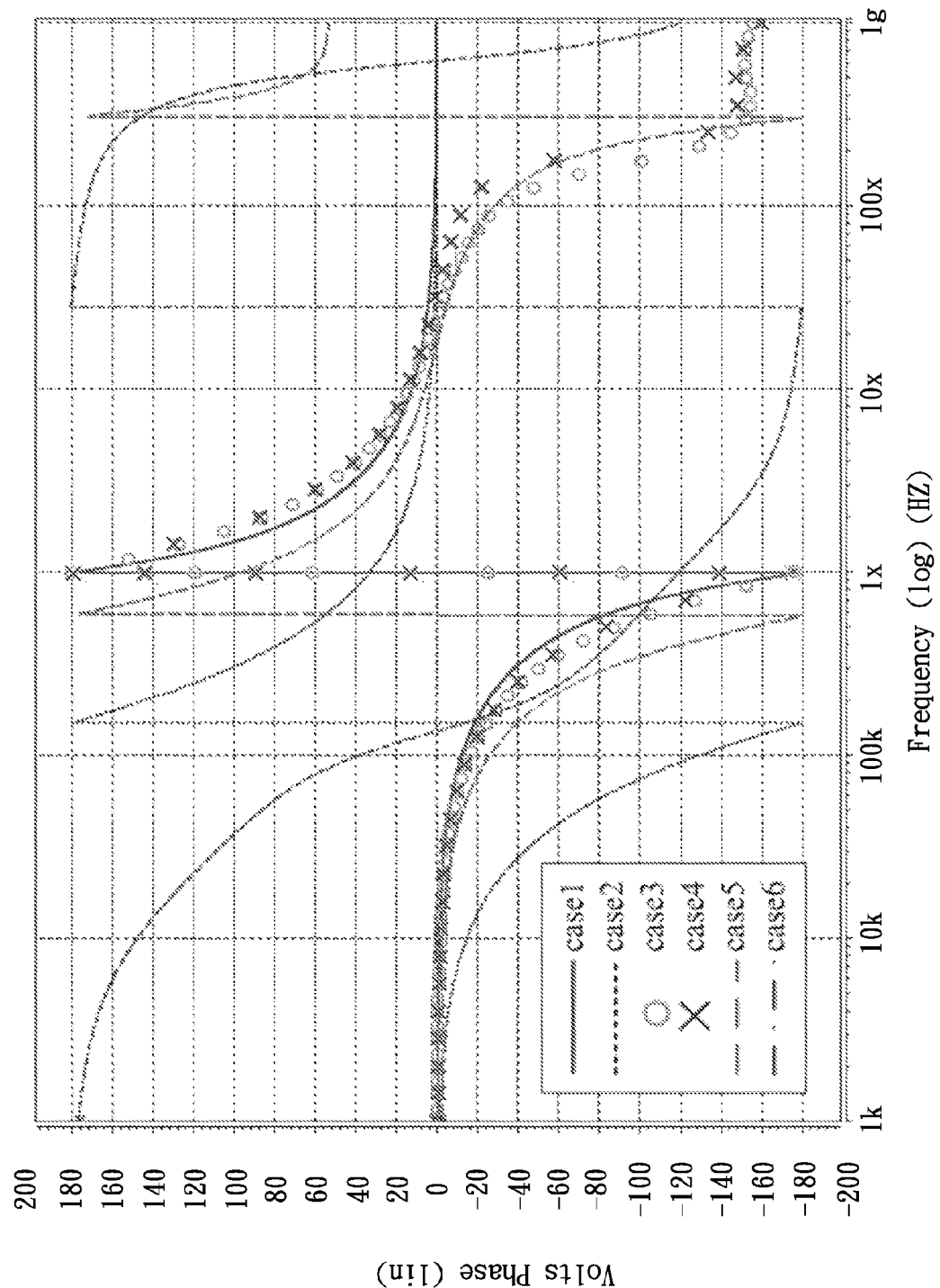
FIG. 15 shows AP phase-frequency responses of the universal biquads shown in FIGS. 2), 1 (case 2), 5 (case 3), and 6 (case 4), and in [25] (case 5) and [26] (case 6), respectively.
Figure 43:
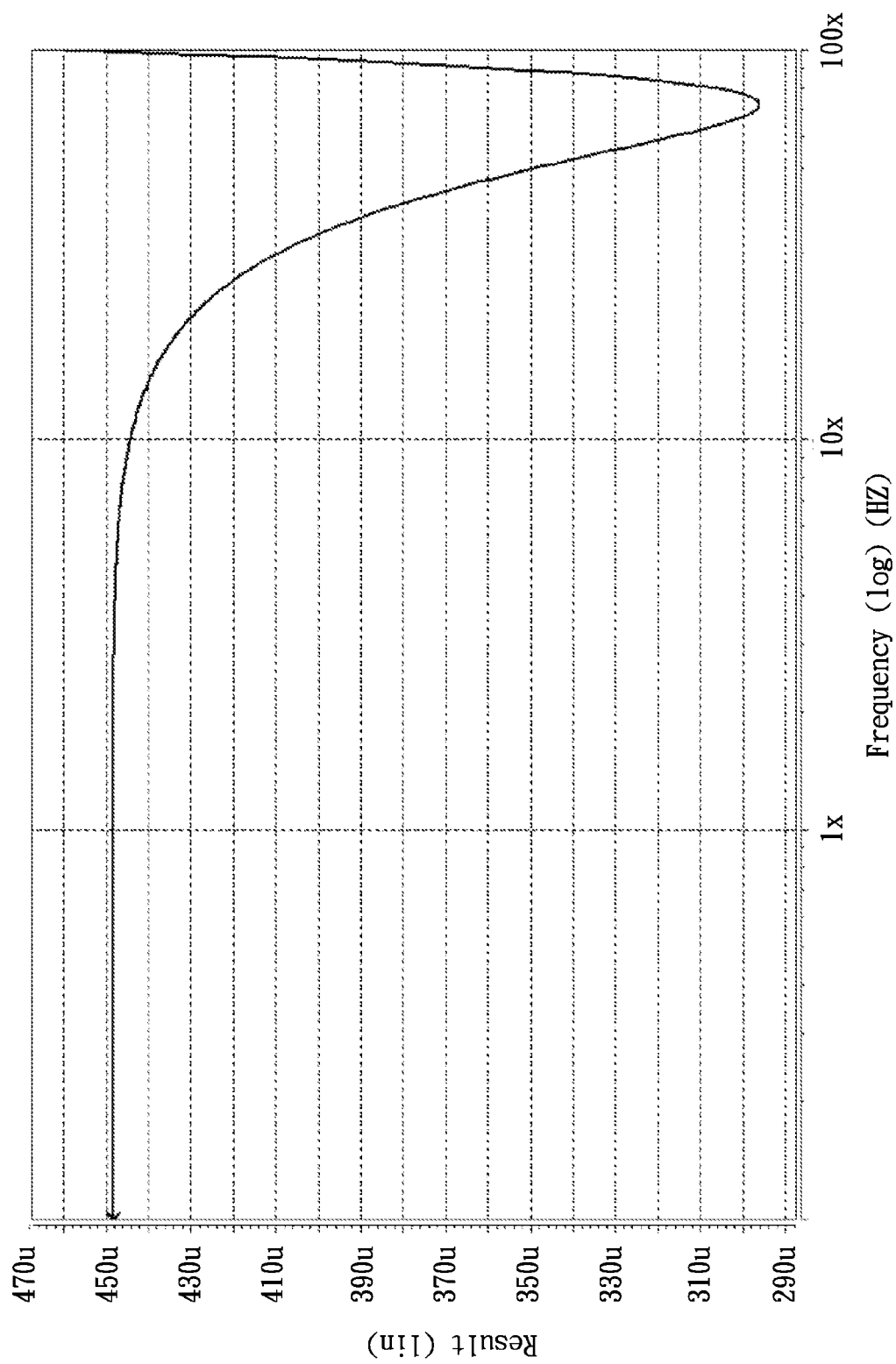
FIG. 43 shows the amplitude-frequency response I of $G_2$.
Figure 44:
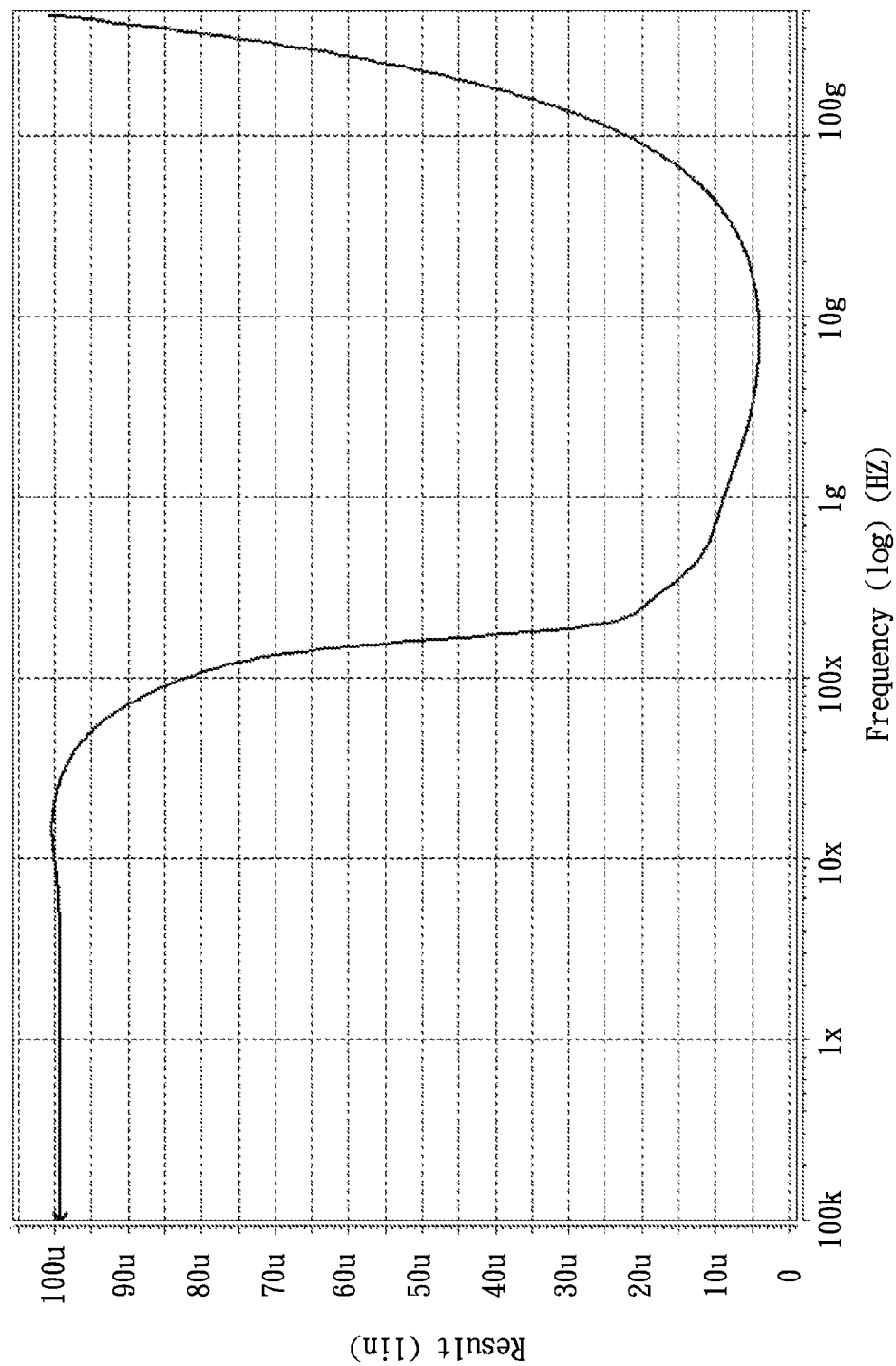
FIG. 44 shows the amplitude-frequency response of $G_a$.
Figure 45:
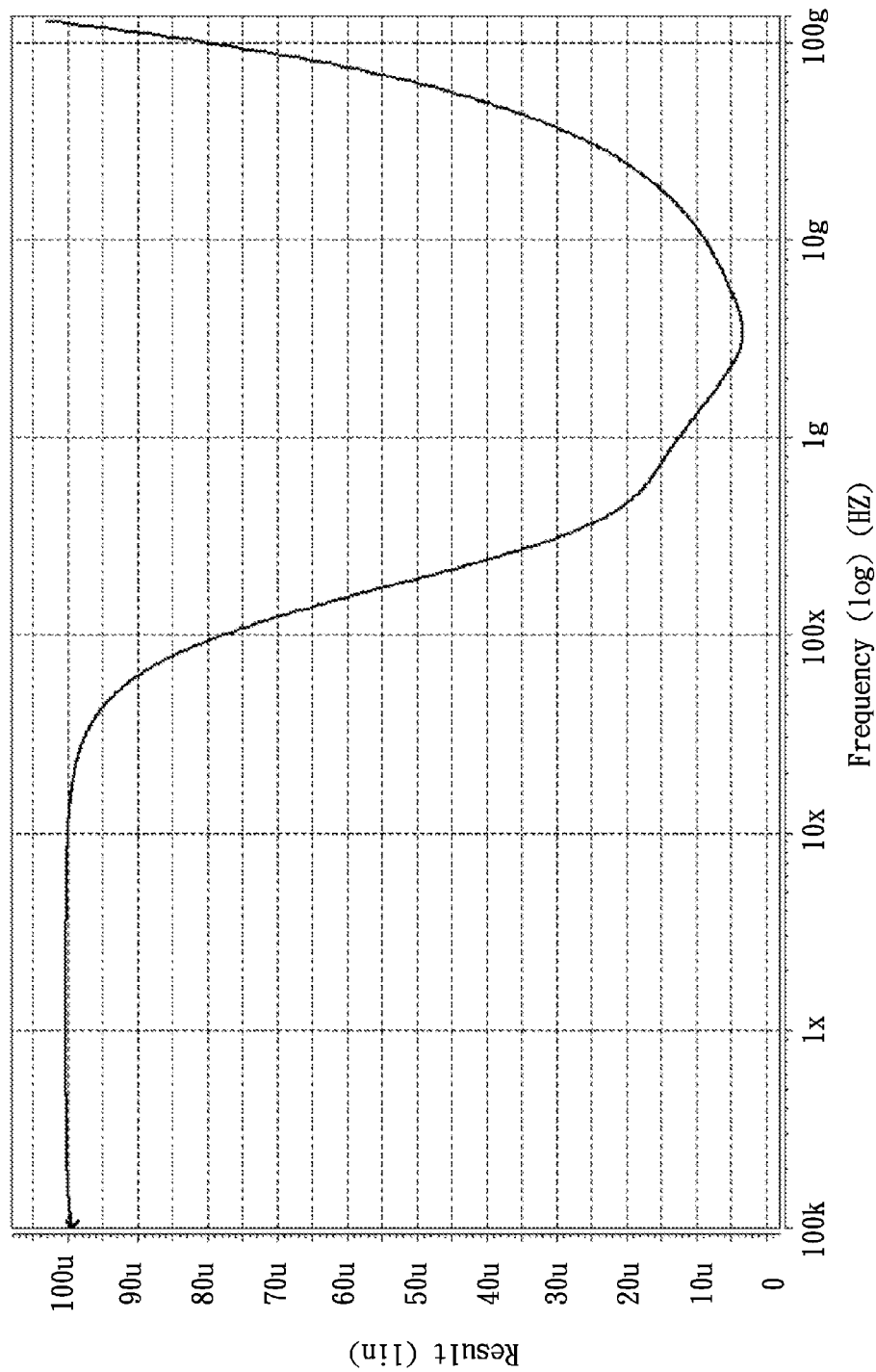
FIG. 45 shows the amplitude-frequency response of $G_b$.

(ii) FIG. 43 shows a sharp increase in the transconductance $G_2(s)$ when the operational frequency is over 100 MHz. The value of $G_2$ is 459 μS at 100 MHz and abruptly jumps up to 304 mS at 1000 MHz. This situation may be called "the collapse of the transconductance of the OTA". On the other hand, we notice that the $f_{lowest}$ is 660 MHz, 72 MHz, 10 GHz, and 3.5 GHz for FIGS. 42 to 45, respectively. Note that the $f_{lowest}$ of $G_2$ is much lower than that of other three ones. It leads to the value of $G_2$ to be much larger than $G_1$, $G_a$, and $G_b$, at 200 MHz and then dominant for the output responses. As a consequence, distortions have occurred, as shown in FIG. 11.

(iii) Both the differential-input OTA-based universal biquad derived from FIG. 1 and the new complementary single-ended-input OTA-based one derived from FIG. 2 have no collapses of transconductances. However, the universal biquads derived from FIGS. 5 and 6 with all single-ended-input or fully differential OTAs and some differential-input OTAs have distortion due to the collapse of transconductances.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An integrated circuit, at least comprising:
   a plurality of first amplifiers, wherein each of the first amplifiers comprises at least one output, at least one negative input, and at least one positive input; and
   a plurality of first capacitors, wherein each of the first capacitors comprises a first electrode and a second electrode, wherein the first electrode is electrically connected to the positive input of corresponding one of each of said first amplifiers, wherein the second electrode is electrically connectable to a first electrical source;
   wherein the negative input of one each one of said first amplifiers is electrically connected to the negative input of another one of said first amplifiers;
   said integrated circuit further comprising a head amplifier and a tail amplifier, wherein the head amplifier and tail amplifier includes at least one output, at least one negative input, and at least one positive input, wherein the output of the head amplifier is electrically connected to the negative input of the head amplifier, wherein the positive input of the tail amplifier is electrically connectable to a general electrical source; and
   a head capacitor, wherein the head capacitor includes a first electrode and a second electrode, wherein the first electrode of the head capacitor is electrically connected to the negative input of the head amplifier.

2. An integrated circuit as claimed in claim 1, wherein each of the first amplifiers further comprises a first component amplifier and a second component amplifier, wherein the first component amplifier and second component amplifier comprise at least one positive component input, at least one negative component input, and at least one component output, wherein the positive component input of the first component amplifier is the positive input of the first amplifier, wherein the negative component input of the second component amplifier is the negative input of the first amplifier, wherein the negative component input of the first component amplifier is electrically connected to the positive component input of the second component amplifier, wherein both the negative component input of the first component amplifier and the positive component input of the second component amplifier are electrically connectable to a ground.

3. An integrated circuit as claimed in claim 1, wherein the head amplifier further comprises a first component amplifier and a second component amplifier, wherein the first component amplifier and second component amplifier comprise at least one positive component input, at least one negative component input, and at least one component output, wherein the positive component input of the first component amplifier is the positive input of the head amplifier, wherein the negative component input of the second component amplifier is the negative input of the head amplifier, wherein the negative component input of the first component amplifier is electrically connectable to a first ground, wherein the positive component input of the second component amplifier is electrically connectable to a second ground, wherein the component outputs of both the first component amplifier and second component amplifier are jointly the output of the head amplifier.

4. An integrated circuit as claimed in claim 1, wherein the tail amplifier further comprises a first component amplifier and a second component amplifier, wherein the first component amplifier and second component amplifier comprise at least one positive component input, at least one negative component input, and at least one component output, wherein the positive component input of the first component amplifier is the positive input of the tail amplifier, wherein the negative component input of the second component amplifier is the negative input of the tail amplifier, wherein the negative component input of the first component amplifier is electrically connectable to a first ground, wherein the positive component input of the second component amplifier is electrically connectable to a second ground, wherein the component outputs of both the first component amplifier and second component amplifier are jointly the output of the tail amplifier.

5. An integrated circuit as claimed in claim 1, wherein each of the first amplifiers further comprises a first component amplifier and a second component amplifier, wherein the first component amplifier and second component amplifier comprise at least one positive component input, at least one negative component input, and at least one component output, wherein the positive component input of the first component amplifier is the positive input of the first amplifier, wherein the negative component input of the second component amplifier is the negative input of the first amplifier, wherein the negative component input of the first component amplifier is electrically connectable to a first ground, wherein the positive component input of the second component amplifier is electrically connectable to a second ground, wherein the component outputs of both the first component amplifier and second component amplifier are jointly the output of the first amplifier.

6. An integrated circuit, comprising at least a first component amplifier and a second component amplifier, wherein the first component amplifier and second component amplifier comprise at least one positive component input, at least one negative component input, and at least one component output, wherein the positive component input of the first component amplifier is a positive input, wherein the negative component input of the second component amplifier is a negative input, wherein the negative component input of the first component amplifier is electrically connected to the positive component input of the second component amplifier, wherein the negative component input of the first component amplifier and the positive component input of the second component amplifier are electrically connectable to a ground.

* * * * *